United States Patent
Jang et al.

(10) Patent No.: US 11,638,381 B2
(45) Date of Patent: Apr. 25, 2023

(54) THIN-FILM LIGHT-EMITTING DEVICE INCLUDING CHARGE GENERATING JUNCTION LAYER AND METHOD OF FABRICATING THIN-FILM LIGHT-EMITTING DEVICE

(71) Applicant: UNIVERSITY-INDUSTRY COOPERATION GROUP OF KYUNG HEE UNIVERSITY, Yongin-si (KR)

(72) Inventors: Jin Jang, Seoul (KR); Hyo Min Kim, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 17/836,673

(22) Filed: Jun. 9, 2022

(65) Prior Publication Data
US 2022/0310963 A1 Sep. 29, 2022

Related U.S. Application Data

(62) Division of application No. 16/759,556, filed as application No. PCT/KR2018/000782 on Jan. 17, 2018, now Pat. No. 11,430,966.

(30) Foreign Application Priority Data

Oct. 27, 2017 (KR) ........................ 10-2017-0141177

(51) Int. Cl.
*H01L 51/00* (2006.01)

(52) U.S. Cl.
CPC ......... *H10K 50/171* (2023.02); *H10K 50/115* (2023.02); *H10K 50/15* (2023.02);
(Continued)

(58) Field of Classification Search
CPC ....... H10K 50/171; H10K 71/00; H10K 71/40
See application file for complete search history.

(56) References Cited

U.S. PATENT DOCUMENTS

2016/0020429 A1   1/2016   Kuroki

FOREIGN PATENT DOCUMENTS

KR   10-0540548 B1   1/2006
KR   10-1397078 B1   5/2014
(Continued)

OTHER PUBLICATIONS

Teresa OH, "Analysis of Crystallinity and Electrical Characteristics of Oxide Semiconductor of ZnO in Accordance with Annealing Methods", Korean J. Mater. Res., 2017, pp. 242-247, vol. 27, No. 5.

(Continued)

*Primary Examiner* — Anthony Ho
(74) *Attorney, Agent, or Firm* — Sughrue Mion, PLLC

(57) ABSTRACT

The present invention discloses a thin-film light-emitting device including a charge generating junction layer and a method of fabricating the thin-film light-emitting device. The thin-film light-emitting device including a charge generating junction layer according to one embodiment of the present invention includes a negative electrode; at least one light-emitting unit formed on the negative electrode and including a charge generating junction layer, an electron injection/transport layer, a thin-film light-emitting layer, and a hole injection/transport layer in a sequential order; and a negative electrode formed on the light-emitting unit. In the thin-film light-emitting device of the present invention, the charge generating junction layer has a layer-by-layer structure in which a p-type semiconductor layer and an n-type semiconductor layer are formed, and the concentration of oxygen vacancies at the interface between the p-type and
(Continued)

n-type semiconductor layers is adjusted by annealing the n-type semiconductor layer.

2 Claims, 55 Drawing Sheets

(52) U.S. Cl.
CPC ............ *H10K 50/16* (2023.02); *H10K 71/00* (2023.02); *H10K 71/40* (2023.02); *H10K 2102/101* (2023.02)

(56) References Cited

FOREIGN PATENT DOCUMENTS

| KR | 10-2016-0066721 A | 6/2016 |
|---|---|---|
| KR | 10-2016-0071924 A | 6/2016 |
| KR | 10-0642431 B1 | 11/2016 |
| WO | 2014/129536 A1 | 8/2014 |

OTHER PUBLICATIONS

Notice of Allowance for corresponding KR 10-2017-0141177 dated May 23, 2019.

International Search Report for PCT/KR2018/000782, dated Jul. 24, 2018.

Hyo-Min Kim et al., "Solution Processed Metal-Oxide P—N Charge Generation Junction for High Performance Inverted Quantum-dot Light Emitting Diodes", ACS Applied Materials & Interface, Oct. 18, 2017, 24 pages.

THIN-FILM LIGHT-EMITTING DEVICE INCLUDING CHARGE GENERATING JUNCTION LAYER AND METHOD OF FABRICATING THIN-FILM LIGHT-EMITTING DEVICE

CROSS-REFERENCE TO RELATED APPLICATION

This application is a Divisional Application of U.S. application Ser. No. 16/759,556, filed on Apr. 27, 2020, which is a National Stage Entry of PCT International Application No. PCT/KR2018/000782, which was filed on Jan. 17, 2018, and which claims priority to Korean Patent Application No. 10-2017-0141177, filed on Oct. 27, 2017 in the Korean Intellectual Property Office, the disclosure of which is incorporated herein by reference.

BACKGROUND OF THE DISCLOSURE

Field of the Disclosure

The present invention relates to a thin-film light-emitting device including a charge generating junction layer and a method of fabricating the thin-film light-emitting device, and more particularly, to a thin-film (e.g., quantum dot or organic) light-emitting device including a charge generating junction layer with improved power efficiency and current efficiency and a method of fabricating the thin-film light-emitting device.

Description of the Related Art

A light-emitting device (LED) is a device using a phenomenon in which light is emitted while electrons and holes combine when current flows through a diode formed of a gallium nitride (GaN)-based compound semiconductor, and has attracted great attention in various fields such as optical devices and high power electronic devices.

In recent years, studies have been conducted to fabricate high-performance and long-lifespan thin-film (e.g., quantum dot or organic) light-emitting devices. To realize this performance, injection of charge, transport of injected charge, and generation of additional charge in a light-emitting device are very important considerations.

Accordingly, a charge generating junction layer serving to lower an energy barrier was additionally formed inside a light-emitting device to facilitate transfer of charge to the next transport layer.

However, a low-molecular-weight P-N junction layer used as the charge generating junction layer was formed only through a vacuum deposition process because the P-N junction layer was very difficult to form in the form of liquid.

However, when a large area display is manufactured using a vacuum deposition process, a substrate or a mask may be warped, and a long tack time (about 1 hour) is required to vaporize small molecules. Accordingly, there is a need for an easy method of fabricating a low-cost charge generating junction layer applicable to a large area process.

In addition, among light-emitting devices, in the case of a tandem light-emitting device fabricated by laminating two or more light-emitting units, since the number of layers of each light-emitting unit is different, a process may be complicated. In addition, since materials used to form each light-emitting unit are different, material costs may be increased. In addition, since the number of layers increases, a driving voltage may be increased, thereby reducing efficiency.

SUMMARY OF THE DISCLOSURE

Therefore, the present invention has been made in view of the above problems, and it is one object of the present invention to provide a thin-film light-emitting device including a charge generating junction layer consisting of an p-type semiconductor layer and an annealed n-type semiconductor layer. According to the present invention, the concentration of oxygen vacancies at the interface between the p-type and n-type semiconductor layers may be adjusted, thereby improving power efficiency and current efficiency.

It is another object of the present invention to provide a thin-film light-emitting device including a charge generating junction layer consisting of p-type and n-type semiconductor layers formed using oxide semiconductors. With this configuration, resistance to oxygen and moisture may be increased, thereby increasing the lifespan of the device.

It is still another object of the present invention to provide a thin-film light-emitting device including a charge generating junction layer consisting of p-type and n-type semiconductor layers. According to the present invention, charge is generated at the interface between the p-type and n-type semiconductor layers, thereby stabilizing generation and injection of charge.

It is still another object of the present invention to provide a thin-film light-emitting device including a charge generating junction layer. According to the present invention, the charge generating junction layer consisting of p-type and n-type semiconductor layers is formed using a solution process. Accordingly, process time may be shortened, and problems related to the work function of the upper or lower electrode of the thin-film light-emitting device may be solved.

It is yet another object of the present invention to provide a thin-film light-emitting device having a tandem structure. According to the present invention, a high-performance thin-film light-emitting device may be fabricated at low cost.

In accordance with one aspect of the present invention, provided is a thin-film light-emitting device including a negative electrode; at least one light-emitting unit formed on the negative electrode and including a charge generating junction layer, an electron injection/transport layer, a thin-film light-emitting layer, and a hole injection/transport layer in a sequential order; and a positive electrode formed on the light-emitting unit, wherein the charge generating junction layer has a layer-by-layer structure in which a p-type semiconductor layer and an n-type semiconductor layer are formed, and a concentration of oxygen vacancies at an interface between the p-type and n-type semiconductor layers is adjusted by annealing the n-type semiconductor layer.

The annealing treatment may increase a proportion of the p-type semiconductor layer at the interface between the p-type and n-type semiconductor layers.

The charge generating junction layer may be formed using a solution process.

The thin-film light-emitting device may further include an auxiliary charge generating junction layer on the light-emitting unit.

The annealing treatment may be performed at a temperature of 160° C. to 250° C.

A thickness ratio of the p-type semiconductor layer to the n-type semiconductor layer may be 1:1 to 1:5.

The p-type semiconductor layer may have a thickness of 1 nm to 50 nm.

The n-type semiconductor layer may have a thickness of 1 nm to 50 nm.

The p-type and n-type semiconductor layers may be formed using oxide semiconductors.

The p-type semiconductor layer may include one or more of copper oxide (CuO) and copper oxide (CuO) doped with a first dopant.

The first dopant may include one or more of nickel (Ni), copper (Cu), lithium (Li), and zinc (Zn).

The first dopant may be included in an amount of 1 atomic % to 50 atomic % in the copper oxide (CuO).

The p-type semiconductor layer may include one or more of nickel oxide (NiO) and nickel oxide (NiO) doped with a second dopant.

The second dopant may include one or more of tin (Sn), copper (Cu), lithium (Li), and zinc (Zn).

The second dopant may be included in an amount of 0.1 atomic % to 50 atomic % in the nickel oxide (NiO).

The n-type semiconductor layer may include one or more of zinc oxide (ZnO) and zinc oxide (ZnO) doped with a third dopant.

The third dopant may include one or more of cesium (Cs), lithium (Li), aluminum (Al), magnesium (Mg), indium (In), calcium (Ca), and gallium (Ga).

The third dopant may be included in an amount of 0.1 atomic % to 20 atomic % in the zinc oxide (ZnO).

The light-emitting unit may be repeatedly laminated 1 to 5 times.

The thin-film light-emitting device may further include a reflective layer formed on the negative electrode.

The thin-film light-emitting device may further include a refractive index compensation layer formed on the positive electrode.

The thin-film light-emitting layer may be a quantum dot light-emitting layer or an organic light-emitting layer.

In accordance with another aspect of the present invention, provided is a method of fabricating a thin-film light-emitting device, the method including a step of forming a negative electrode on a substrate; a step of forming at least one light-emitting unit on the negative electrode; and a step of forming a positive electrode on the light-emitting unit, wherein the step of forming the light-emitting unit includes a step of forming a charge generating junction layer on the negative electrode; a step of forming an electron injection/transport layer on the charge generating junction layer; a step of forming a thin-film light-emitting layer on the electron injection/transport layer; and a step of forming a hole injection/transport layer on the thin-film light-emitting layer, wherein the charge generating junction layer has a layer-by-layer structure in which a p-type semiconductor layer and an n-type semiconductor layer are formed, and a concentration of oxygen vacancies at an interface between the p-type and n-type semiconductor layers is adjusted by annealing the n-type semiconductor layer.

The charge generating junction layer may be formed using a solution process.

The annealing treatment may be performed at a temperature of 160° C. to 250° C.

The method may further include, after the step of forming the light-emitting unit, a step of forming an auxiliary charge generating junction layer on the light-emitting unit.

A thin-film light-emitting device according to embodiments of the present invention includes a charge generating junction layer consisting of an p-type semiconductor layer and an annealed n-type semiconductor layer. With this configuration, the concentration of oxygen vacancies at the interface between the p-type and n-type semiconductor layers can be adjusted, thereby improving power efficiency and current efficiency.

The thin-film light-emitting device according to embodiments of the present invention includes a charge generating junction layer consisting of p-type and n-type semiconductor layers formed using oxide semiconductors. With this configuration, resistance to oxygen and moisture can be improved, thereby increasing the lifespan of the device.

The thin-film light-emitting device according to embodiments of the present invention includes a charge generating junction layer consisting of p-type and n-type semiconductor layers. With this configuration, charge is generated at the interface between the p-type and n-type semiconductor layers, thereby stabilizing generation and injection of charge.

In the thin-film light-emitting device according to embodiments of the present invention, a charge generating junction layer consisting of p-type and n-type semiconductor layers is formed using a solution process. Accordingly, process time can be shortened, and problems related to the work function of the upper or lower electrode of thin-film light-emitting device can be solved.

According to the thin-film light-emitting device according to one embodiment of the present invention, by forming a thin-film light-emitting device having a tandem structure, a high-performance thin-film light-emitting device can be fabricated at low cost.

DETAILED DESCRIPTION OF THE DISCLOSURE

Figure 1A:
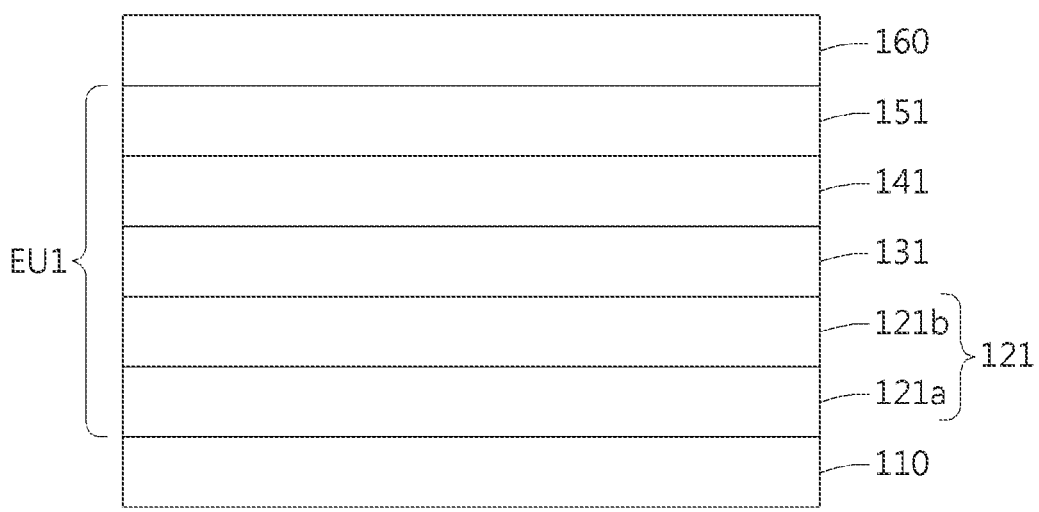
FIG. 1A is a cross-sectional view of a thin-film light-emitting device including a charge generating junction layer according to one embodiment of the present invention.

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a thin-film light-emitting device including a charge generating junction layer according to embodiments of the present invention will be described with reference to FIGS. 1A to 2.

Figure 1B:
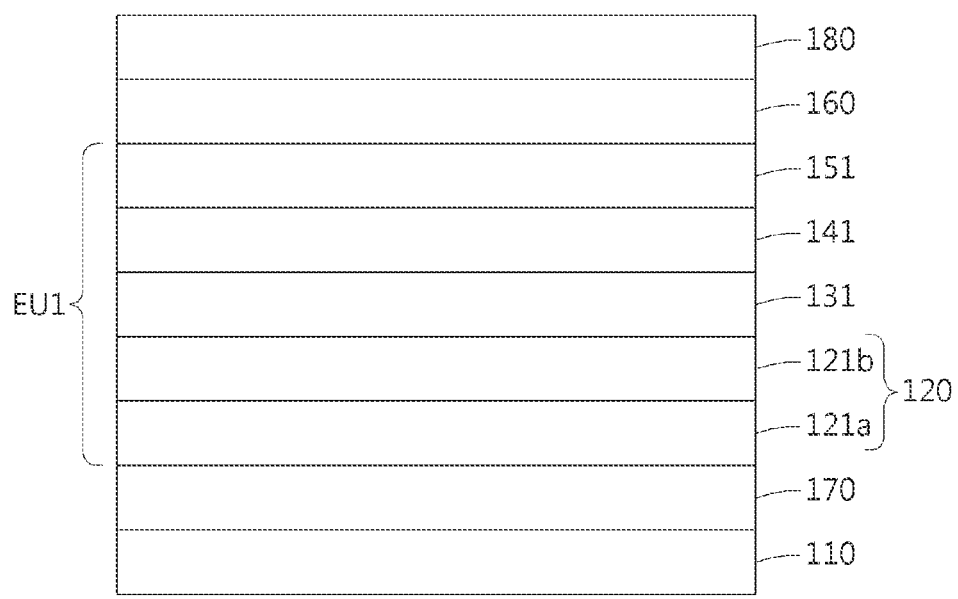
FIG. 1B is a cross-sectional view of a thin-film light-emitting device including a charge generating junction layer according to another embodiment of the present invention.

FIG. 1A is the back-emitting structure of a thin-film light-emitting device including a charge generating junction layer according to one embodiment of the present invention, and FIG. 1B is the top-emitting structure of the thin-film light-emitting device including a charge generating junction layer according to one embodiment of the present invention. FIGS. 1A and 1B include the same configuration, and thus the configuration of the thin-film light-emitting device will be described with reference to FIG. 1A.

FIG. 1A is a cross-sectional view of a thin-film light-emitting device including a charge generating junction layer according to one embodiment of the present invention.

The thin-film light-emitting device including a charge generating junction layer according to one embodiment of the present invention includes a negative electrode 110, at least one light-emitting unit EU1 formed on the negative electrode 110 and including a charge generating junction layer 121, an electron injection/transport layer 131, a thin-film light-emitting layer 141, and a hole injection/transport layer 151 in a sequential order, and a positive electrode 160 formed on the light-emitting unit EU1.

The thin-film light-emitting device including a charge generating junction layer according to one embodiment of the present invention includes the negative electrode 110.

The negative electrode 110 itself may be used as a substrate and an electrode, and may be formed using a material for forming the negative electrode 110 on a substrate.

The substrate is a base substrate for forming a light-emitting device. Substrates generally used in the art to which the present invention pertains may be used as the substrate of the present invention. In addition, the material of the substrate is not particularly limited, and may include silicon, glass, quartz, plastic, metal foil, and the like.

For example, the plastic substrate may include at least one of polyethylene terephthalate (PET), polyethylenenaphthelate (PEN), polypropylene (PP), polycarbonate (PC), polyimide (PI), tri acetyl cellulose (TAC), and polyethersulfone (PES), and a flexible substrate such as an aluminum foil or a stainless steel foil may be used as the plastic substrate.

The negative electrode 110 is an electrode for providing electrons to a device, and a metal material, an ionized metal material, an alloy material, a metal ink material in a colloid state in a predetermined liquid, and a transparent metal oxide may be used as the negative electrode 110.

As a specific example, the metal material may include at least one of lithium (Li), magnesium (Mg), aluminum (Al), aluminum-lithium (Al—Li), calcium (Ca), magnesium-indium (Mg—In), magnesium-silver (Mg—Ag), platinum (Pt), gold (Au), nickel (Ni), copper (Cu), barium (Ba), silver (Ag), indium (In), ruthenium (Ru), lead (Pd), rhodium (Rh), iridium (Ir), osmium (Os), and cesium (Cs). In addition, carbon (C), a conductive polymer, or a combination thereof may be used as the metal material.

In addition, the transparent metal oxide may include at least one of indium tin oxide (ITO), fluorine-doped tin oxide (FTO), antimony tin oxide (ATO), and aluminum-doped zinc oxide (AZO). In general, ITO is used as a material for forming a positive electrode, but in an inverted solar cell structure, ITO may be used as a material for forming a negative electrode to form a transparent negative electrode. The transparent metal oxide electrode may be formed using a sol-gel, spray pyrolysis, sputtering, atomic layer deposition (ALD), or electron beam evaporation process.

The negative electrode 110 may be formed on the substrate by a conventional vacuum deposition process (e.g., chemical vapor deposition, CVD) or an application method in which printing is performed using paste metal ink prepared by mixing metal flakes or metal particles and a binder, and any method capable of forming an electrode may be used without being limited to the above methods.

At least one light-emitting unit EU1 including the charge generating junction layer 121, the thin-film light-emitting layer 141, and the hole injection/transport layer 151 in a sequential order is formed on the negative electrode 110.

The charge generating junction layer 121 has a pn junction structure in which a p-type semiconductor layer 121a and an n-type semiconductor layer 121b are sequentially formed in a layer-by-layer structure.

Accordingly, tunneling of electrons from the highest occupied molecular orbital (HOMO) to the lowest unoccupied molecular orbital (LUMO) may occur due to band bending. In the tunneling process, charge carriers (electrons or holes) are supplied to a thin-film light-emitting device. In the case of the first electron generating junction layer 121 on the side of the negative electrode 110, charge carriers supplied are electrons.

In addition, formation of the charge generating junction layer 121 may have an effect similar to a case of containing a metal between electrodes (negative and positive electrodes) in that the charge generating junction layer 121 supplies charge carriers.

Injection of electrons from the negative electrode 110 is critically dependent on the work function of a material forming the negative electrode 110. Cleaning the negative electrode 110 or preparing the surface of the negative electrode 110 before forming the negative electrode 110 may have a strong influence on the work function of the negative electrode 110, and thus may have a strong influence on an injection barrier.

The charge generating junction layer 121 separates the charge injection characteristics of the thin-film light-emitting device from the work function of the negative electrode 110 to improve the charge injection characteristics of the thin-film light-emitting device.

The charge generating junction layer 121 may be formed using a solution process. Specifically, the charge generating junction layer 121 may be formed using any one solution process selected from spin coating, slit dye coating, ink-jet printing, spray coating, and dip coating.

Preferably, the charge generating junction layer 121 may be formed using spin coating. In spin coating, a certain amount of a solution is dropped onto a substrate while rotating the substrate at high speed. At this time, coating is performed by centrifugal force applied to the solution.

Since the charge generating junction layer 121 is formed using a solution process, a large area process may be performed, process time may be shortened, and limitations on the semiconductor characteristics of the upper and lower electrodes (positive and negative electrodes) may be reduced.

The p-type and n-type semiconductor layers 121a and 121b constituting the charge generating junction layer 121 may be formed using oxide semiconductors.

Accordingly, in the thin-film light-emitting device including a charge generating junction layer according to one embodiment of the present invention, the p-type and n-type semiconductor layers 121a and 121b are formed using oxide semiconductors, thereby increasing resistance to oxygen and moisture, and thus increasing the lifespan of the device.

The p-type semiconductor layer 121a constituting the charge generating junction layer 121 may include one or more of copper oxide (CuO) and copper oxide (CuO) doped with a first dopant, and the first dopant may include one or more of nickel (Ni), copper (Cu), lithium (Li), and zinc (Zn).

A first dopant may be included in an amount of 0.1 atomic % to 50 atomic % in the copper oxide (CuO).

When the content of the first dopant is 0.1 atomic % or less, the effect of the dopant may be negligible due to too little content. When the content of the first dopant exceeds 50 atomic %, the characteristics of the p-type semiconductor layer may be degraded, thereby reducing generation of charge.

In addition, the p-type semiconductor layer 121a may include one or more of nickel oxide (NiO) and nickel oxide (NiO) doped with a second dopant, and the second dopant may include one or more of tin (Sn), copper (Cu), lithium (Li), and zinc (Zn).

The second dopant may be included in an amount of 0.1 atomic % to 50 atomic % in the nickel oxide (NiO).

When the content of the second dopant is 0.1 atomic % or less, the effect of the dopant may be negligible due to too little content. When the content of the second dopant exceeds 50 atomic %, the characteristics of the p-type semiconductor layer may be degraded, thereby reducing generation of charge.

The n-type semiconductor layer constituting the charge generating junction layer 121 may include one or more of zinc oxide (ZnO) and zinc oxide (ZnO) doped with a third dopant. The third dopant may include one or more of cesium (Cs), lithium (Li), aluminum (Al), magnesium (Mg), indium (In), calcium (Ca), and gallium (Ga).

The third dopant may be included in an amount of 0.1 atomic % to 20 atomic % in the zinc oxide (ZnO).

When the content of the third dopant is 0.1 atomic % or less, the effect of the dopant may be negligible due to too little content. When the content of the third dopant exceeds 20 atomic %, the characteristics of the p-type semiconductor layer may be degraded, thereby reducing generation of charge.

The nickel oxide (NiO), copper oxide (CuO), and zinc oxide (ZnO) included in the charge generating junction layer 121 may be generated in the form of at least one of sol-gel or nanoparticles.

In addition, in the thin-film light-emitting device including a charge generating junction layer according to one embodiment of the present invention, the n-type semiconductor layer 121b is annealed.

The annealing treatment may be performed under an air or nitrogen ($N_2$) atmosphere. However, the present invention is not limited thereto, and the annealing treatment may be performed under an inert gas atmosphere or under reduced pressure. In this case, the inert gas may include air, nitrogen ($N_2$), argon, neon, and helium.

The n-type semiconductor layer 121b may serve as an electron generating layer or an electron transport layer depending on annealing treatment environment. When annealing is performed under an air atmosphere, the n-type semiconductor layer 121b may serve as an electron generating layer. When heat treatment is performed under a nitrogen ($N_2$) atmosphere, the n-type semiconductor layer 121b may serve as an electron transport layer.

In the thin-film light-emitting device including a charge generating junction layer according to one embodiment of the present invention, by annealing the n-type semiconductor layer 121b, the concentration of oxygen vacancies at the interface between the p-type and n-type semiconductor layers 121a and 121b may be adjusted.

Oxygen vacancies in a thin film may act as defects to trap holes or electrons. Thus, charge generated at the junction of the p-type and n-type semiconductor layers 121a and 121b may also trapped in oxygen vacancies.

However, in the thin-film light-emitting device including a charge generating junction layer according to one embodiment of the present invention, when the n-type semiconductor layer 121b is annealed, due to heat treatment in the air, oxygen penetrates into the interface between the p-type and n-type semiconductor layers 121a and 121b, and oxygen vacancies at the interface are occupied with oxygen. As a result, the concentration of the oxygen vacancies may be reduced, which affects conductivity.

In addition, when the n-type semiconductor layer 121b is heat-treated in the air, oxygen penetrates, and oxygen vacancies are occupied with oxygen. Thus, as oxygen-hydrogen (O—H) bonds having a relatively low bonding energy separate, the concentration of oxygen-hydrogen (O—H) decrease. Reduction in the concentration of oxygen-hydrogen (O—H) prevents trapping when electrons and holes recombine.

More specifically, in the thin-film light-emitting device including a charge generating junction layer according to one embodiment of the present invention, when the n-type semiconductor layer 121b is annealed, oxygen vacancies induce charge trapping, and the concentration of oxygen-hydrogen (O—H) at the interface between the p-type and n-type semiconductor layers 121a and 121b is decreased, which inhibits trapping of charge generated in the charge generating junction layer.

In addition, in the thin-film light-emitting device including a charge generating junction layer according to one embodiment of the present invention, when the n-type semiconductor layer 121b is annealed, due to heat treatment in the air, the concentration ratio of a specific semiconductor of the p-type semiconductor layer 121a at the interface between the p-type and n-type semiconductor layers 121a and 121b may be selectively increased.

In the charge generating junction layer 121, the concentration of metal-oxygen (M-O) formed therein increases to contribute to charge generation. In the thin-film light-emitting device including a charge generating junction layer according to one embodiment of the present invention, the n-type semiconductor layer 121b is annealed, which increases the proportion of the p-type semiconductor layer 121a at the interface between the p-type and n-type semiconductor layers 121a and 121b. As a result, the concentration of metal-oxygen (M-O), e.g., Cu—O, at the interface between the p-type and n-type semiconductor layers 121a and 121b increases, thereby further improving the charge generation efficiency of the charge generating junction layer 121.

The annealing treatment may be performed at a temperature of 160° C. to 250° C. When the annealing temperature is less than 160° C., electrical properties may deteriorate. When the annealing temperature exceeds 250° C., a lower thin film may deteriorate.

The annealing treatment may be performed under an air or nitrogen ($N_2$) atmosphere, and may be hot plate annealing, furnace annealing, or rapid thermal annealing (RTA). The rapid thermal annealing may include a gas rapid thermal annealing (GRTA) method using heated gas and a lamp rapid thermal annealing (LRTA) method using lamp light.

Preferably, in the thin-film light-emitting device including a charge generating junction layer according to one embodiment of the present invention, the temperature of a hot plate may be set to a desired temperature, the hot plate may be preheated for about 20 minutes, and heat treatment may be performed.

A light-emitting device has charge injection characteristics depending on the work function of a metal. In the case of a light-emitting device including the charge generating junction layer 121 including only one of the p-type and n-type semiconductor layers 121a and 121b, due to an energy bather by the work functions of upper and lower electrodes, a problem rises in that injection of charge is not smooth.

However, in the case of the thin-film light-emitting device including a charge generating junction layer according to one embodiment of the present invention, by including the charge generating junction layer 121, charge is generated at the interface between the p-type and n-type semiconductor layers 121a and 121b. Thus, even when metals having different work functions are used as electrodes, the thin-film light-emitting device is not affected by the different work functions. Accordingly, in the case of the thin-film light-emitting device including a charge generating junction layer according to one embodiment of the present invention, since charge is generated at the interface between the p-type and n-type semiconductor layers 121a and 121b by the charge generating junction layer 121, generation and injection of charge may be stabilized.

The thickness of the p-type semiconductor layer 121a may be 1 nm to 50 nm. When the thickness of the p-type semiconductor layer 121a is less than 1 nm, charge may not be generated, and charge tunneling may occur. When the thickness of the p-type semiconductor layer 121a exceeds 50 nm, the thickness of the device may increase, and thus the number of pathways may increase, thereby degrading the characteristics of the device and increasing resistance.

The thickness of the n-type semiconductor layer 121b may be 1 nm to 50 nm. When the thickness of the n-type semiconductor layer 121b is less than 1 nm, charge may not be generated. When the thickness of the n-type semiconductor layer 121b exceeds 50 nm, the thickness of a device may increase, and thus the number of pathways may increase, thereby degrading the characteristics of the device and increasing resistance.

Preferably, the thickness of the n-type semiconductor layer 121b is 15 nm. When the thickness of the n-type semiconductor layer 121b is 15 nm, the charge generation rate may be increased, and the characteristics of a thin-film light-emitting diode may be excellent.

More specifically, although the number of holes provided from the positive electrode 160 is fixed, when the thickness of the n-type semiconductor layer 121b is minimized (i.e., 15 nm), generated electrons may have a short moving distance, trapping may be minimized, and thus efficient excitons may be generated. Accordingly, the characteristics of the thin-film light-emitting diode may be excellent.

The thickness ratio of the p-type semiconductor layer 121a to the n-type semiconductor layer 121b may be 1:1 to 1:5.

When the thickness ratio of the p-type semiconductor layer 121a to the n-type semiconductor layer 121b is within this range, holes and electrons may be balanced, thereby improving the characteristics of the thin-film light-emitting diode.

The electron injection/transport layer 131 formed on the charge generating junction layer 121 serves to increase the efficiency of a device by transporting electrons generated in the negative electrode 110 to the thin-film light-emitting layer 141, and may be formed between the negative electrode 110 and the thin-film light-emitting layer 141.

The electron injection/transport layer 131 may include at least one of $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $SnO_2$, TPBI, and TAZ.

The electron injection/transport layer 131 may be formed in the form of a single layer, an electron injection layer and an electron transport layer may be provided as separated layers, or only one of the electron injection layer and the electron transport layer may be provided.

In the thin-film light-emitting layer 141, holes injected from the positive electrode 160 and electrons injected from the negative electrode 110 meet to form excitons, and the formed excitons may be used as a light-emitting layer that emits light having a specific wavelength.

The thin-film light-emitting layer 141 may include any one of quantum dots, an organic compound layer, an oxide layer, a nitride layer, a semiconductor layer, an inorganic compound layer, a phosphor layer, and a dye layer.

Preferably, the thin-film light-emitting layer 141 is a quantum dot light-emitting layer including quantum dots or an organic light-emitting layer including an organic compound. More preferably, the thin-film light-emitting layer 141 is a quantum dot light-emitting layer including quantum dots.

As the quantum dot light-emitting layer, at least one selected from the group consisting of group II-VI semiconductor compounds, group III-V semiconductor compounds, group IV-VI semiconductor compounds, group IV elements or compounds, and combinations thereof may be used.

The group II-VI semiconductor compounds may include at least one selected from the group consisting of binary compounds selected from the group consisting of CdSe, CdS, ZnS, CdTe, ZnSe, ZnTe, ZnO, HgS, HgSe, HgTe, and mixtures thereof; ternary compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and mixtures thereof; and quaternary compounds selected from the group consisting of CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V semiconductor compounds may include at least one selected from the group consisting of binary compounds selected from the group consisting of GaN, GaP, GaAs, GaSb, AlN, AlP, AlAs, AlSb, InN, InP, InAs, InSb, and mixtures thereof; ternary compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI semiconductor compounds may include at least one selected from the group consisting of binary compounds selected from the group consisting of SnS, SnSe, SnTe, PbS, PbSe, PbTe, and mixtures thereof; ternary compounds selected from the group consisting of SnSeS, SnSeTe, SnSTe, PbSeS, PbSeTe, PbSTe, SnPbS, SnPbSe, SnPbTe, and mixtures thereof; and quaternary compounds selected from the group consisting of SnPbSSe, SnPbSeTe, SnPbSTe, and mixtures thereof.

The group IV elements or compounds may include at least one selected from the group consisting of elemental compounds selected from the group consisting of Si, Ge, and mixtures thereof; and binary compounds selected from the group consisting of SiC, SiGe, and mixtures thereof.

Preferably, CdSe/CdS/ZnS is used as the quantum dot light-emitting layer.

The thin-film light-emitting layer 141 may be formed by vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

The hole injection/transport layer 151 is a layer for transporting and injecting holes to the thin-film light-emitting layer 141, and may be formed by a vacuum deposition process or a solution process using an organic material or an inorganic material.

The hole injection/transport layer 151 may be formed in the form of a single layer, a hole injection layer and a hole transport layer may be provided as separated layers, or only one of the hole injection layer and the hole transport layer may be provided.

The hole injection/transport layer 151 allows holes to be effectively transferred to the thin-film light-emitting layer 141, and may increase luminous efficacy by balancing the densities of holes and electrons in the thin-film light-emitting layer 141.

In addition, electrons injected from the negative electrode 110 to the thin-film light-emitting layer 141 are trapped in the thin-film light-emitting layer 141 by an energy barrier present at the interface between the hole injection/transport layer 151 and the thin-film light-emitting layer 141. As a result, the probability of recombination of electrons and holes increases, thereby improving luminous efficacy.

According to an embodiment, the hole injection/transport layer 151 may be formed between the thin-film light-emitting layer 141 and the charge generating junction layer 121 or the auxiliary charge generating junction layer to further improve the effect of the charge generating junction layer 121 or the auxiliary charge generating junction layer.

The hole injection/transport layer 151 as a layer for transporting and injecting holes may be formed using PEDOT:PSS. When the hole injection/transport layer 151 is formed using PEDOT:PSS, additives such as tungsten oxide, graphene oxide (GO), CNT, molybdenum oxide (MoOx), vanadium oxide ($V_2O_5$), and nickel oxide (NiOx) may be added. However, the present invention is not limited thereto, and various organic or inorganic materials may be used.

The thin-film light-emitting device may further include an auxiliary charge generating junction layer on the light-emitting unit EU1. Accordingly, the auxiliary charge generating junction layer may be formed on the lower portion of the positive electrode 160, and the auxiliary charge generating junction layer may have a pn junction structure in which the p-type and n-type semiconductor layers are sequentially formed in a layer-by-layer structure.

According to an embodiment, the auxiliary charge generating junction layer may be formed using the same material and the same process as the charge generating junction layer 121.

Accordingly, tunneling of electrons from the highest occupied molecular orbital (HOMO) to the lowest unoccupied molecular orbital (LUMO) may occur due to band bending. In the tunneling process, charge carriers (electrons or holes) are supplied to a thin-film light-emitting device. In the case of a second charge generating layer on the side of the positive electrode 160, charge carriers supplied are holes.

In addition, formation of the auxiliary charge generating junction layer may have an effect similar to a case of containing a metal between electrodes (negative and positive electrodes) in that the auxiliary charge generating junction layer supplies charge carriers.

Injection of holes from the positive electrode 160 is critically dependent on the work function of a positive electrode material. Cleaning the positive electrode 160 or preparing the surface of the positive electrode 160 before forming the positive electrode 160 may have a strong influence on the work function of the positive electrode 160, and thus may have a strong influence on an injection barrier.

However, the auxiliary charge generating junction layer of the thin-film light-emitting device including a charge generating junction layer according to one embodiment of the present invention may separate the charge injection characteristics of the thin-film light-emitting device from the work function of the positive electrode 160 to improve the charge injection characteristics of the thin-film light-emitting device.

In addition, the auxiliary charge generating junction layer 180 includes the n-type semiconductor layer formed on the side of the positive electrode and the p-type semiconductor layer formed on the side of the thin-film light-emitting layer 141 to enable switching between holes for transporting charge and electron transport.

The auxiliary charge generating junction layer may be formed using a solution process. Specifically, the auxiliary charge generating junction layer may be formed using any one solution process selected from spin coating, slit dye coating, ink-jet printing, spray coating, and dip coating.

A light-emitting device has charge injection characteristics depending on the work function of a metal. In the case of a light-emitting device including a charge injection layer including only one of p-type and n-type semiconductor layers, due to an energy bather by the work functions of upper and lower electrodes, a problem rises in that injection of charge is not smooth.

However, in the case of the thin-film light-emitting device including a charge generating junction layer according to one embodiment of the present invention, when the auxiliary charge generating junction layer is formed, charge is generated at the interface between the p-type and n-type semiconductor layers. Thus, even when metals having different work functions are used as electrodes, the thin-film light-emitting device is not affected by the different work functions. That is, since charge is generated at the interface between the p-type and n-type semiconductor layers by a second charge generating junction layer according to one embodiment of the present invention, generation and injection of charge may be stabilized.

In the thin-film light-emitting device including a charge generating junction layer according to one embodiment of the present invention, the light-emitting unit may be repeatedly laminated 1 to 5 times. Accordingly, the thin-film light-emitting device including a charge generating junction layer according to one embodiment of the present invention may be formed in a tandem structure. The tandem structure of the thin-film light-emitting device including a charge generating junction layer according to one embodiment of the present invention will be described in detail with reference to FIG. 2.

On the light-emitting unit EU1, the positive electrode 160 is formed.

The positive electrode 160 is an electrode for providing holes to a device, and may be formed by performing a solution process, such as screen printing, on a transmissive electrode, a reflective electrode, a metal paste, or a metal ink material in a colloid state in a predetermined liquid.

The transmissive electrode material may include at least one of indium tin oxide (ITO), indium zinc oxide (IZO), tin oxide ($SnO_2$), zinc oxide (ZnO), multilayer metal oxide/metal/metal oxide, graphene, and carbon nanotube, which are transparent and have excellent conductivity.

The reflective electrode material may include at least one of magnesium (Mg), aluminum (Al), silver (Ag), Ag/ITO, Ag/IZO, aluminum-lithium (Al—Li), calcium (Ca), magnesium-indium (Mg—In), and magnesium-silver (Mg—Ag).

The metal paste may include any one of silver paste (Ag paste), aluminum paste (Al paste), gold paste (Au paste), and copper paste (Cu paste), or may be an alloy thereof.

The metal ink material may include at least one of silver (Ag) ink, aluminum (Al) ink, gold (Au) ink, calcium (Ca) ink, magnesium (Mg) ink, lithium (Li) ink, and cesium (Cs) ink, and the metal material contained in the metal ink material may be ionized in the solution.

The positive electrode 160 may be formed on the substrate by a conventional vacuum deposition process (e.g., chemical vapor deposition, CVD) or an application method in which printing is performed using paste metal ink prepared by mixing metal flakes or metal particles and a binder, and any method capable of forming an electrode may be used without being limited to the above methods.

FIG. 1B is a cross-sectional view of a thin-film light-emitting device including a charge generating junction layer according to another embodiment of the present invention.

The thin-film light-emitting device according to another embodiment of the present invention includes the negative electrode 110, a reflective layer 170 formed on the negative electrode 110, at least one light-emitting unit EU1 formed on the reflective layer and including the charge generating junction layer 121, the electron injection/transport layer 131, the thin-film light-emitting layer 141, and the hole injection/transport layer 151 in a sequential order, the positive electrode 160 formed on the light-emitting unit EU1, and a refractive index compensation layer 180 formed on the positive electrode 160.

The negative electrode 110 is an electrode for providing electrons to a device, and a metal material, an ionized metal material, an alloy material, a metal ink material in a colloid state in a predetermined liquid, and a transparent metal oxide may be used as the negative electrode 110.

The thin-film light-emitting device includes the reflective layer 170 formed on the negative electrode 110, and the reflective layer 170 allows reflection from the negative electrode 110 to be easily performed. The reflective layer 170 may include at least one of silver (Ag), aluminum (Al), gold (Au), calcium (Ca), magnesium (Mg), lithium (Li), nickel (Ni), platinum (Pt), copper (Cu), and cesium (Cs).

At least one light-emitting unit EU1 including the charge generating junction layer 121, the thin-film light-emitting layer 141, and the hole injection/transport layer 151 in a sequential order is formed on the reflective layer 170.

The charge generating junction layer 121 may have a pn junction structure in which the p-type and n-type semiconductor layers 121*a* and 121*b* are sequentially formed in a layer-by-layer structure.

Accordingly, tunneling of electrons from the highest occupied molecular orbital (HOMO) to the lowest unoccupied molecular orbital (LUMO) may occur due to band bending. In the tunneling process, charge carriers (electrons or holes) are supplied to a thin-film light-emitting device. In the case of the first electron generating junction layer 121 on the side of the negative electrode, charge carriers supplied are electrons.

In addition, by annealing the n-type semiconductor layer 121*b*, the concentration of oxygen vacancies at the interface between the p-type and n-type semiconductor layers 121*a* and 121*b* may be adjusted.

The annealing treatment may be performed under an air or nitrogen (N$_2$) atmosphere.

When the n-type semiconductor layer 121*b* is annealed, due to heat treatment in the air, the concentration of oxygen vacancies at the interface between the p-type and n-type semiconductor layers 121*a* and 121*b* may be reduced.

In addition, when the n-type semiconductor layer 121*b* is annealed, oxygen vacancies that induce charge trapping decrease. As a result, the concentration of oxygen-hydrogen (O—H) at the interface of the p-type and n-type semiconductor layers 121*a* and 121*b* is reduced, thereby preventing generated charge from being re-trapped.

By increasing the concentration of metal-oxygen (M-O), charge generation efficiency may be improved. In addition, metal-oxygen (M-O) contributes to charge generation by improving semiconductor characteristics.

In addition, the annealing treatment may increase the proportion of the p-type semiconductor layer 121*a* at the interface between the p-type and n-type semiconductor layers 121*a* and 121*b*.

When the n-type semiconductor layer 121*b* is annealed, oxygen penetrates, and the proportion of the p-type semiconductor layer 121*a* at the interface between the p-type and n-type semiconductor layers 121*a* and 121*b* may be increased.

For example, when copper oxide (CuO) is used as the p-type semiconductor layer 121*a*, when the n-type semiconductor layer 121*b* is annealed, oxygen penetrates, and the number of Cu—O bonds at the interface between the p-type and n-type semiconductor layers 121*a* and 121*b* may increase.

In addition, in the thin-film light-emitting device according to one embodiment of the present invention, the surface roughness of the p-type semiconductor layer 121*a* may be decreased.

As a thin film is formed on the p-type semiconductor layer 121*a*, roughness is generated on the surface of the p-type semiconductor layer 121*a*. When the surface roughness of the p-type semiconductor layer 121*a* increases, an electric field is not uniformly applied. As a result, the driving stability or lifespan of a device may reduce.

However, in the case of the thin-film light-emitting device according to one embodiment of the present invention, two layers, i.e., the p-type semiconductor layer 121*a* and the electron injection/transport layer 131 are formed on the p-type semiconductor layer 121*a*. Due to the presence of the p-type semiconductor layer 121*a*, roughness may be reduced, thereby stabilizing the driving of the device and increasing the lifespan of the device.

According to an embodiment, the n-type semiconductor layers 121*b* in a multi-layer structure may be formed on the thin-film light-emitting device according to one embodiment of the present invention. In this case, due to the presence of the p-type semiconductor layers 121*a*, roughness may be reduced, thereby stabilizing the driving of the device and increasing the lifespan of the device.

The positive electrode 160 is an electrode for providing holes to a device, and a metal material, an ionized metal material, an alloy material, a metal ink material in a colloid state in a predetermined liquid, and a transparent metal oxide may be used as the positive electrode 160.

The refractive index compensation layer 180 is formed on the positive electrode 160, and serves to adjust the refractive index between the positive electrode 160 and the air. In addition, the refractive index compensation layer 180 may include at least one of SiO, SiO$_2$, Al$_2$O$_3$, BaO, MgO, HfO$_2$, ZrO$_2$, CaO$_2$, SrO$_2$, Y$_2$O$_3$, Si$_3$N$_3$, and AlN.

Light formed in the thin-film light-emitting layer 141 passes through the positive electrode 160 having a high refractive index, and then passes through the air having a low refractive index and the refractive index compensation layer 180. Then, light is efficiently emitted.

The refractive index compensation layer 180 has a refractive index value of 0.5 to 4. When the refractive index value of the refractive index compensation layer 180 is less than 0.5, the refractive index of the refractive index compensation layer 180 and the refractive index of the positive electrode 160 are so different that the refractive index compensation layer 180 may not serve to compensate for a refractive index. When the refractive index value of the refractive index compensation layer 180 exceeds 4, the refractive index of the refractive index compensation layer 180 and the refractive index of the air are so different that the refractive index compensation layer 180 may not serve to compensate for a refractive index.

Figure 2:
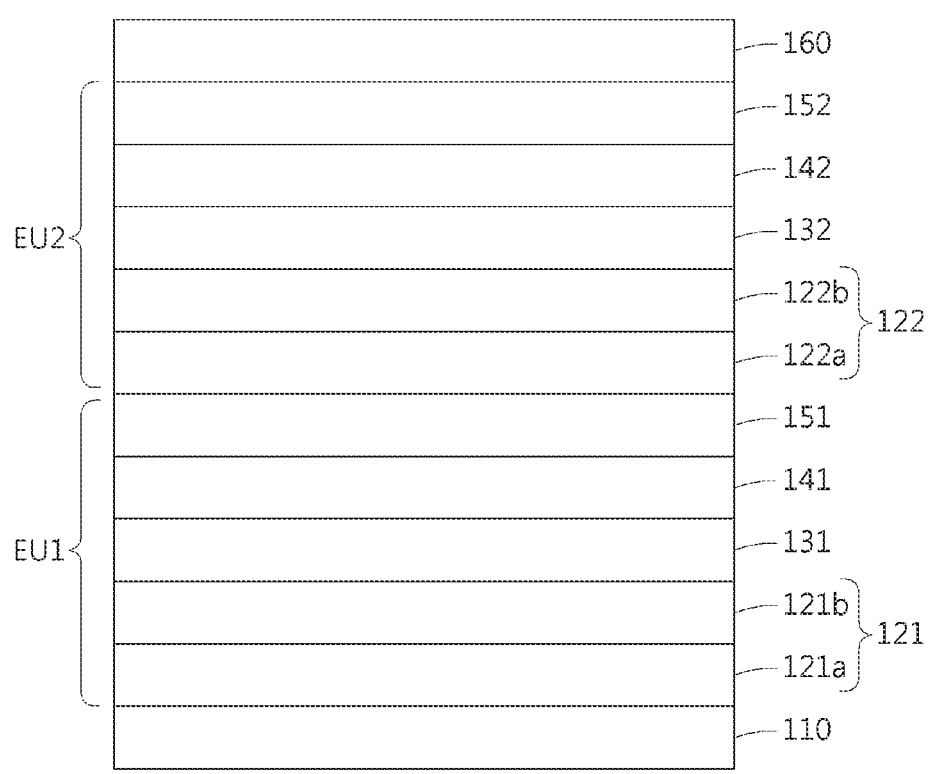
FIG. 2 illustrates the tandem structure of a thin-film light-emitting device according to one embodiment of the present invention.

FIG. 2 illustrates the tandem structure of a thin-film light-emitting device according to one embodiment of the present invention.

Since the thin-film light-emitting device of a tandem structure including a charge generating junction layer according to one embodiment of the present invention includes the same components shown in FIG. 1A or 1b, detailed description of the same components will be omitted.

In FIG. 2, a thin-film light-emitting device of a tandem structure including two light-emitting units is described, but the number of the light-emitting units is not limited.

The thin-film light-emitting device of a tandem structure including a charge generating junction layer according to one embodiment of the present invention includes the negative electrode 110, one or more light-emitting units EU1 and EU2 formed on the negative electrode 110 and including charge generating junction layers 121 and 122, electron injection/transport layers 131 and 132, thin-film light-emitting layers 141 and 142, and hole injection/transport layers 151 and 152 in a sequential order, and the positive electrode 160 formed on the light-emitting units EU1 and EU2.

The light-emitting units EU1 and EU2 includes the first light-emitting unit EU1 including the first charge generating junction layer 121, the first electron injection/transport layer 131, the first thin-film light-emitting layer 141, and the first hole injection/transport layer 151 in a sequential order and the second light-emitting unit EU2 including the second charge generating junction layer 122, the second electron injection/transport layer 132, the second thin-film light-emitting layer 142, and the second hole injection/transport layer 152 in a sequential order.

The number of lamination of the light-emitting units EU1 and EU2 is not particularly limited. Preferably, the light-emitting units EU1 and EU2 are repeatedly laminated 1 to 5 times.

When the light-emitting units EU1 and EU2 are laminated more than 5 times, the same color may be repeatedly laminated to improve luminous efficacy. In addition, various colors may be laminated to fabricate a device that emits white light.

The thin-film light-emitting device of a tandem structure including a charge generating junction layer according to one embodiment of the present invention is formed in a tandem structure in which the light-emitting units EU1 and EU2 are laminated. Thus, a high-performance thin-film light-emitting device may be fabricated at low cost.

Figure 3A:
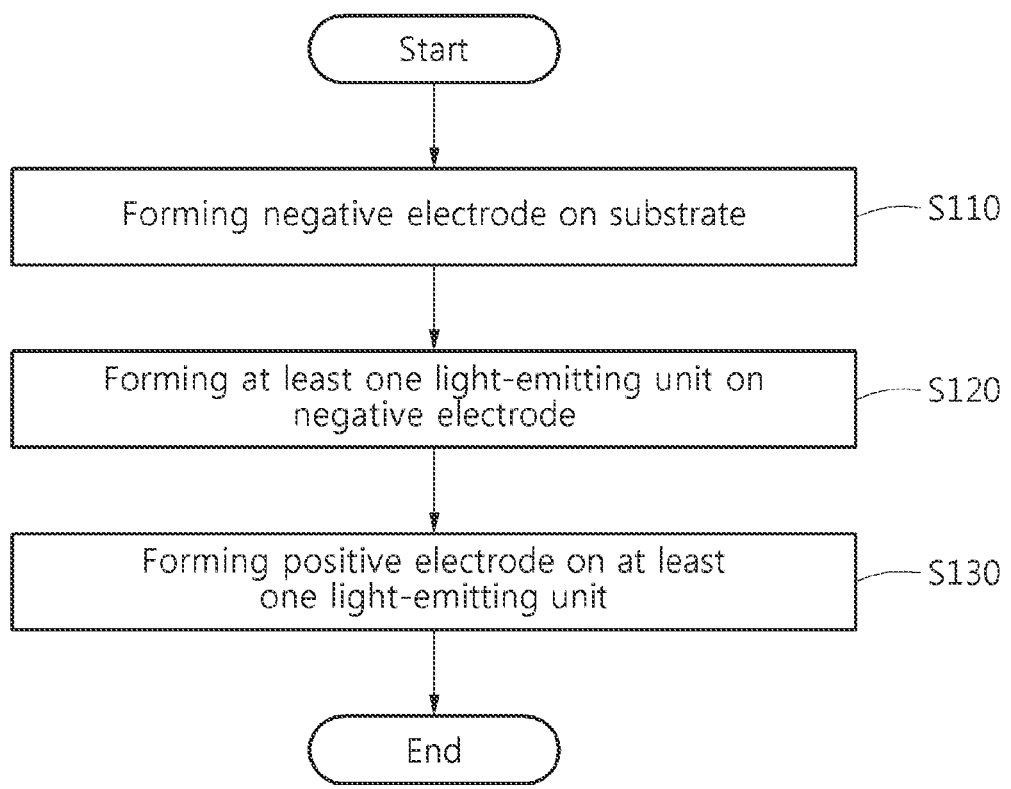
FIGS. 3A and 3B are flowcharts for explaining a method of fabricating a thin-film light-emitting device according to one embodiment of the present invention.
Figure 3B:
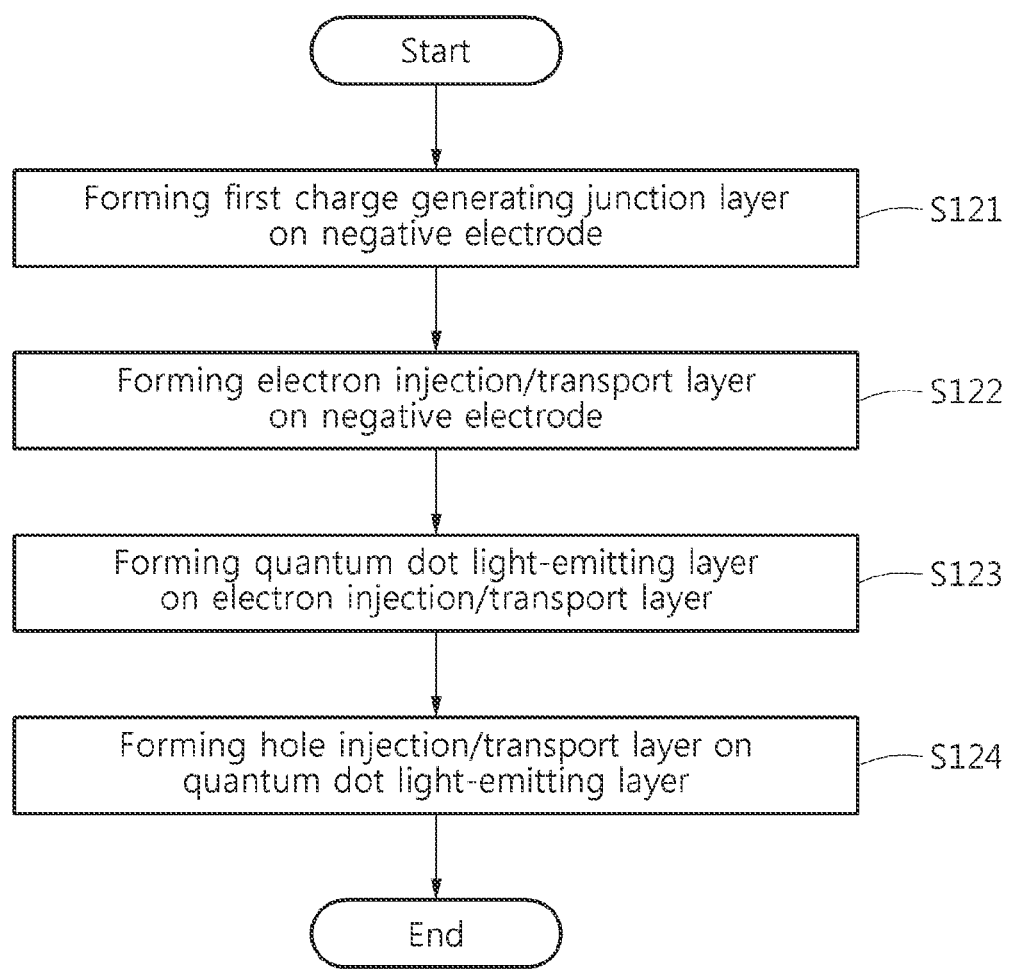

FIGS. 3A and 3B are flowcharts for explaining a method of fabricating a thin-film light-emitting device including a charge generating junction layer according to one embodiment of the present invention.

Since the method of fabricating a thin-film light-emitting device including a charge generating junction layer according to one embodiment of the present invention shown in FIGS. 3A and 3B includes the same components as the thin-film light-emitting device including a charge generating junction layer according to one embodiment of the present invention shown in FIG. 1A, description of the same components will be omitted.

In addition, the thin-film light-emitting device including a charge generating junction layer according to another embodiment of the present invention (FIG. 1B) and the thin-film light-emitting device of a tandem structure including a charge generating junction layer according to one embodiment of the present invention (FIG. 2) may be fabricated by changing the order of the method of fabricating a thin-film light-emitting device including a charge generating junction layer according to one embodiment of the present invention shown in FIGS. 3A and 3B.

The method of fabricating a thin-film light-emitting device including a charge generating junction layer according to one embodiment of the present invention includes step S110 of forming a negative electrode on a substrate, step S120 of forming at least one light-emitting unit on the negative electrode, and step S130 of forming a positive electrode on the light-emitting unit.

In addition, step S120 of forming at least one light-emitting unit includes step S121 of forming a charge generating junction layer on the negative electrode, step S122 of forming an electron injection/transport layer on the charge generating junction layer, step S123 of forming a thin-film light-emitting layer on the electron injection/transport layer, and step S124 of forming a hole injection/transport layer on the thin-film light-emitting layer.

In the method of fabricating a thin-film light-emitting device including a charge generating junction layer according to one embodiment of the present invention, in step S110, the negative electrode is formed on the substrate.

Then, in step S120, the charge generating junction layer is formed on the negative electrode.

The negative electrode itself may be used as a substrate and an electrode, and may be formed using a material for forming a negative electrode on a substrate.

The substrate is a base substrate for forming a light-emitting device. Substrates generally used in the art to which the present invention pertains may be used as the substrate of the present invention. In addition, the material of the substrate is not particularly limited, and may include silicon, glass, plastic, metal foil, and the like.

The negative electrode is an electrode for providing electrons to a device, and a metal material, an ionized metal material, an alloy material, a metal ink material in a colloid state in a predetermined liquid, and a transparent metal oxide may be used as the negative electrode.

The negative electrode may be formed on the substrate by a conventional vacuum deposition process (e.g., chemical vapor deposition, CVD) or an application method in which printing is performed using paste metal ink prepared by mixing metal flakes or metal particles and a binder, and any method capable of forming an electrode may be used without being limited to the above methods.

Step S120 includes step S121 of forming a charge generating junction layer on the negative electrode, step S122 of forming an electron injection/transport layer on the charge generating junction layer, step S123 of forming a thin-film light-emitting layer on the electron injection/transport layer, and step S124 of forming a hole injection/transport layer on the thin-film light-emitting layer.

In step S121, the charge generating junction layer is formed on the negative electrode.

The charge generating junction layer may have a layer-by-layer structure in which the p-type and n-type semiconductor layers are formed, and may be formed using a solution process.

More specifically, step S121 includes a step of forming the p-type semiconductor layer on the negative electrode, a step of forming the n-type semiconductor layer on the p-type semiconductor layer, and a step of annealing the n-type semiconductor layer.

The p-type and n-type semiconductor layers may be formed using a solution process. Accordingly, a large area process may be performed, process time may be shortened, and limitations on the semiconductor characteristics of the upper and lower electrodes (positive and negative electrodes) may be reduced.

Specifically, the p-type and n-type semiconductor layers may be formed using any one solution process selected from spin coating, slit dye coating, ink-jet printing, spray coating, and dip coating.

Preferably, the p-type and n-type semiconductor layers may be formed using spin coating. In spin coating, a certain amount of a solution is dropped onto a substrate while rotating the substrate at high speed. At this time, coating is performed by centrifugal force applied to the solution.

Since the charge generating junction layer (p-type and n-type semiconductor layers) is formed using a solution process, a large area process may be performed, process time may be shortened, and limitations on the semiconductor characteristics of the upper and lower electrodes (positive and negative electrodes) may be reduced.

In addition, in the method of fabricating a thin-film light-emitting device including a charge generating junction layer according to one embodiment of the present invention, the n-type semiconductor layer 121b is annealed.

The annealing treatment may be performed under an air or nitrogen ($N_2$) atmosphere. However, the present invention is not limited thereto, and the annealing treatment may be performed under an inert gas atmosphere or under reduced pressure. In this case, the inert gas may include air, nitrogen ($N_2$), argon, neon, and helium.

By annealing the n-type semiconductor layer, the concentration of oxygen vacancies at the interface between the p-type and n-type semiconductor layers may be adjusted. More specifically, when the n-type semiconductor layer is annealed, due to heat treatment in the air, the concentration of oxygen vacancies at the interface between the p-type and n-type semiconductor layers may be reduced.

In addition, when the n-type semiconductor layer 121b is annealed, dehydration or dehydrogenation of the charge generating junction layer may occur. In this case, dehydration or dehydrogenation means removal of H, OH, and the like in addition to $H_2$.

More specifically, according to the method of fabricating a thin-film light-emitting device including a charge generating junction layer according to one embodiment of the present invention, when the n-type semiconductor layer is annealed, oxygen vacancies induce charge trapping, and the concentration of oxygen-hydrogen (O—H) at the interface between the p-type and n-type semiconductor layers is decreased, which inhibits generated charge from being re-trapped.

Accordingly, when an excess of hydrogen (including water or hydroxyl groups) is removed by dehydration or dehydrogenation, the structure of the charge generating junction layer may be aligned, and an impurity level in an energy gap may be reduced.

In addition, when the n-type semiconductor layer 121b is annealed, oxygen penetrates, and as a result, the proportion of the p-type semiconductor layer at the interface between the p-type and n-type semiconductor layers may be increased.

In the charge generating junction layer, semiconductor characteristics are improved by metal-oxygen (M-O) formed therein, which contributes to charge generation. In the thin-film light-emitting device including a charge generating junction layer according to one embodiment of the present invention, the n-type semiconductor layer is annealed, which increases the proportion of the p-type semiconductor layer at the interface between the p-type and n-type semiconductor layers. As a result, the concentration of metal-oxygen (M-O), e.g., Cu—O, at the interface between the p-type and n-type semiconductor layers is increased, thereby further improving the charge generation efficiency of the charge generating junction layer 121.

The annealing treatment may be performed at a temperature of 160° C. to 250° C. When the annealing temperature is less than 160° C., resistance may increase. When the annealing temperature exceeds 250° C., a lower thin film may deteriorate.

The annealing treatment may be performed under an air or nitrogen ($N_2$) atmosphere, and may be hot plate annealing, furnace annealing, or rapid thermal annealing (RTA). The rapid thermal annealing may include a gas rapid thermal annealing (GRTA) method using heated gas and a lamp rapid thermal annealing (LRTA) method using lamp light.

Preferably, according to the method of fabricating a thin-film light-emitting device including a charge generating junction layer according to one embodiment of the present invention, the temperature of a hot plate may be set to a desired temperature, the hot plate may be preheated for about 20 minutes, and heat treatment may be performed.

The p-type and n-type semiconductor layers constituting the charge generating junction layer may be formed using oxide semiconductors. Thus, resistance to oxygen and moisture may be improved, thereby increasing the lifespan of a device.

Then, in step S122, the electron injection/transport layer is formed on the charge generating junction layer.

The electron injection/transport layer may include at least one of $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $SnO_2$, TPBI, and TAZ.

The electron injection/transport layer may be formed using at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Then, in step S123, the thin-film light-emitting layer is formed.

The thin-film light-emitting layer may be a quantum dot light-emitting layer or an organic light-emitting layer. Preferably, the thin-film light-emitting layer is a quantum dot light-emitting layer.

As the quantum dot light-emitting layer, at least one selected from the group consisting of group II-VI semiconductor compounds, group III-V semiconductor compounds, group IV-VI semiconductor compounds, group IV elements or compounds, and combinations thereof may be used.

The thin-film light-emitting layer may be formed using vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, or zone casting.

Then, in step S124, the hole injection/transport layer is formed on the thin-film light-emitting layer.

The hole injection/transport layer as a layer for transporting and injecting holes may be formed using PEDOT:PSS. When the hole injection/transport layer is formed using PEDOT:PSS, additives such as tungsten oxide, graphene oxide (GO), CNT, molybdenum oxide (MoOx), vanadium oxide ($V_2O_5$), and nickel oxide (NiOx) may be added. However, the present invention is not limited thereto, and various organic or inorganic materials may be used.

The hole injection/transport layer may be formed using at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Finally, in step S130, the positive electrode is formed on the light-emitting unit.

The positive electrode is an electrode for providing holes to a device, and may be formed by performing a solution process, such as screen printing, on a transmissive electrode, a reflective electrode, a metal paste, or a metal ink material in a colloid state in a predetermined liquid.

The positive electrode may be formed on the substrate by a conventional vacuum deposition process (e.g., chemical vapor deposition, CVD) or an application method in which printing is performed using paste metal ink prepared by mixing metal flakes or metal particles and a binder, and any method capable of forming an electrode may be used without being limited to the above methods.

According to an embodiment, after step S120, a step of forming an auxiliary charge generating junction layer on the light-emitting unit may be further included.

The auxiliary charge generating junction layer may be formed using the same material and method as the above-described charge generating junction layer.

The auxiliary charge generating junction layer may have a layer-by-layer structure in which the p-type and n-type semiconductor layers are formed, and may be formed using a solution process.

The auxiliary charge generating junction layer may be formed using a solution process. Accordingly, a large area process may be performed, process time may be shortened, and limitations on the semiconductor characteristics of the upper and lower electrodes (positive and negative electrodes) may be reduced.

Specifically, the p-type and n-type semiconductor layers may be formed using any one solution process selected from spin coating, slit dye coating, ink-jet printing, spray coating, and dip coating.

Preferably, the p-type and n-type semiconductor layers may be formed using a spin coating. In spin coating, a certain amount of a solution is dropped onto a substrate while rotating the substrate at high speed. At this time, coating is performed by centrifugal force applied to the solution.

Since the auxiliary charge generating junction layer (p-type and n-type semiconductor layers) is formed using a solution process, a large area process may be performed, process time may be shortened, and limitations on the semiconductor characteristics of the upper and lower electrodes (positive and negative electrodes) may be reduced.

In addition, the n-type semiconductor layer 121b may be annealed. The annealing treatment may be performed under an air or nitrogen ($N_2$) atmosphere. However, the present invention is not limited thereto, and the annealing treatment may be performed under an inert gas atmosphere or under reduced pressure. In this case, the inert gas may include air, nitrogen ($N_2$), argon, neon, and helium.

The annealing treatment may be performed under an air or nitrogen ($N_2$) atmosphere, and may be hot plate annealing, furnace annealing, or rapid thermal annealing (RTA). The rapid thermal annealing may include a gas rapid thermal annealing (GRTA) method using heated gas and a lamp rapid thermal annealing (LRTA) method using lamp light.

Preferably, in the thin-film light-emitting device including a charge generating junction layer according to one embodiment of the present invention, the temperature of a hot plate may be set to a desired temperature, the hot plate may be preheated for about 20 minutes, and heat treatment may be performed.

Hereinafter, the electrical or optical characteristics of the thin-film light-emitting device including a charge generating junction layer according to embodiments of the present invention will be described with reference to FIGS. 4A to 16.

Fabrication Examples

Comparative Example

A negative electrode was formed on a glass substrate, and then 2 at % Li-doped ZnO for injecting electrons was formed in a thickness of 50 nm on the negative electrode. A thin-film light-emitting layer was formed in a thickness of 30 nm on the formed electron injection layer using spin coating, a hole transport layer was formed in a thickness of 20 nm on the thin-film light-emitting layer using spin coating, and PEDOT:PSS for injecting holes was formed in a thickness of 20 nm on the hole transport layer using spin coating. Then, to form a positive electrode on the hole injection layer, aluminum (Al) was deposited on the hole injection layer using a vacuum deposition method.

Example 1

A solution prepared by adding Li:CuO prepared by doping 20 atomic % Li on copper oxide and Li:ZnO prepared by doping 10 atomic % Li on zinc oxide into ethanol as a solvent was printed on a negative electrode formed of ITO under an air atmosphere using a solution process to form a layer-by-layer structure including 20 atomic % Li:CuO and 10 atomic % Li:ZnO. Then, 10 atomic % Li:ZnO was annealed on a hot plate at 250° C. for 10 minutes to form a charge generating junction layer in a thickness of 15 nm.

Thereafter, an electron transport layer of 10 atomic % Li:ZnO was formed in a thickness of 15 nm using a printing method, and a quantum dot light-emitting layer of a CdSe/CdS/ZnS (core/shell/shell type) structure was formed in a thickness of 30 to 40 nm using a printing method. Then, holes transport layers of 4,4,4-tris(Ncarbazolyl) triphenylamine (TCTA) and 4,4'-bis[N-(naphthyl)-Nphenylamino] biphenyl (NPB) were formed using a vacuum deposition method in thicknesses of 10 nm and 20 nm, respectively. Then, HAT-CN as a hole injection layer was formed in a thickness of 20 nm using a vacuum deposition method, and a positive electrode of Al was formed in a thickness of 100 nm using a vacuum deposition method to fabricate a thin-film light-emitting device.

FIGS. 4A to 4H show the characteristics of a thin-film light-emitting device (control device) that does not include a solution process-based charge generating junction layer according to Comparative Example and the characteristics of a thin-film light-emitting device including a charge generating junction layer (CGL device) according to Example 1 of the present invention.

Figure 4A:
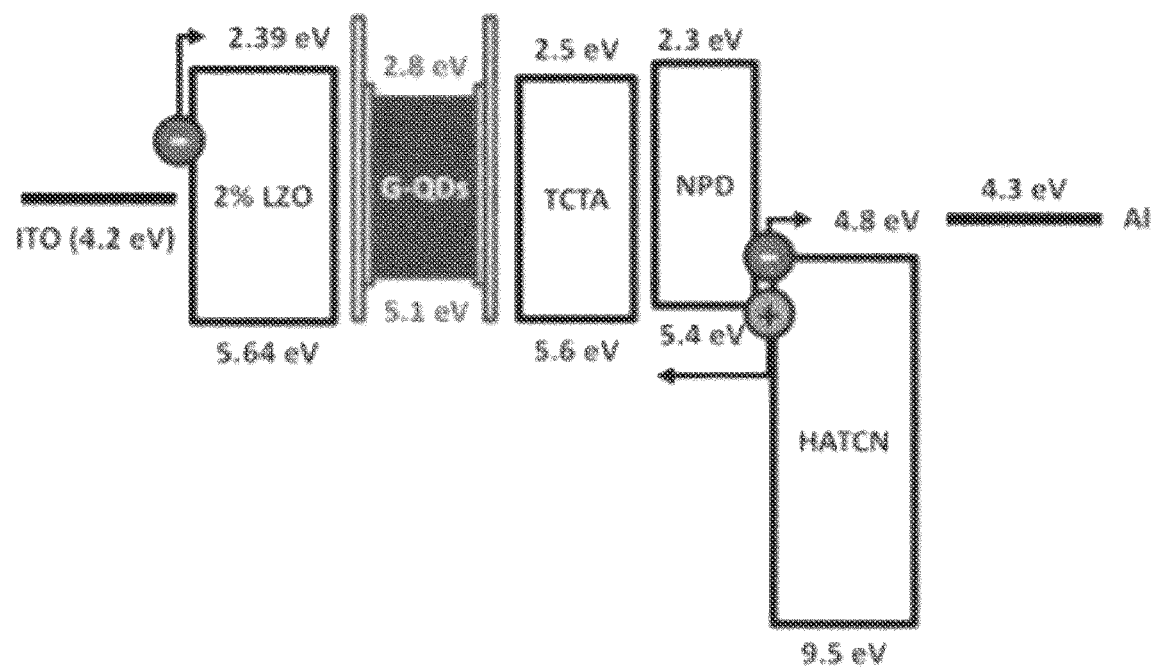
FIGS. 4A to 4H show the characteristics of a thin-film light-emitting device (control device) that does not include a solution process-based charge generating junction layer according to Comparative Example and the characteristics of a thin-film light-emitting device including a charge generating junction layer (CGL device) according to Example 1 of the present invention.
Figure 4B:
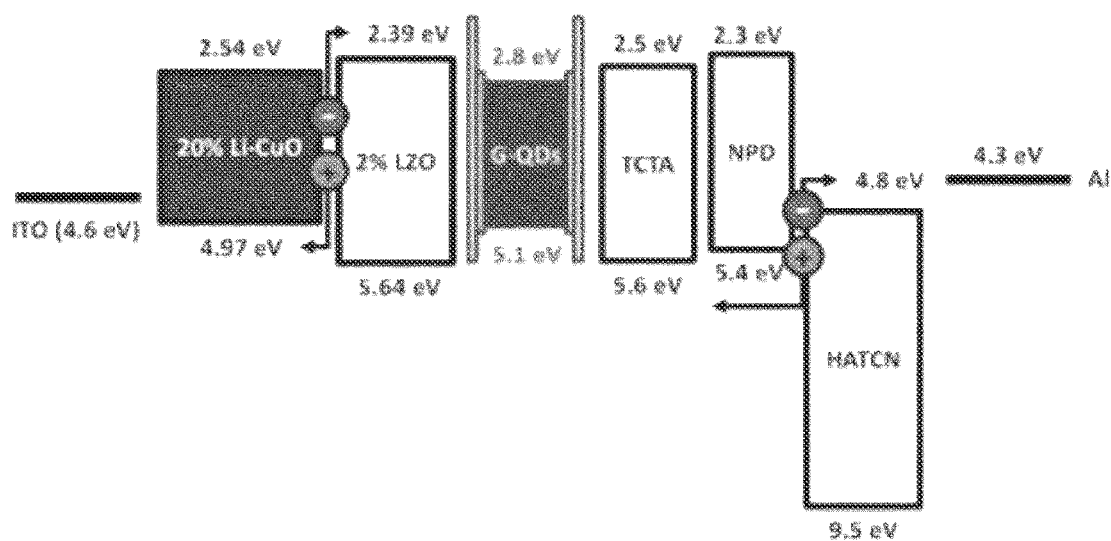

FIG. 4A shows the band diagram of the thin-film light-emitting device according to Comparative Example that does not include a solution process-based charge generating junction layer, and FIG. 4B shows the band diagram of the thin-film light-emitting device including a charge generating junction layer according to Example 1 of the present invention.

Figure 4C:
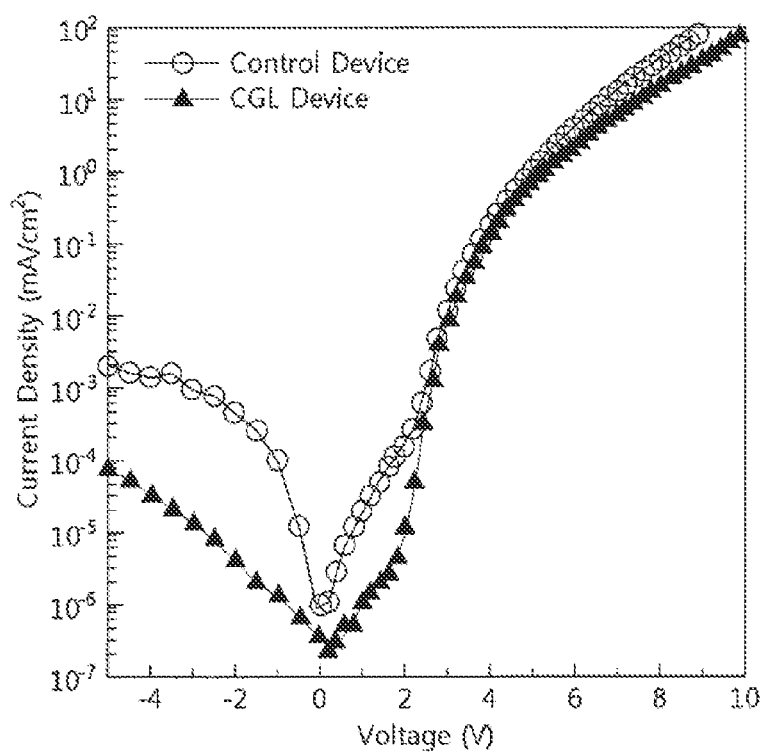
Figure 4D:
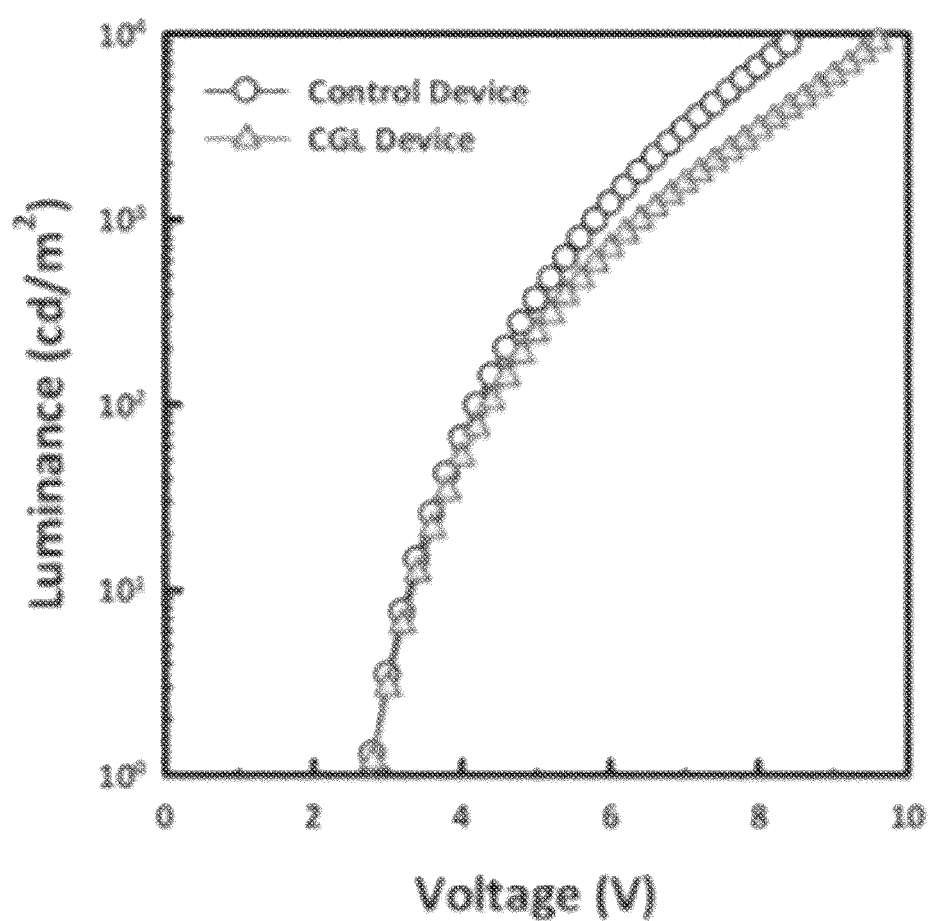
Figure 4E:
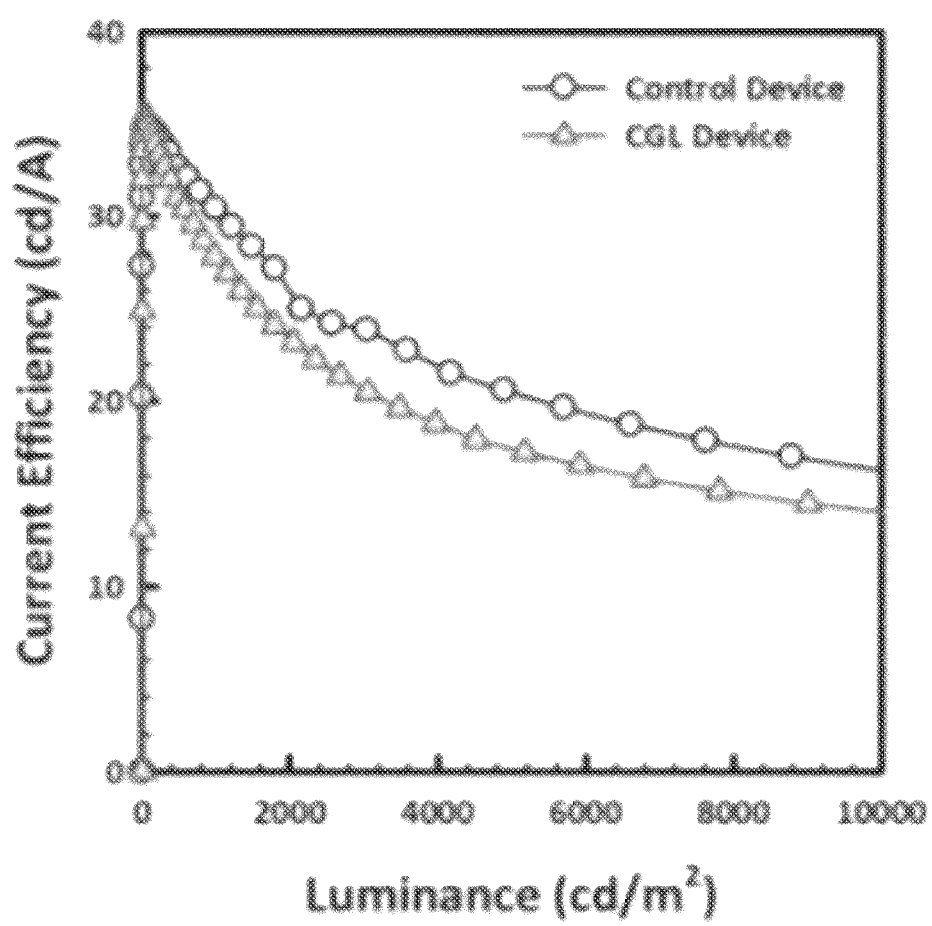
Figure 4F:
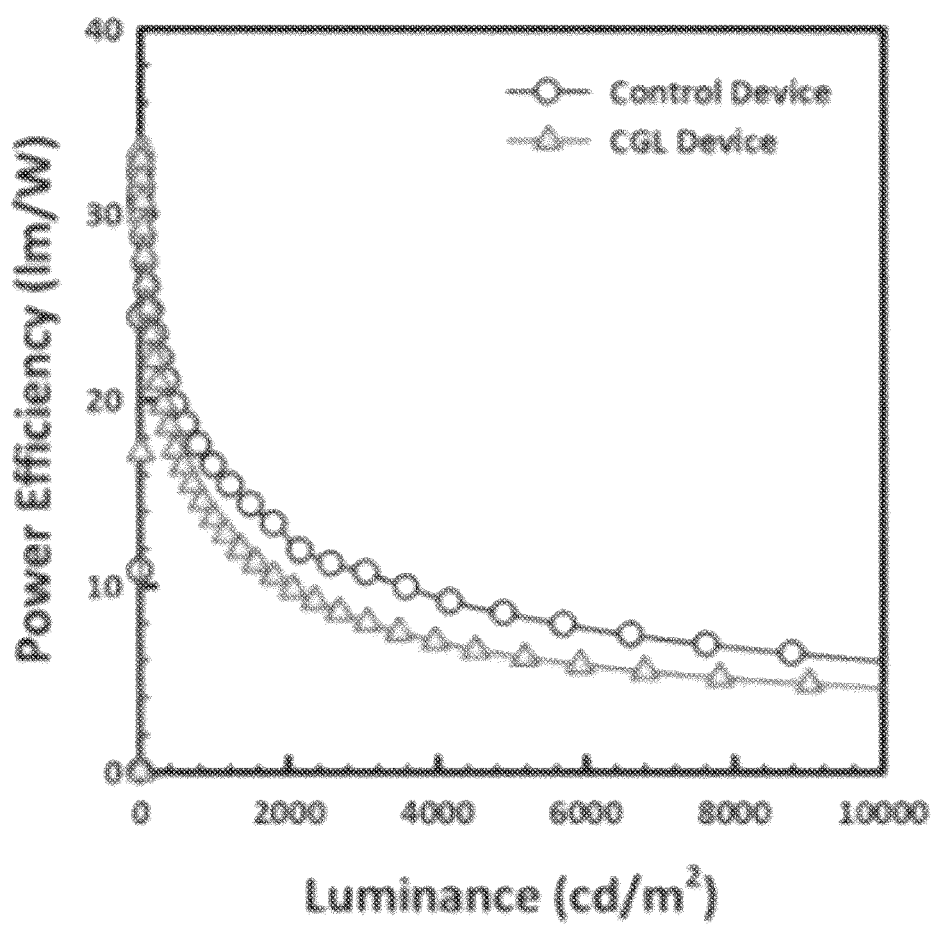

FIG. 4C shows current density-voltage (J-V) characteristics, FIG. 4D shows luminance-voltage (L-V) characteristics, FIG. 4E shows current efficiency-luminance (C/E-L) characteristics, and FIG. 4F shows power efficiency-luminance (P/E-L) characteristics.

Figure 4G:
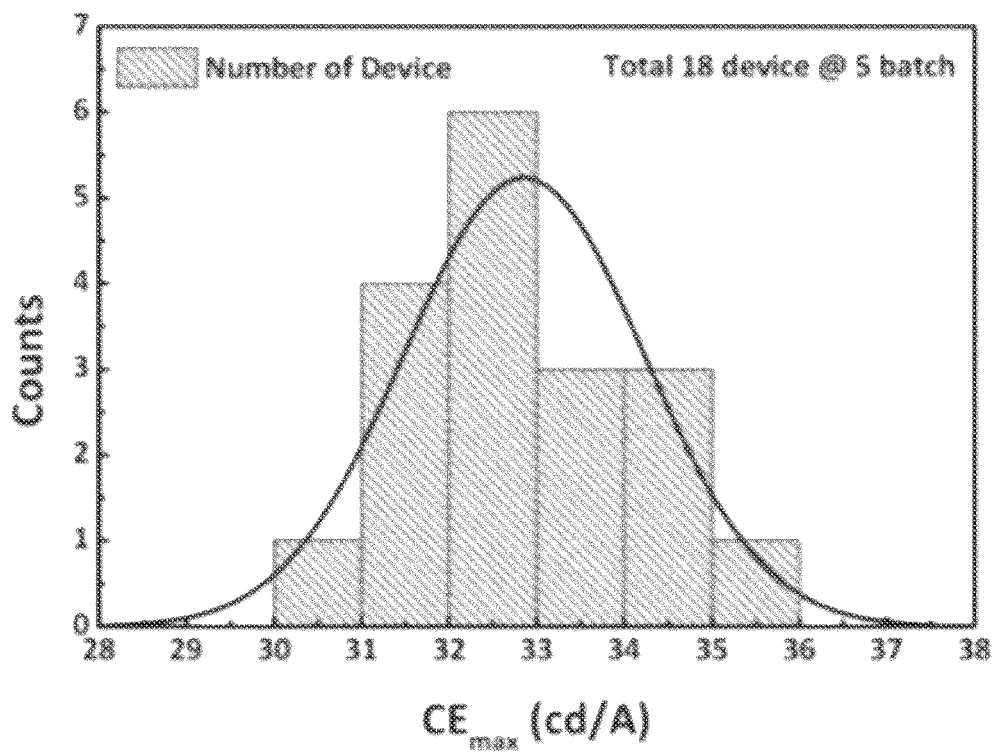
Figure 4H:
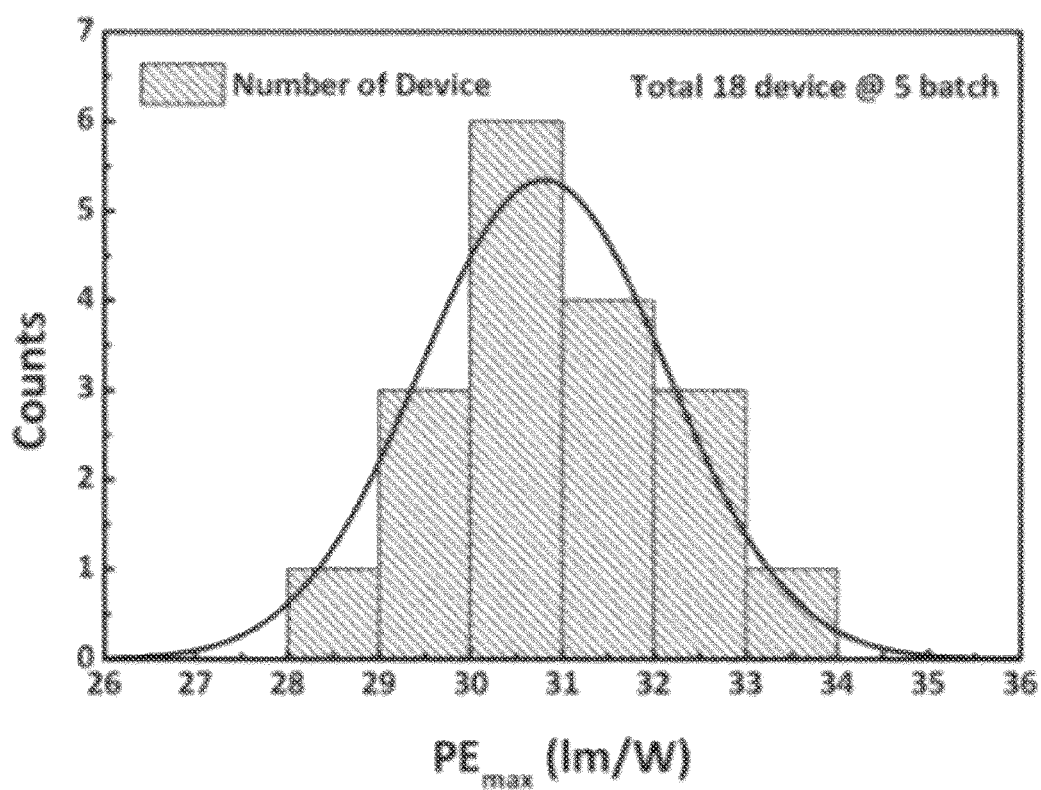

FIGS. 4G and 4H show the histograms of the maximum values of the current efficiency and power efficiency of a thin-film light-emitting device including a charge generating junction layer (CGL device) according to Example 1 of the present invention.

In FIGS. 4G and 4H, 18 devices were measured in five batches of the thin-film light-emitting device including a charge generating junction layer (CGL device) according to Example 1 of the present invention.

In Table 1 below, the detailed characteristics of FIGS. 4C to 4F are shown.

TABLE 1

| QLED | VT (V) | VD (V) | C/Emax (cd/A) | P/Emax (lm/W) | @ 1,000 cd/m2 | | @ 10,000 cd/m2 | |
|---|---|---|---|---|---|---|---|---|
| | | | | | C/E (cd/A) | P/E (lm/W) | C/E (cd/A) | P/E (lm/W) |
| Comparative Example | 2.7 | 5.8 | 34.9 | 32.4 | 30.4 | 16.4 | 16.3 | 6.0 |
| Example | 2.8 | 6.4 | 35.4 | 33.5 | 27.8 | 13.6 | 14.0 | 4.5 |

In Table 1, VT represents a voltage when light having an intensity of 1 cd/m² is emitted, VD represents a voltage when light having an intensity of 1,000 cd/m² is emitted, C/E represents current efficiency, i.e., the amount of light generated by a current of 1 A, P/E represents power efficiency, i.e., the amount of light generated by a power of 1 W, C/Emax represents the maximum efficiency of C/E, and P/Emax represents the maximum efficiency of P/E.

Referring to FIGS. 4A to 4H and Table 1, the thin-film light-emitting device including a charge generating junction layer (CGL device) according to Example 1 of the present invention includes a solution process-based charge generating junction layer. Thus, compared to Comparative Example, the thin-film light-emitting device of Example 1 has improved current density-voltage characteristics, luminance-voltage characteristics, current efficiency-luminance characteristics, and power efficiency-luminance characteristics.

FIGS. 5A to 5D show the characteristics of a thin-film light-emitting device including a charge generating junction layer according to Example 1 of the present invention depending on the dopant concentrations of a p-type semiconductor layer.

Figure 5A:
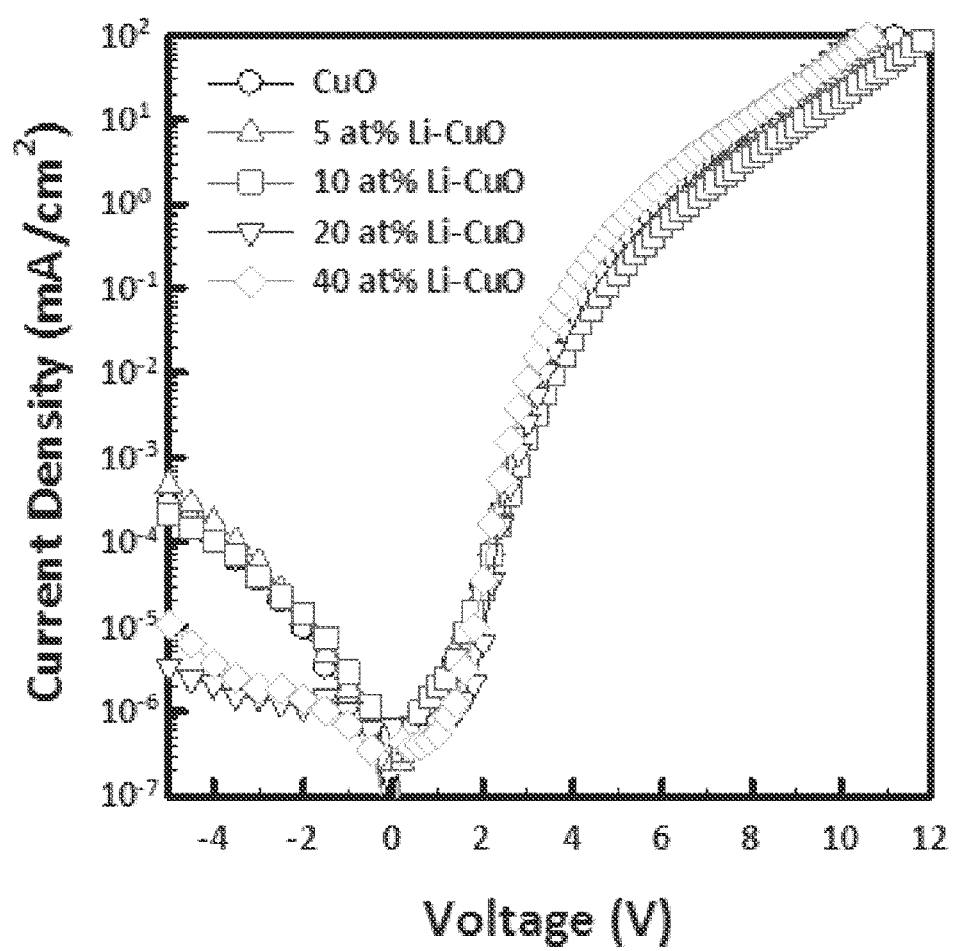
FIGS. 5A to 5D show the characteristics of a thin-film light-emitting device including a charge generating junction layer according to Example 1 of the present invention depending on the dopant concentrations of a p-type semiconductor layer.
Figure 5B:
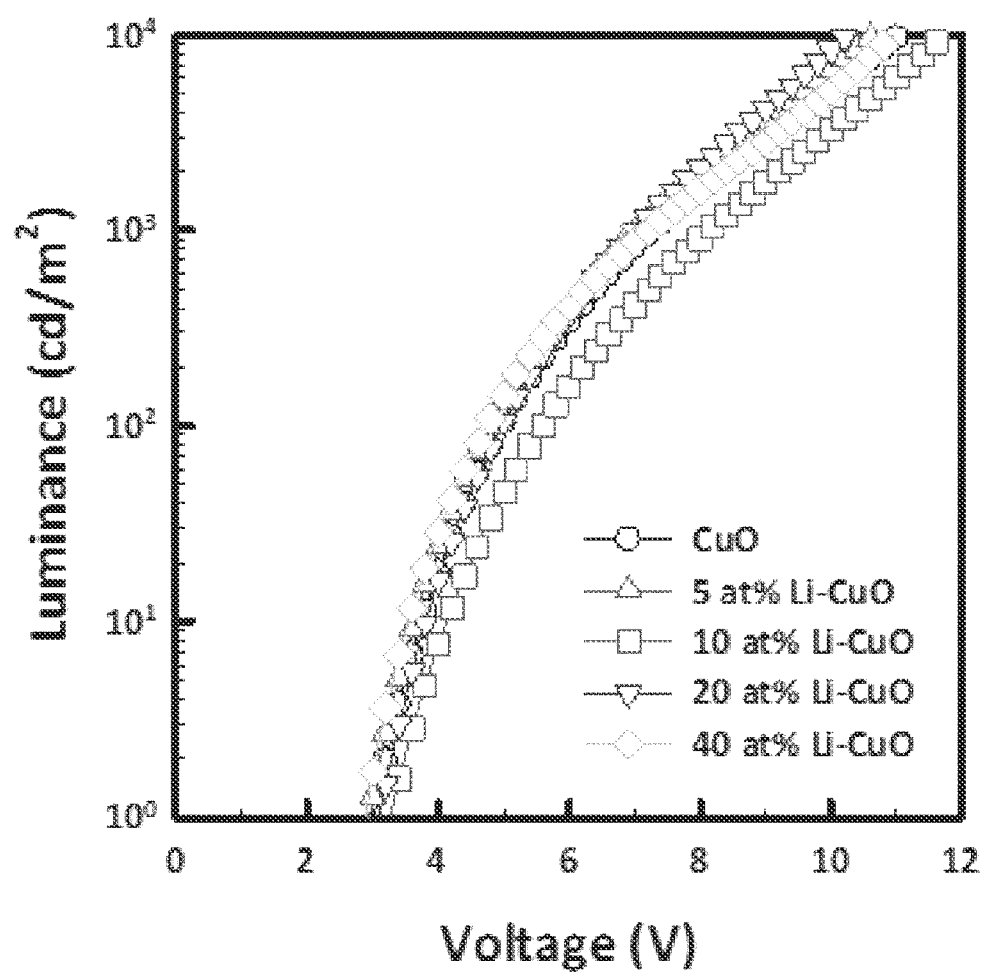
Figure 5C:
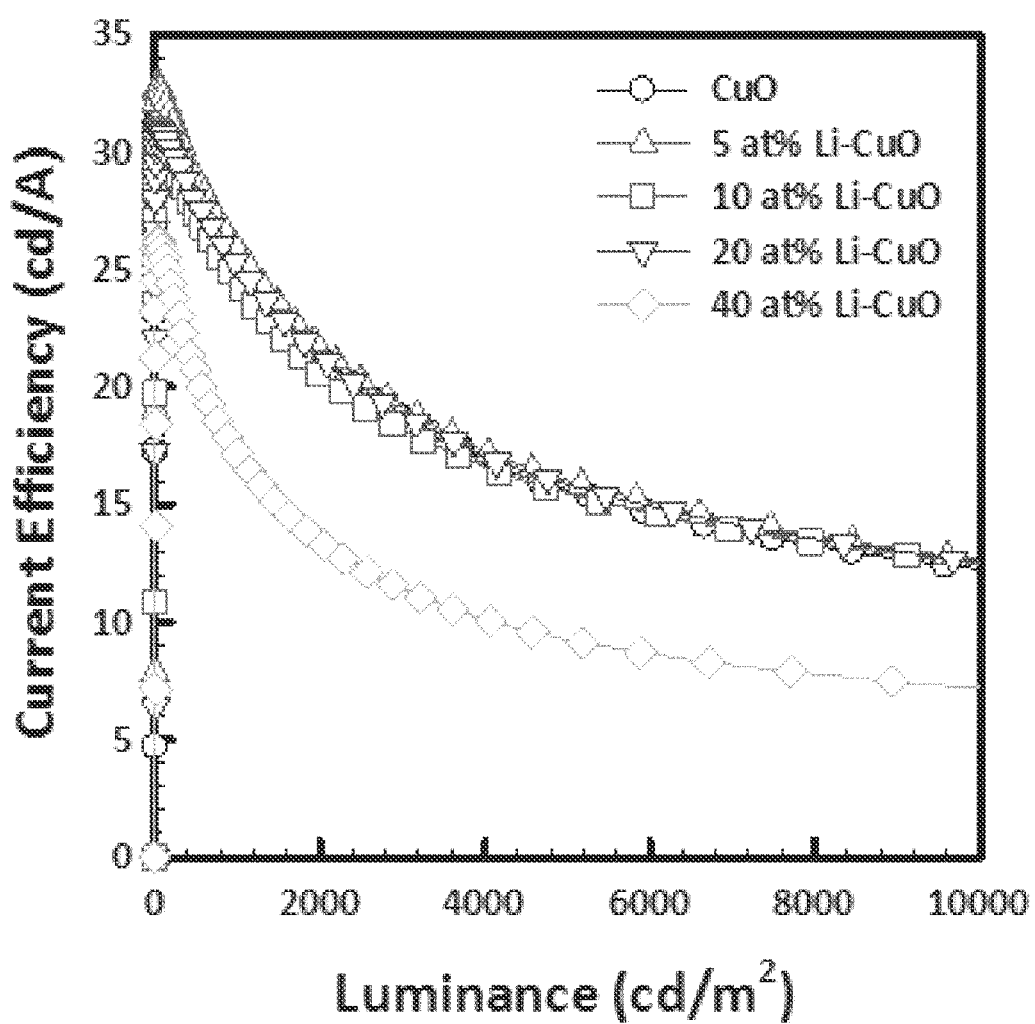
Figure 5D:
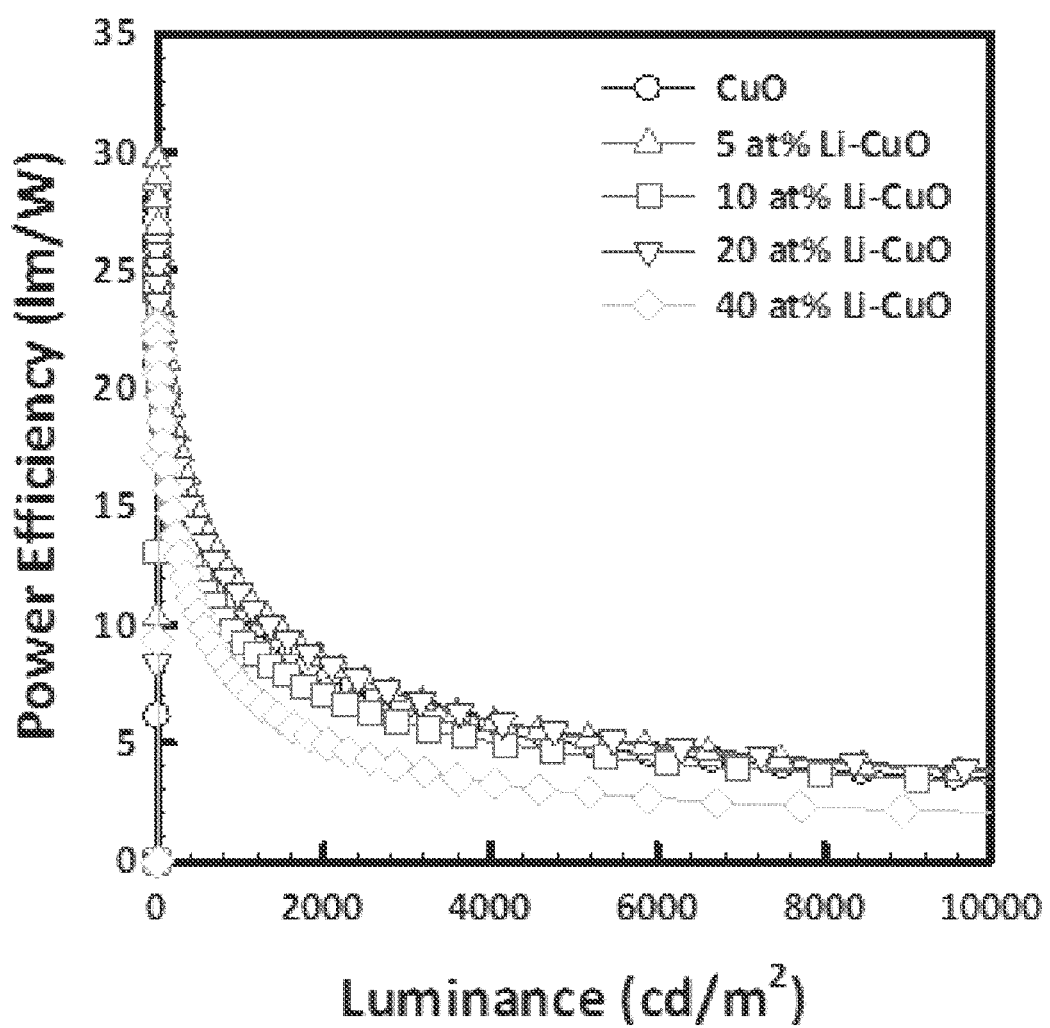

FIG. 5A shows current density-voltage characteristics, FIG. 5B shows luminance-voltage characteristics, FIG. 5C shows current efficiency-luminance characteristics, and FIG. 5D shows power efficiency-luminance characteristics.

In FIGS. 5A to 5D, a solution process-based CuO was used as a p-type semiconductor layer, and characteristics were measured depending on different doping concentrations of Li (0 at %, 5 at %, 10 at %, 20 at %, and 40 at %).

In Table 2, the detailed characteristics of FIGS. 5A to 5D are shown.

TABLE 2

| Li doping concentration in CuO | VT (V) | VD (V) | C/Emax (cd/A) | P/Emax (lm/W) | @ 1,000 cd/m2 | | @ 10,000 cd/m2 | |
|---|---|---|---|---|---|---|---|---|
| | | | | | C/E (cd/A) | P/E (lm/W) | C/E (cd/A) | P/E (lm/W) |
| 0% (CuO) | 3.0 | 7.3 | 31.4 | 27.9 | 25.3 | 10.9 | 12.2 | 3.5 |
| 5 at % | 2.9 | 7.0 | 32.8 | 29.8 | 25.9 | 11.5 | 12.7 | 3.7 |
| 10 at % | 3.2 | 8.1 | 30.9 | 25.1 | 24.4 | 9.4 | 12.5 | 3.3 |
| 20 at % | 3.1 | 7.0 | 30.8 | 26.2 | 25.2 | 11.3 | 12.6 | 3.9 |
| 40 at % | 2.9 | 7.2 | 26.2 | 22.8 | 17.1 | 7.5 | 7.2 | 2.1 |

Referring to FIGS. 5A to 5D and Table 2, it can be seen that, depending on the dopant concentrations of the p-type semiconductor layer, the current density-voltage characteristics, luminance-voltage characteristics, current efficiency-luminance characteristics, and power efficiency-luminance characteristics of the thin-film light-emitting device including a charge generating junction layer according to Example 1 of the present invention are adjusted, and the best characteristics are exhibited when the concentration of a dopant included in the p-type semiconductor layer is 10 at %.

FIGS. 6A to 6D show the characteristics of a thin-film light-emitting device including a charge generating junction layer according to Example 1 of the present invention depending on the annealing temperatures of an n-type semiconductor layer.

Figure 6A:
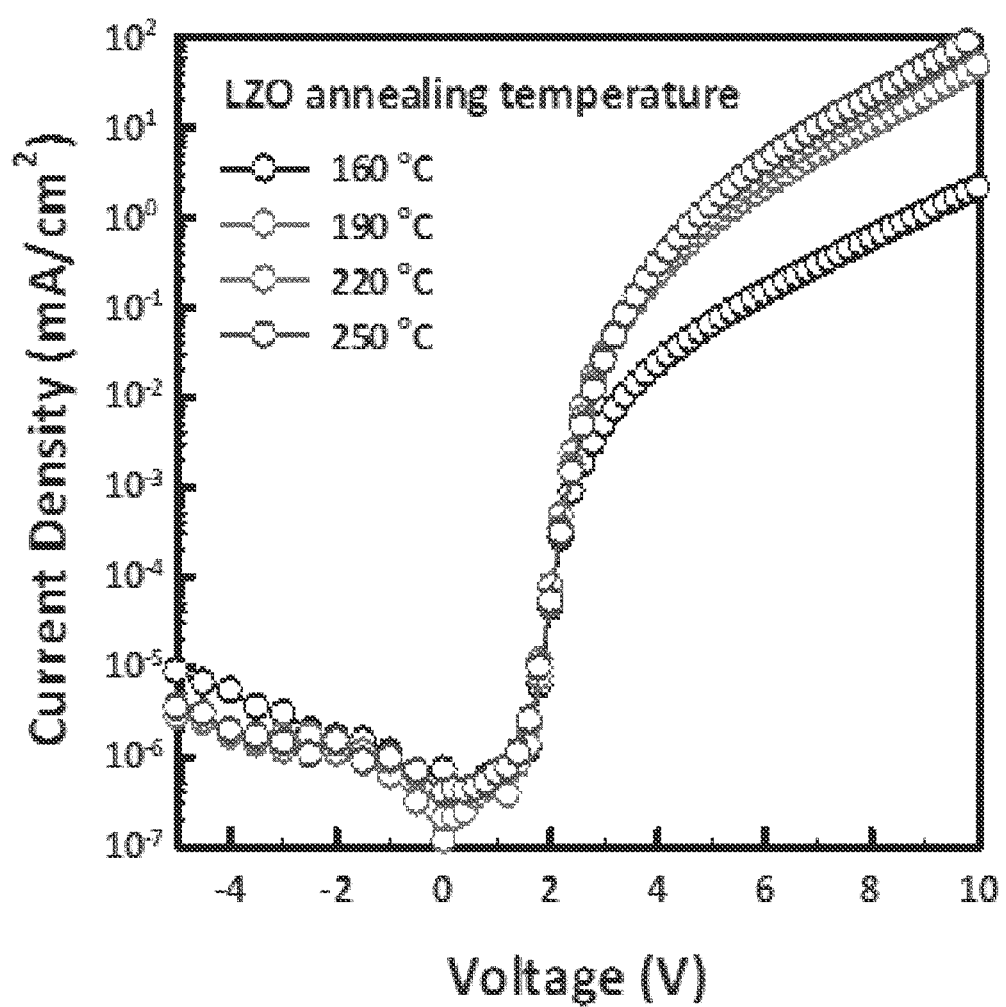
FIGS. 6A to 6D show the characteristics of a thin-film light-emitting device including a charge generating junction layer according to Example 1 of the present invention depending on the annealing temperatures of an n-type semiconductor layer.
Figure 6B:
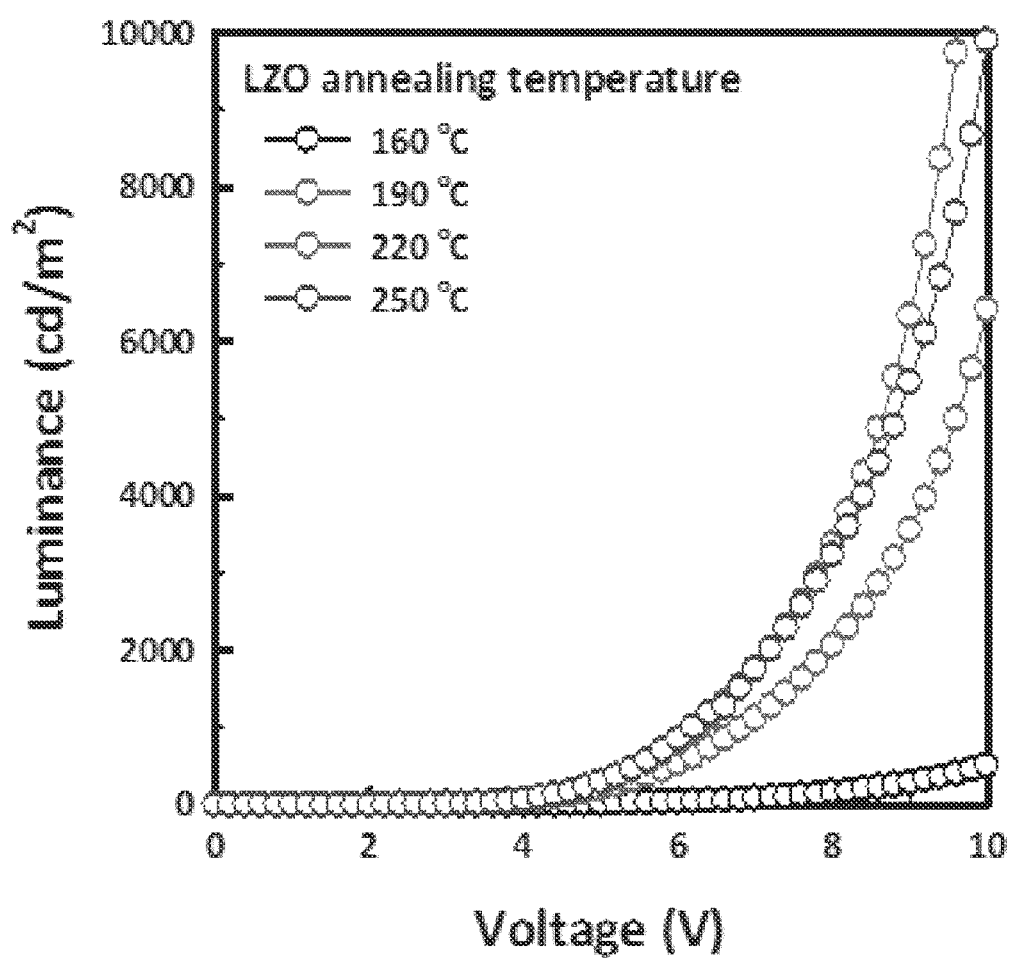
Figure 6C:
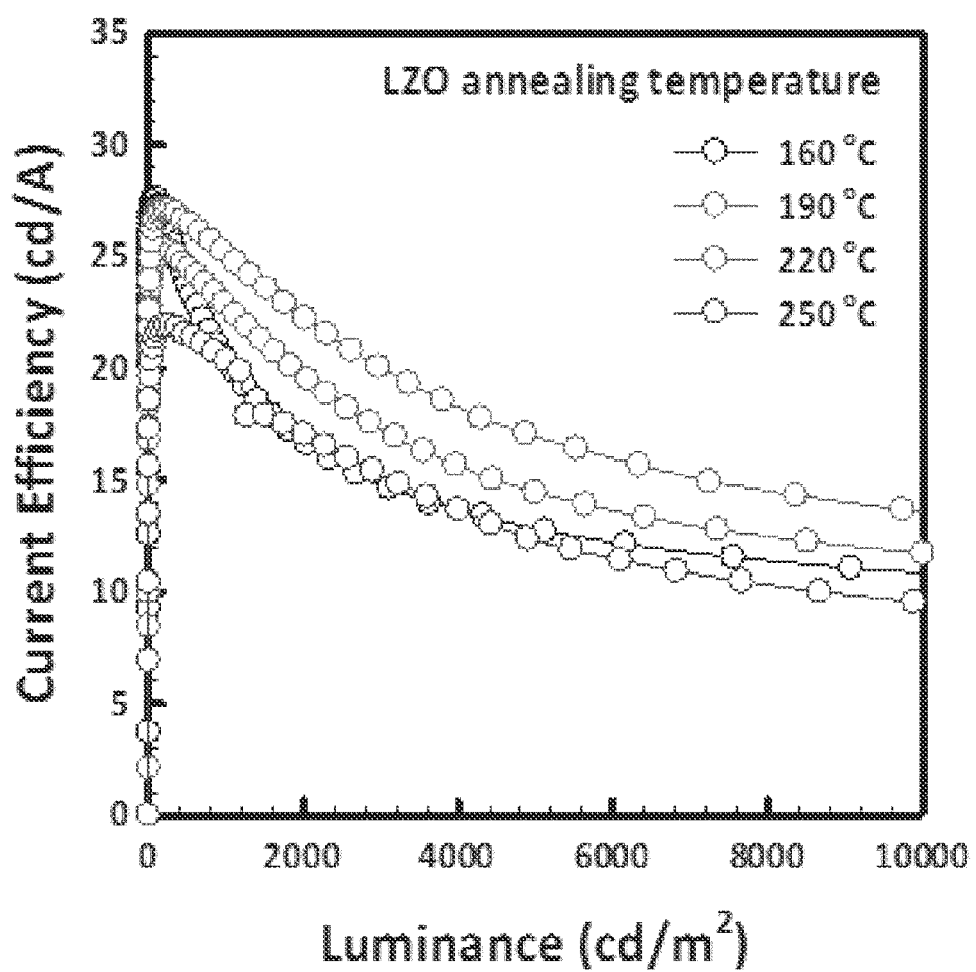
Figure 6D:
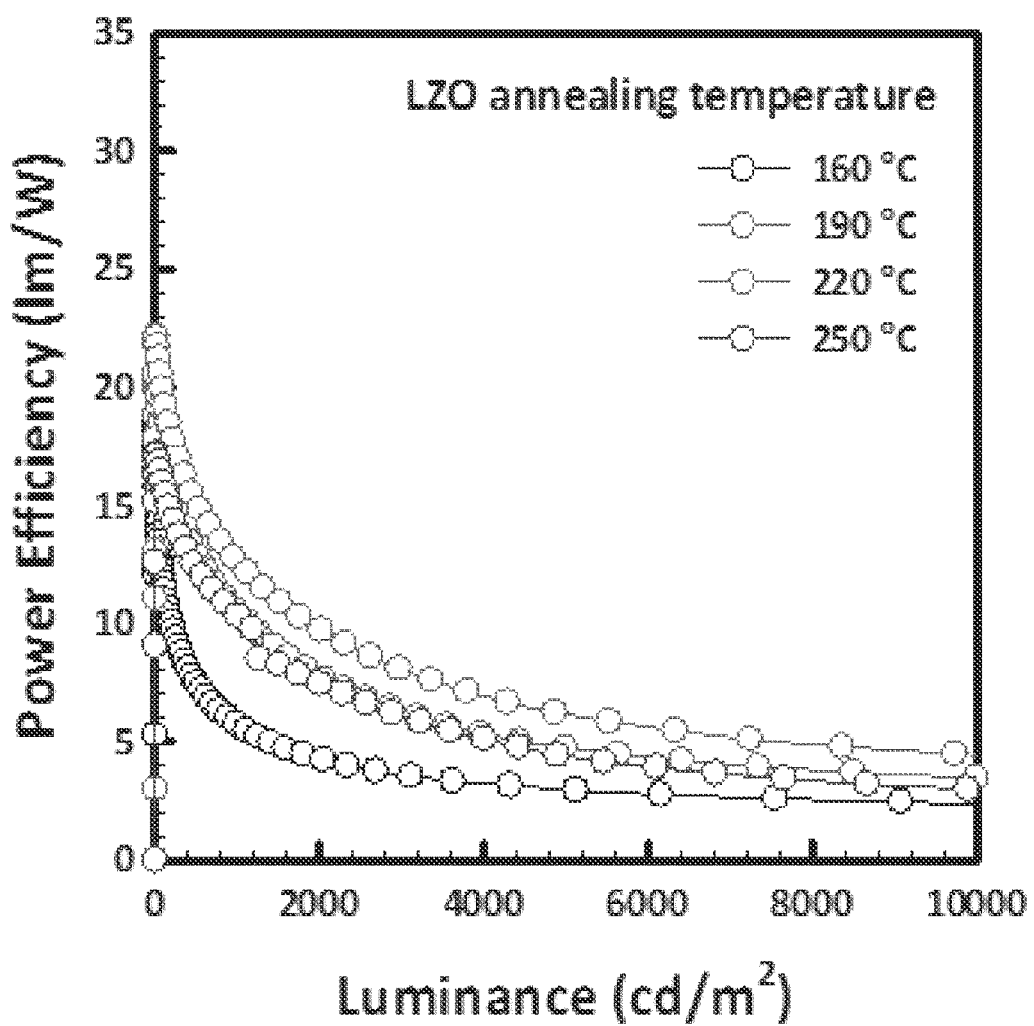

FIG. 6A shows current density-voltage characteristics, FIG. 6B shows luminance-voltage characteristics, FIG. 6C shows current efficiency-luminance characteristics, and FIG. 6D shows power efficiency-luminance characteristics.

In FIGS. 6A to 6D, a solution process-based LZO was used as an n-type semiconductor layer, and characteristics were measured depending on different annealing temperatures (160° C., 190° C., 220° C., and 250° C.).

In Table 3, the detailed characteristics of FIGS. 6A to 6D are shown.

TABLE 3

| LZO annealing tem (° C.) | VT (V) | VD (V) | C/Emax (cd/A) | P/Emax (lm/W) | @ 1,000 cd/m2 C/E (cd/A) | @ 1,000 cd/m2 P/E (lm/W) | @ 10,000 cd/m2 C/E (cd/A) | @ 10,000 cd/m2 P/E (lm/W) |
|---|---|---|---|---|---|---|---|---|
| 160 | 3.1 | 11.2 | 27.6 | 18.7 | 20.4 | 5.7 | 10.8 | 2.4 |
| 190 | 2.6 | 6.8 | 25.4 | 20.2 | 22.8 | 10.5 | 11.7 | 3.5 |
| 220 | 2.6 | 6.3 | 27.1 | 22.2 | 25.1 | 12.6 | 13.6 | 4.4 |
| 250 | 2.7 | 6.2 | 27.9 | 17.2 | 20.4 | 10.3 | 9.5 | 3.0 |

Referring to FIGS. 6A to 6D and Table 3, it can be seen that, depending on annealing temperatures, the current density-voltage characteristics, luminance-voltage characteristics, current efficiency-luminance characteristics, and power efficiency-luminance characteristics of the thin-film light-emitting device including a charge generating junction layer according to Example 1 of the present invention are adjusted, and the characteristics of a device (diode) are best improved when the annealing temperature of LZO, which is an n-type semiconductor layer, is 220° C. or more.

FIGS. 7A to 7D show the characteristics of a thin-film light-emitting device including a charge generating junction layer according to Example 1 of the present invention depending on the thicknesses of an n-type semiconductor layer.

Figure 7A:
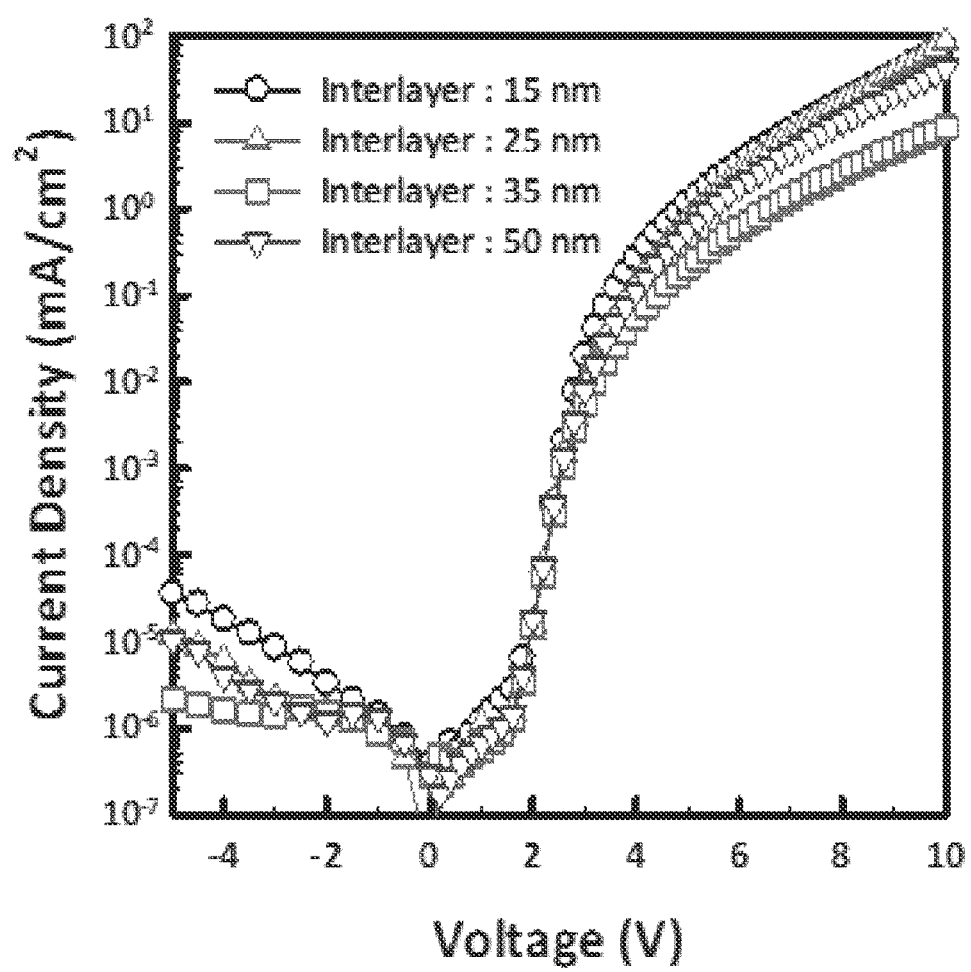
FIGS. 7A to 7D show the characteristics of a thin-film light-emitting device including a charge generating junction layer according to Example 1 of the present invention depending on the thicknesses of an n-type semiconductor layer.
Figure 7B:
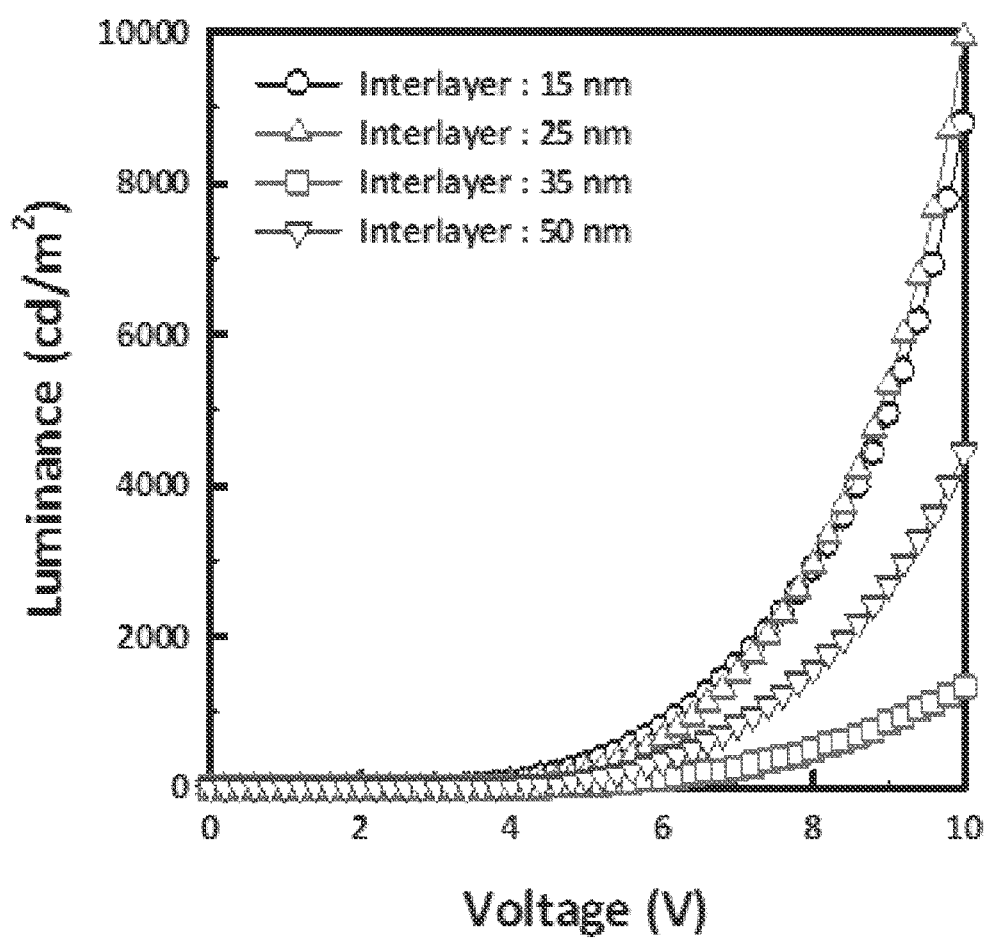
Figure 7C:
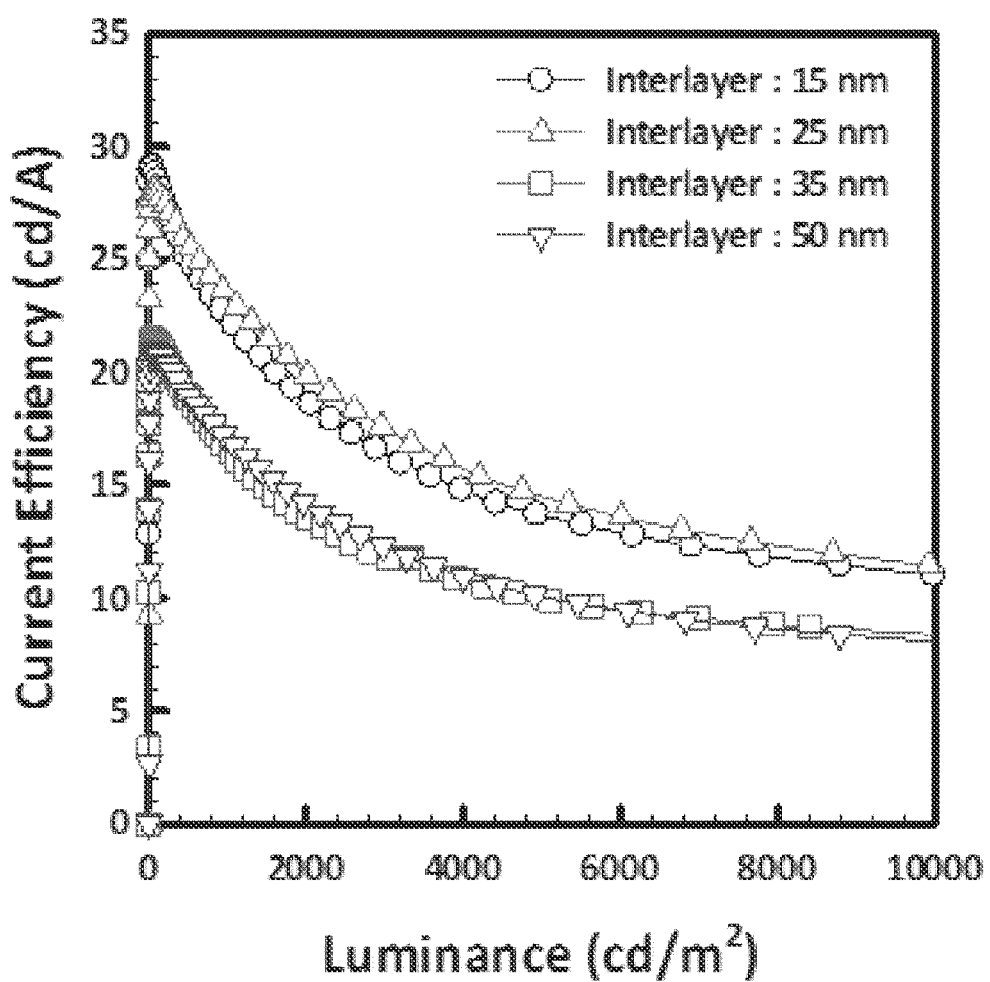
Figure 7D:
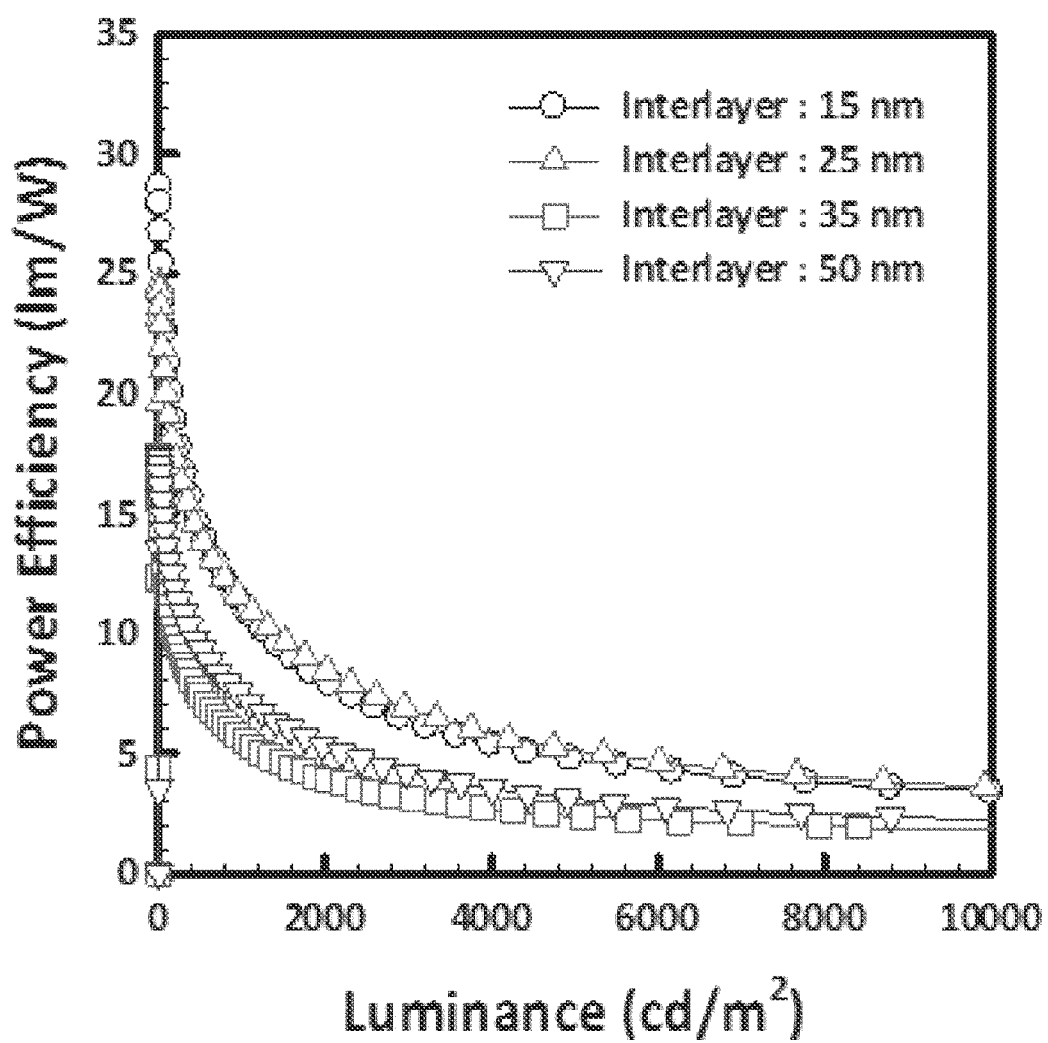

FIG. 7A shows current density-voltage characteristics, FIG. 7B shows luminance-voltage characteristics, FIG. 7C shows current efficiency-luminance characteristics, and FIG. 7D shows power efficiency-luminance characteristics.

In FIGS. 7A to 7D, a solution process-based LZO was used as an n-type semiconductor layer, and characteristics were measured depending on different thicknesses (15 nm, 25 nm, 35 nm, and 50 nm).

In Table 4, the detailed characteristics of FIGS. 7A to 7D are shown.

TABLE 4

| LZO thickness (nm) | VT (V) | VD (V) | C/Emax (cd/A) | P/Emax (lm/W) | @ 1,000 cd/m2 C/E (cd/A) | @ 1,000 cd/m2 P/E (lm/W) | @ 10,000 cd/m2 C/E (cd/A) | @ 10,000 cd/m2 P/E (lm/W) |
|---|---|---|---|---|---|---|---|---|
| 15 | 2.7 | 6.3 | 29.1 | 28.6 | 22.4 | 11.2 | 11.0 | 3.4 |
| 25 | 2.8 | 6.5 | 28.1 | 24.6 | 23.4 | 11.4 | 11.4 | 3.6 |
| 35 | 3.0 | 9.3 | 21.5 | 17.4 | 16.6 | 5.6 | 8.4 | 1.8 |
| 50 | 2.9 | 7.3 | 20.9 | 17.4 | 17.1 | 7.4 | 8.1 | 2.2 |

Referring to FIG. 7A to FIG. 7D and Table 4, it can be seen that, depending on the thicknesses of the n-type semiconductor layer, the current density-voltage characteristics, luminance-voltage characteristics, current efficiency-luminance characteristics, and power efficiency-luminance characteristics of the thin-film light-emitting device including a charge generating junction layer according to Example 1 of the present invention are adjusted, and the characteristics of a device (diode) are best improved when the thickness of LZO, which is an n-type semiconductor layer, is 15 nm.

FIGS. 8A to 8D show the characteristics of a thin-film light-emitting device including a charge generating junction layer according to Example 1 of the present invention depending on the thicknesses of an electron injection/transport layer formed on the upper portion of a solution process-based charge generating junction layer.

Figure 8A:
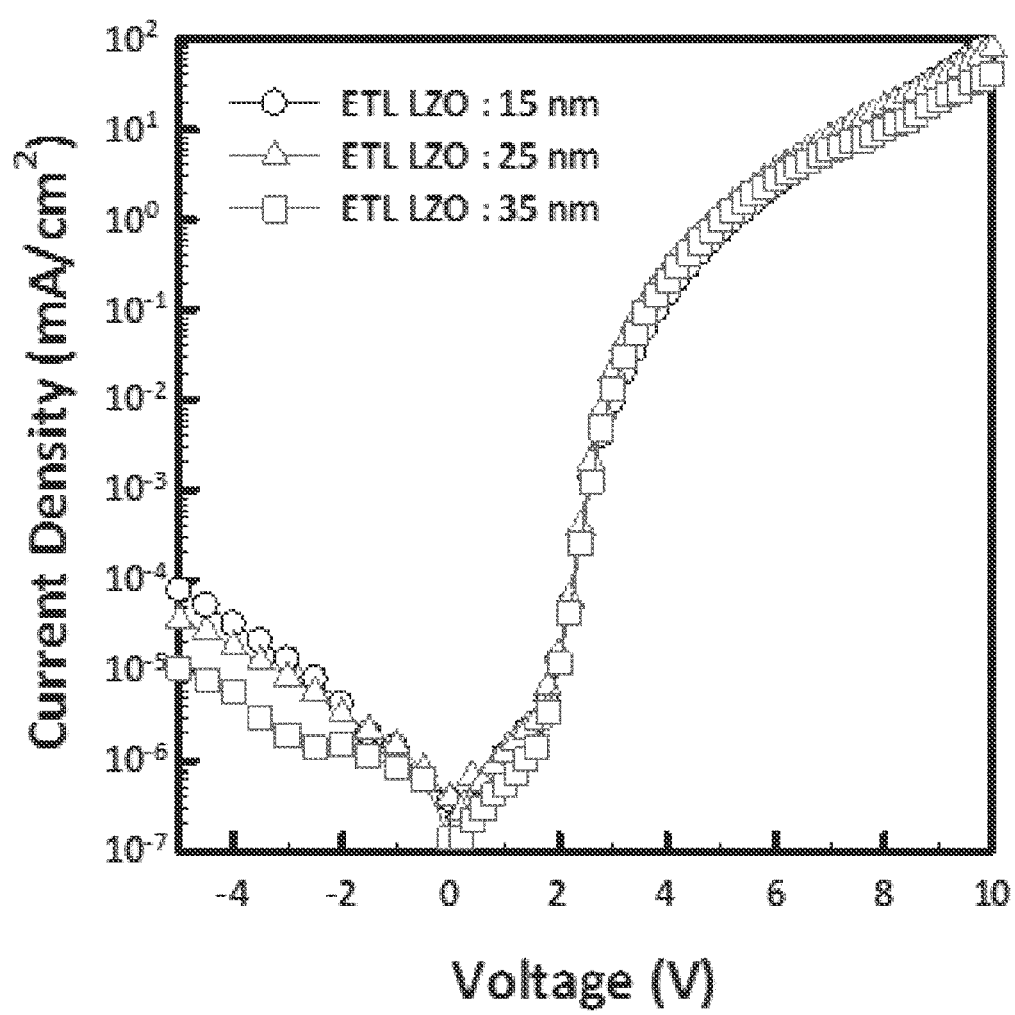
FIGS. 8A to 8D show the characteristics of a thin-film light-emitting device including a charge generating junction layer according to Example 1 of the present invention depending on the thicknesses of an electron injection/transport layer formed on the upper portion of a solution process-based charge generating junction layer.
Figure 8B:
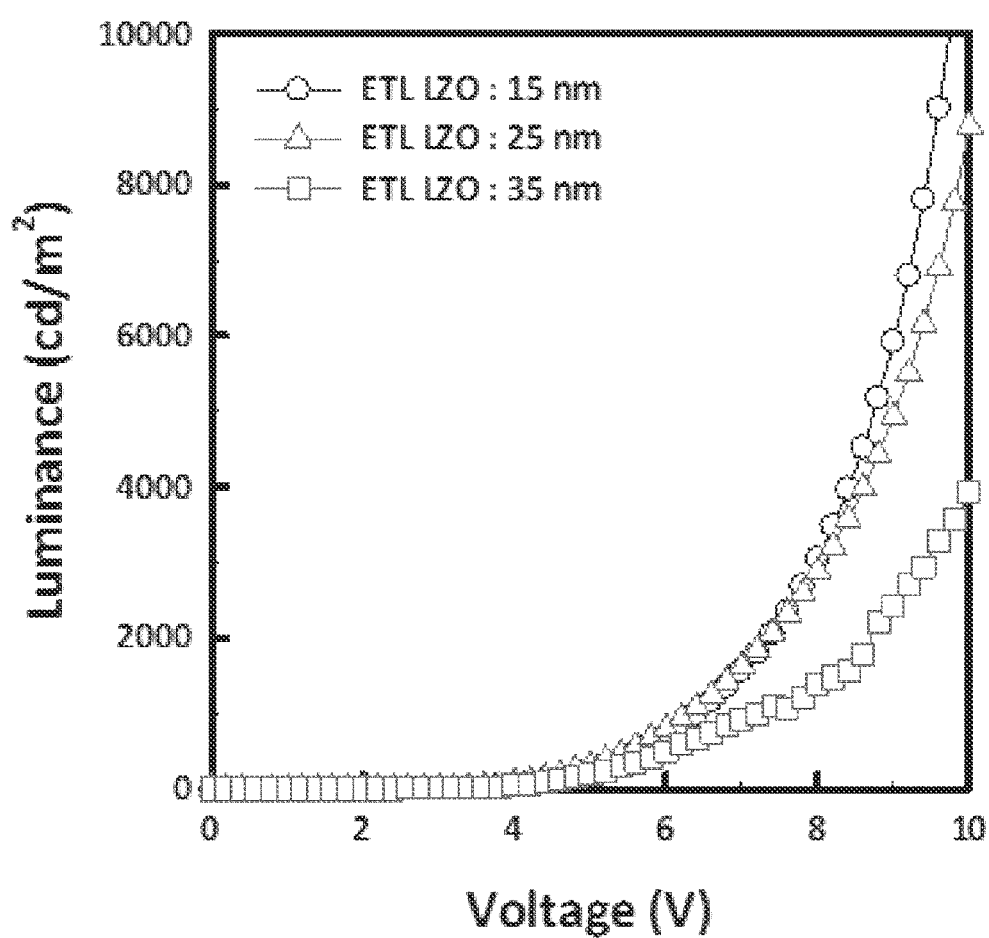
Figure 8C:
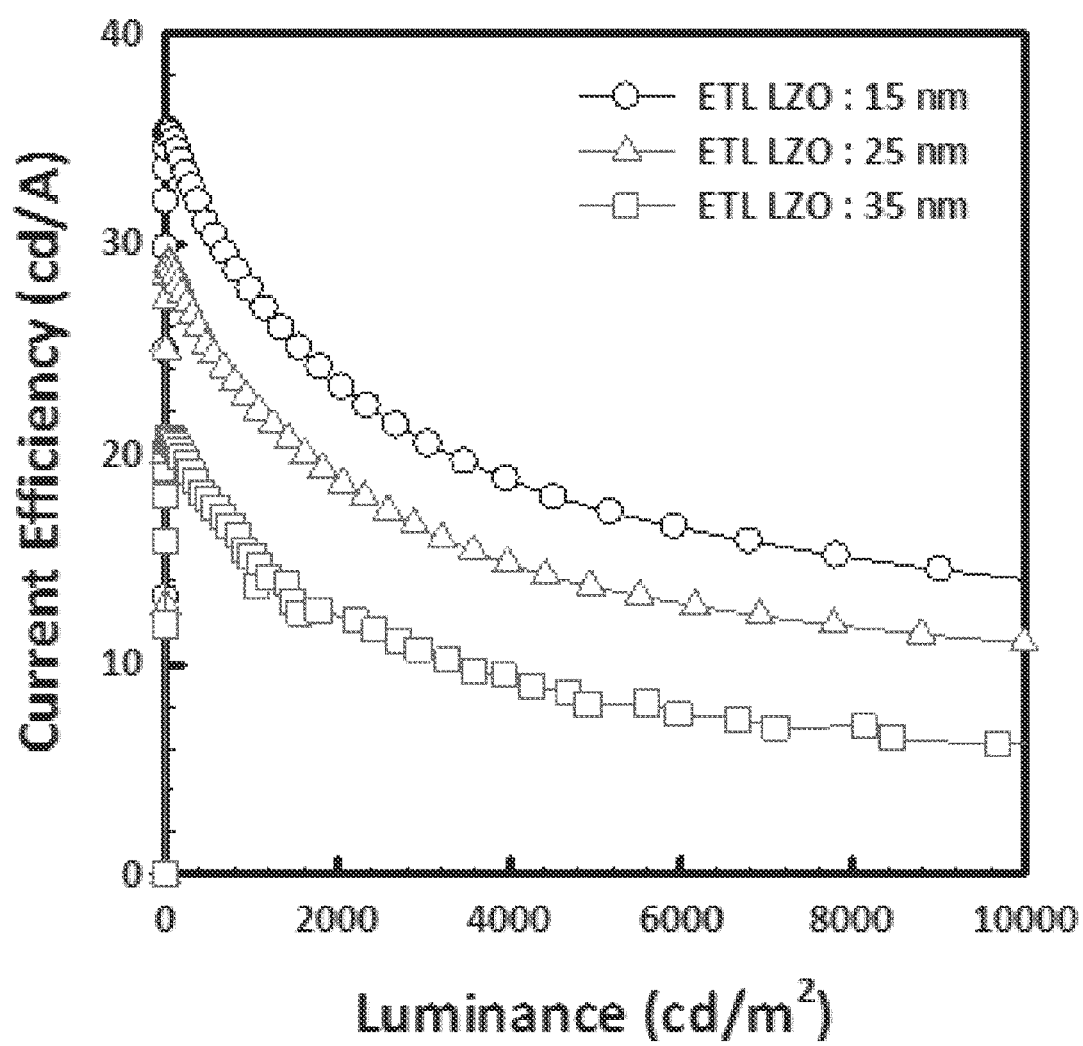
Figure 8D:
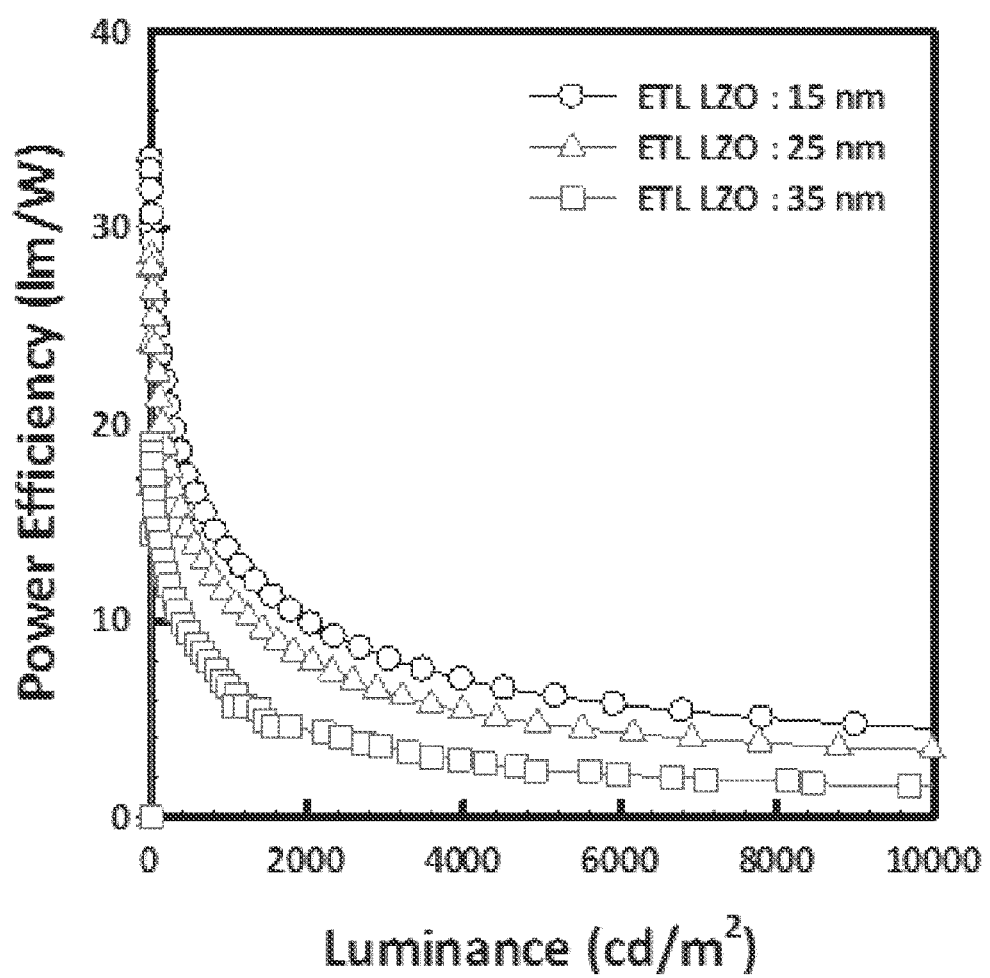

FIG. 8A shows current density-voltage characteristics, FIG. 8b shows luminance-voltage characteristics, FIG. 8C shows current efficiency-luminance characteristics, and FIG. 8D shows power efficiency-luminance characteristics.

In Table 5, the detailed characteristics of FIGS. 8A to 8D are shown.

TABLE 5

| Electron transport layer thickness (nm) | VT (V) | VD (V) | C/Emax (cd/A) | P/Emax (lm/W) | @ 1,000 cd/m2 | | @ 10,000 cd/m2 | |
|---|---|---|---|---|---|---|---|---|
| | | | | | C/E (cd/A) | P/E (lm/W) | C/E (cd/A) | P/E (lm/W) |
| 15 | 2.8 | 6.4 | 35.4 | 33.5 | 27.8 | 13.6 | 14.0 | 4.5 |
| 25 | 2.7 | 6.3 | 29.1 | 28.6 | 22.4 | 11.2 | 11.0 | 3.4 |
| 35 | 2.8 | 7.2 | 20.8 | 19.0 | 15.2 | 6.6 | 6.2 | 1.6 |

Referring to FIGS. 8A to 8D and Table 5, it can be seen that, depending on the thicknesses of the electron injection/transport layer, the current density-voltage characteristics, luminance-voltage characteristics, current efficiency-luminance characteristics, and power efficiency-luminance characteristics of the thin-film light-emitting device including a charge generating junction layer according to Example 1 of the present invention are adjusted, and the characteristics of a device (diode) is best improved when the thickness of the electron injection/transport layer is 15 nm.

Figure 9A:
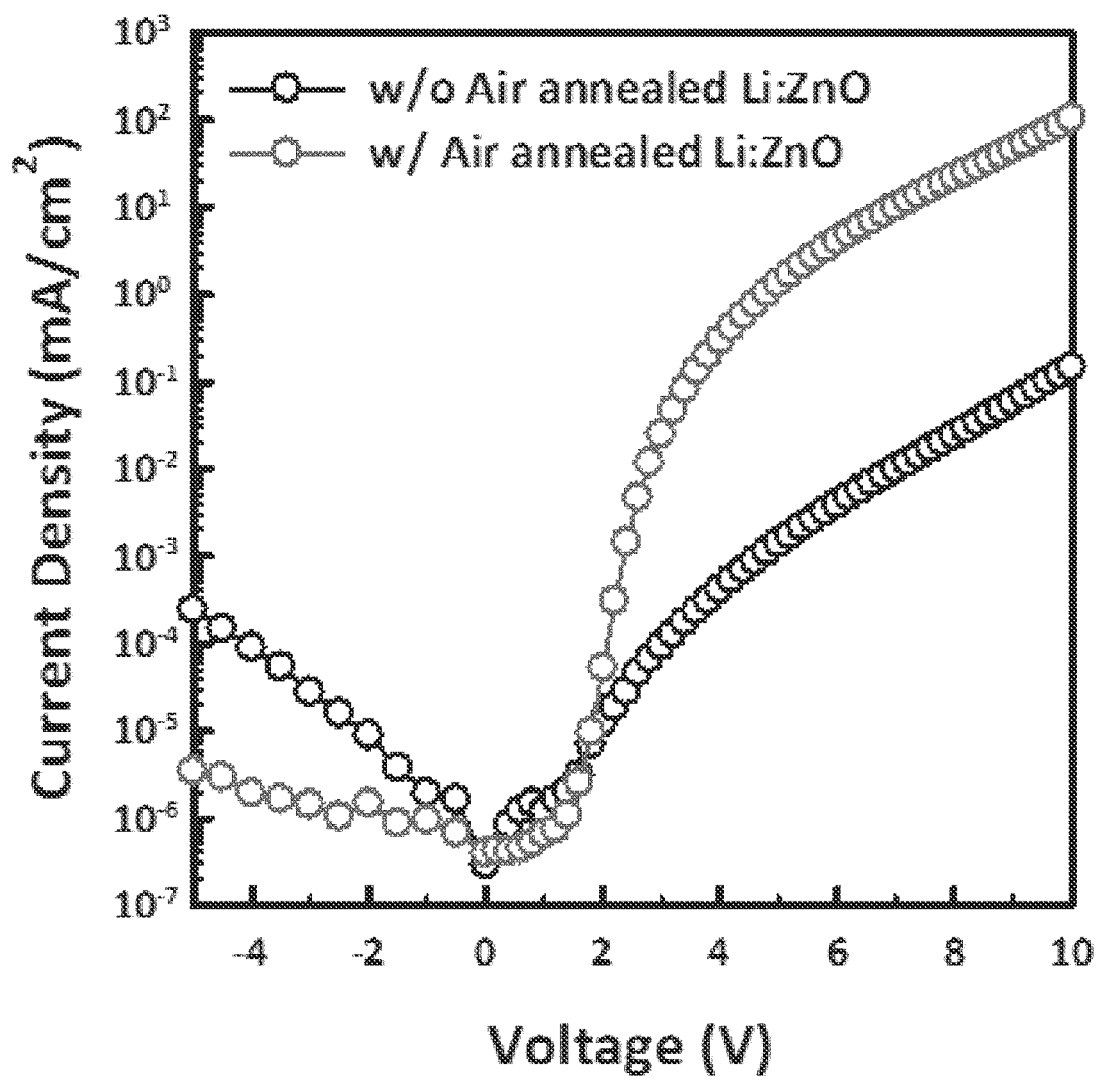
FIGS. 9A to 9C show the characteristics of a thin-film light-emitting device (w/o) that does not include an n-type semiconductor layer and the characteristics of a thin-film light-emitting device (w/) including a charge generating junction layer according to Example 1 of the present invention.
Figure 9B:
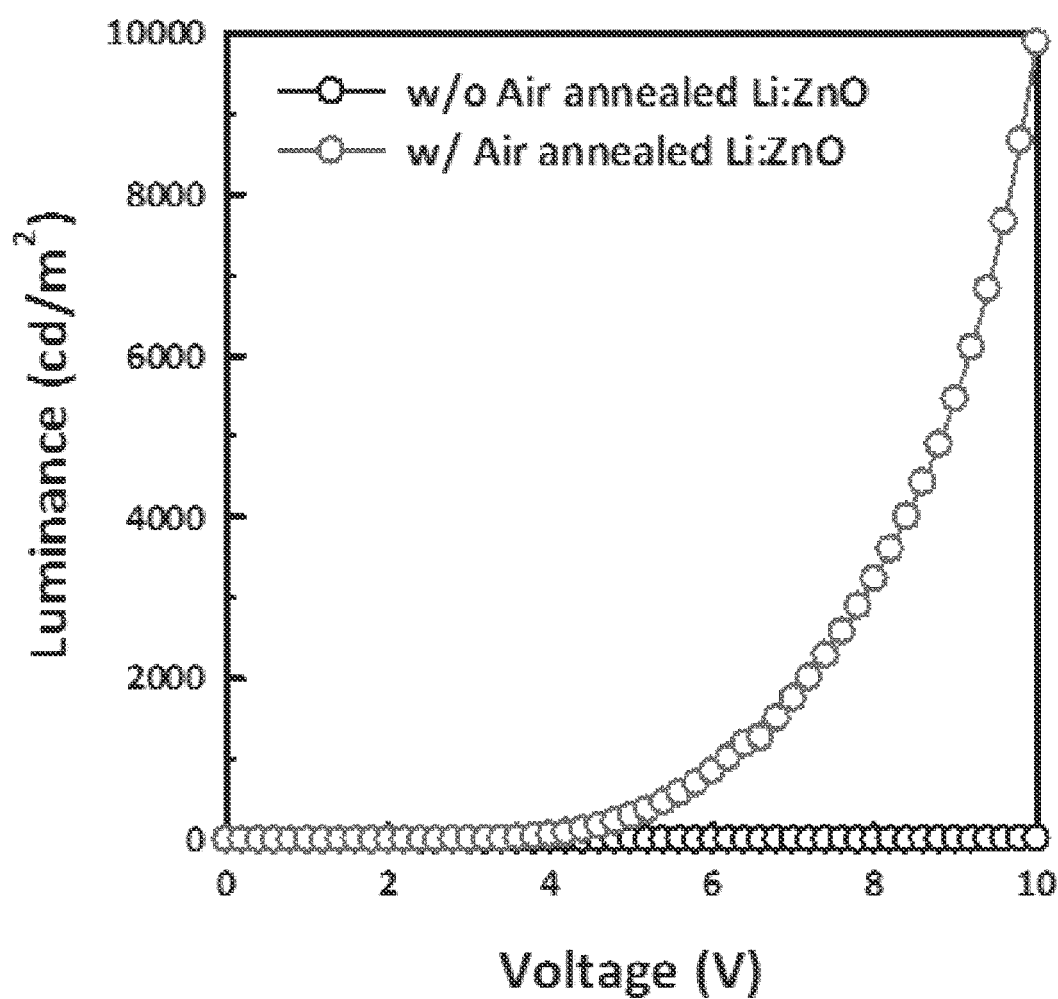
Figure 9C:
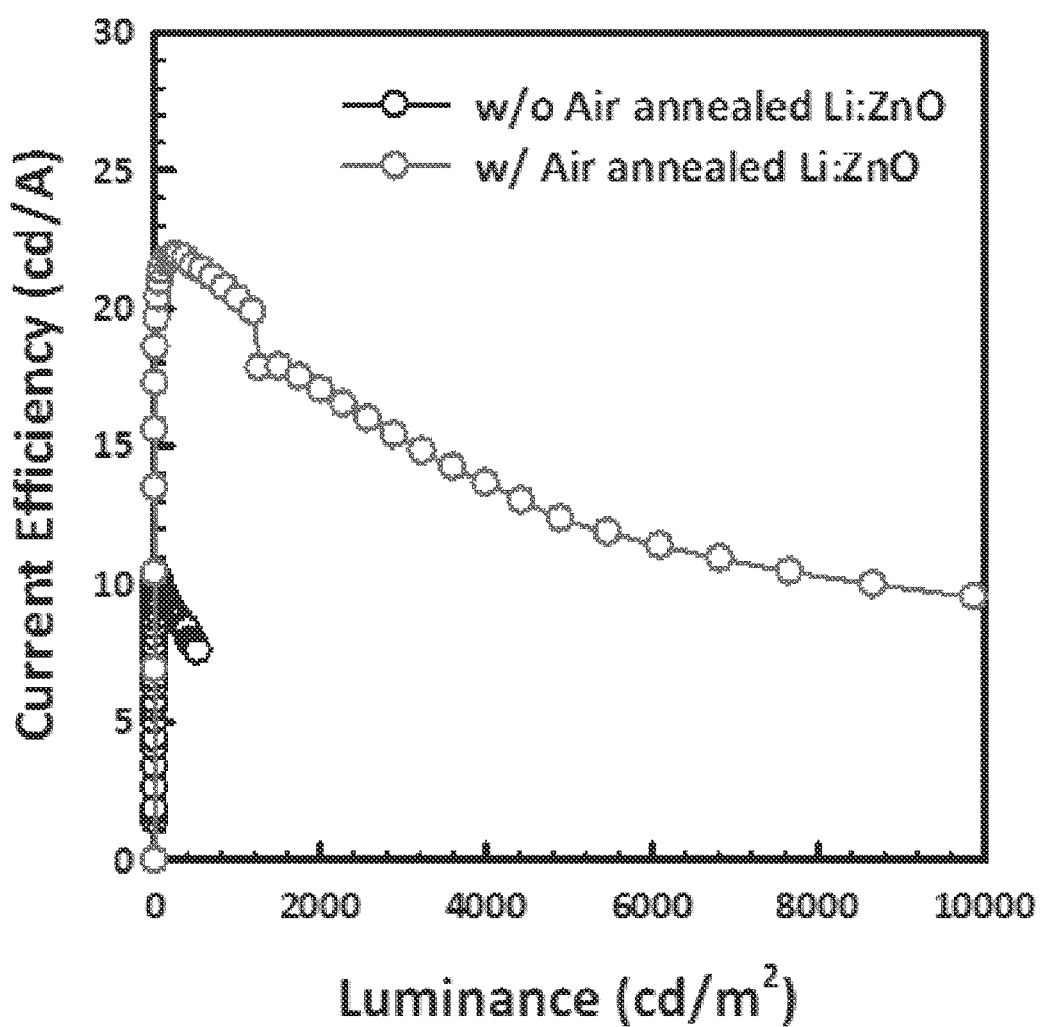

FIGS. 9A to 9C show the characteristics of a thin-film light-emitting device (w/o) that does not include an n-type semiconductor layer and the characteristics of a thin-film light-emitting device (w/) including a charge generating junction layer according to Example 1 of the present invention.

FIG. 9A shows current density-voltage characteristics, FIG. 9B shows luminance-voltage characteristics, FIG. 9C shows current efficiency-luminance characteristics.

In Table 6, the detailed characteristics of FIGS. 9A to 9C are shown.

TABLE 6

| N-type oxide semiconductor with/without LZO | VT (V) | VD (V) | C/Emax (cd/A) | P/Emax (lm/W) | @ 1,000 cd/m2 | | @ 10,000 cd/m2 | |
|---|---|---|---|---|---|---|---|---|
| | | | | | C/E (cd/A) | P/E (lm/W) | C/E (cd/A) | P/E (lm/W) |
| Absence | 7.4 | — | 10.4 | 3.3 | — | — | — | — |
| Presence | 2.7 | 6.2 | 21.9 | 17.2 | 20.4 | 10.3 | 9.5 | 3.0 |

Referring to FIGS. 9A to 9C and Table 6, it can be seen that, compared to the thin-film light-emitting device (w/o) that does not include an n-type semiconductor layer, the current density-voltage characteristics, luminance-voltage characteristics, current efficiency-luminance characteristics, and power efficiency-luminance characteristics of the thin-film light-emitting device (w/) including a charge generating junction layer according to Example 1 of the present invention are improved, and device characteristics are improved.

Figure 10:
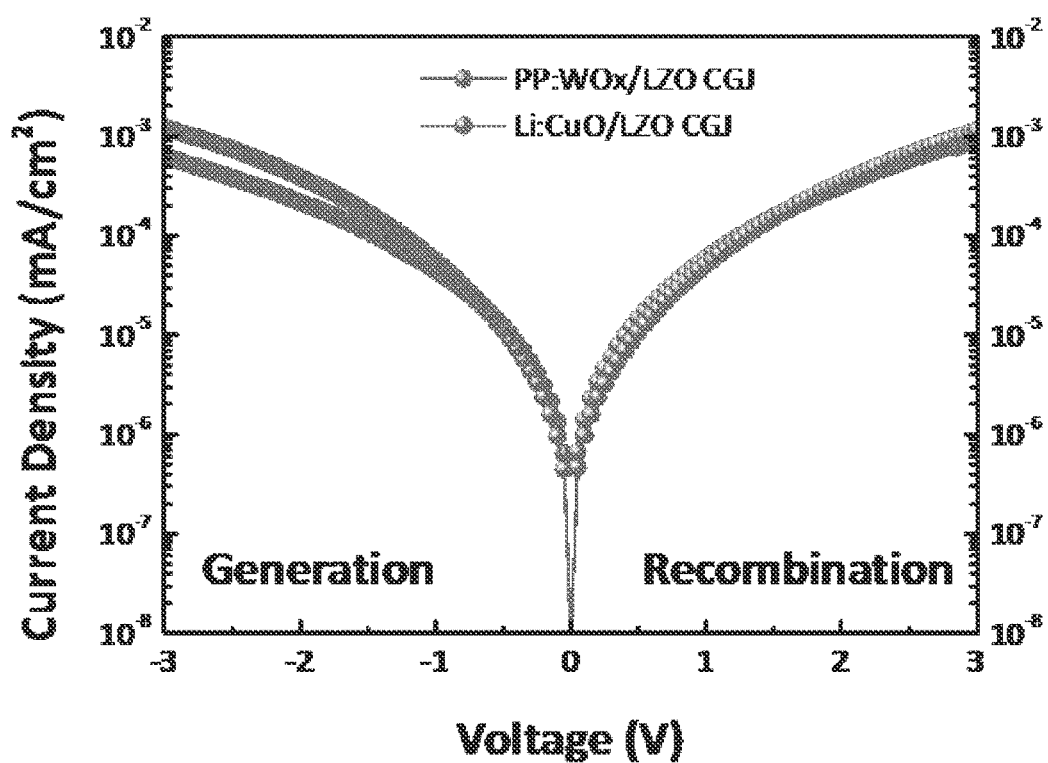
FIG. 10 is a graph showing the current-voltage characteristics of a thin-film light-emitting device (PP:WOx/LZO CGJ) including a charge generating junction layer consisting of a p-type semiconductor layer including an organic substance and an n-type semiconductor layer including an oxide semiconductor and the current-voltage characteristics of a thin-film light-emitting device (Li:CuO/LZO CGJ) including a charge generating junction layer according to Example 1 of the present invention.

FIG. 10 is a graph showing the current-voltage characteristics of a thin-film light-emitting device (PP:WOx/LZO CGJ) including a charge generating junction layer consisting of a p-type semiconductor layer including an organic substance and an n-type semiconductor layer including an oxide semiconductor and the current-voltage characteristics of a thin-film light-emitting device (Li:CuO/LZO CGJ) including a charge generating junction layer according to Example 1 of the present invention.

Referring to FIG. 10, compared to the thin-film light-emitting device including a charge generating junction layer consisting of a p-type semiconductor layer including an organic substance and an n-type semiconductor layer including an oxide semiconductor, the amount of current flowing through the thin-film light-emitting device including a charge generating junction layer according to Example 1 of the present invention is larger, indicating that the characteristics of a device are significantly improved.

Figure 11A:
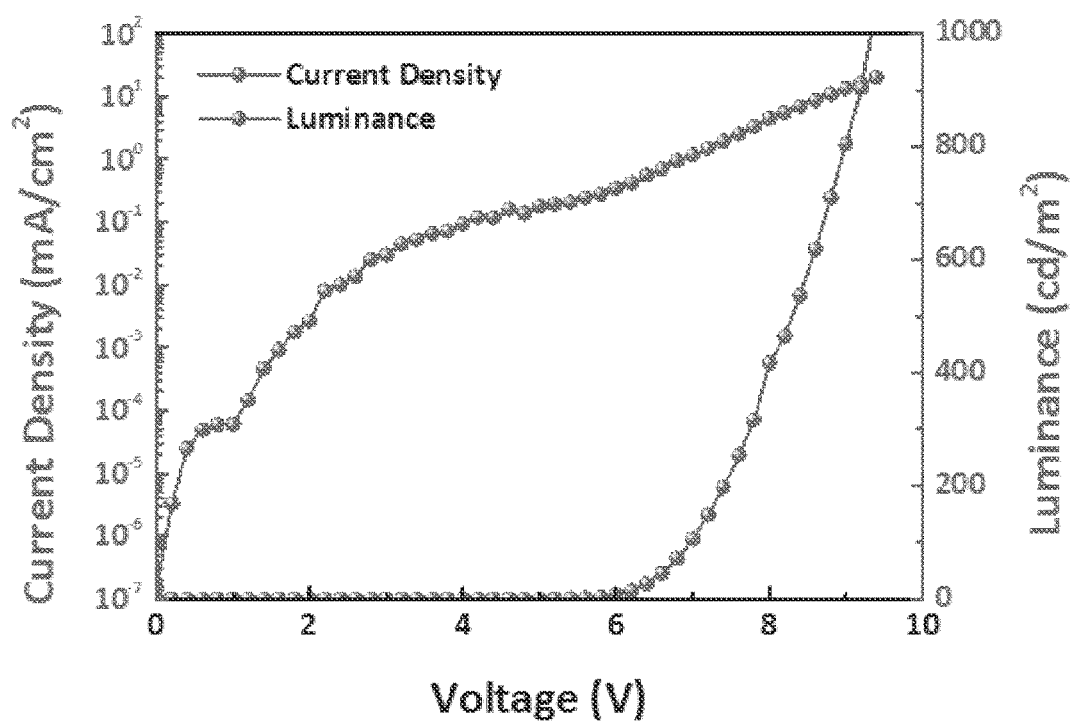
FIGS. 11A to 11C show the characteristics of a top-emitting thin-film light-emitting device (a thin-film light-emitting device including a charge generating junction layer according to another embodiment of the present invention).
Figure 11B:
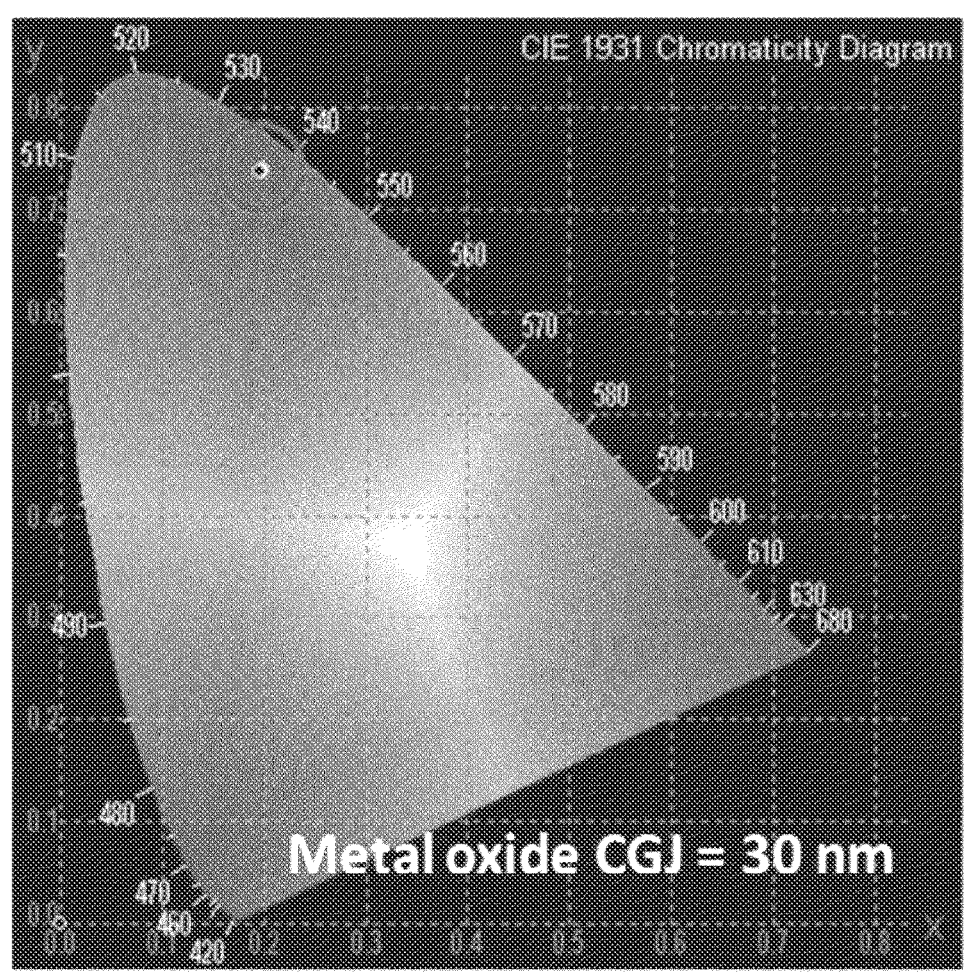
Figure 11C:
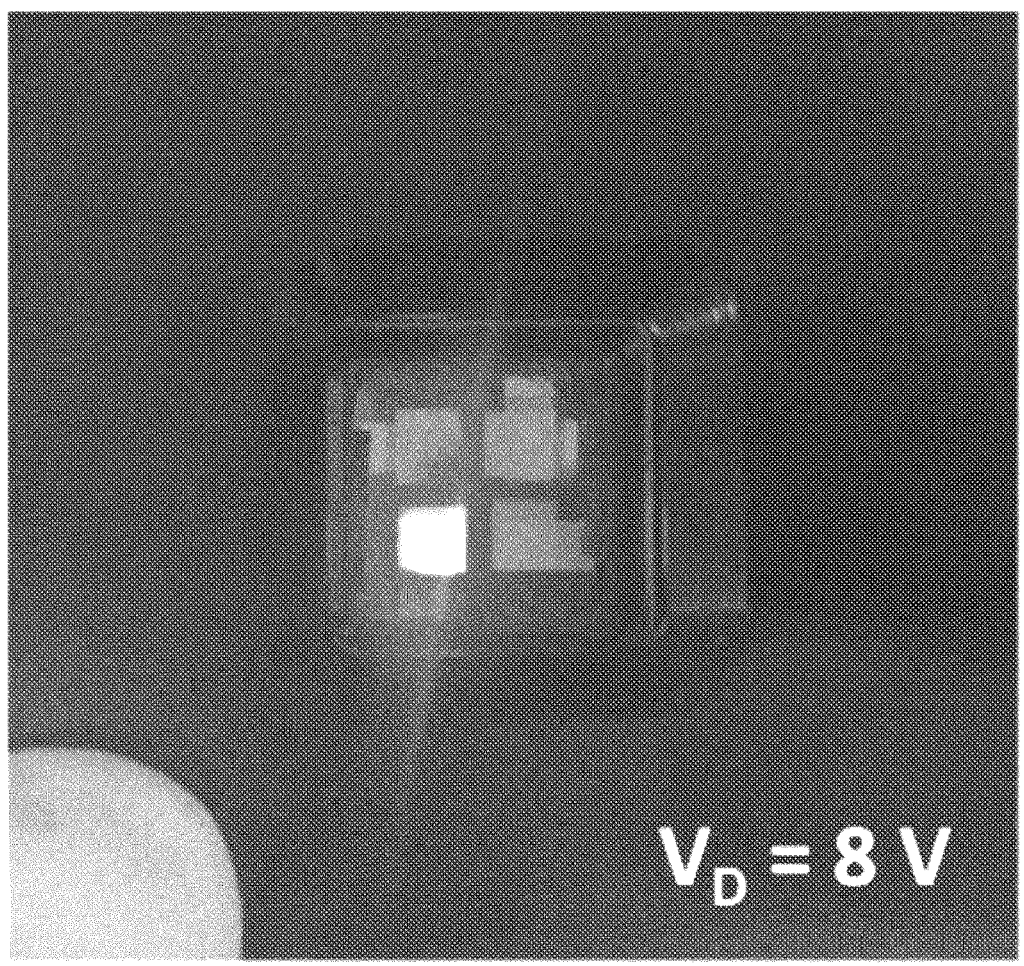

FIGS. 11A to 11C show the characteristics of a top-emitting thin-film light-emitting device (a thin-film light-emitting device including a charge generating junction layer according to another embodiment of the present invention).

FIG. 11A shows current density-voltage characteristics (Current Density) and luminance-voltage characteristics (Luminance), FIG. 11B show CIE color coordinates, and FIG. 9C shows the luminous image of a top-emitting thin-film light-emitting device.

Referring to FIGS. 11A to 11C, it can be seen that the current density and luminance of the top-emitting thin-film light-emitting device (a thin-film light-emitting device including a charge generating junction layer according to another embodiment of the present invention) are significantly improved.

FIGS. 12A to 12F show the ultraviolet photoelectron spectroscopy spectra of a thin-film light-emitting device including a charge generating junction layer according to Example 1 of the present invention.

Figure 12A:
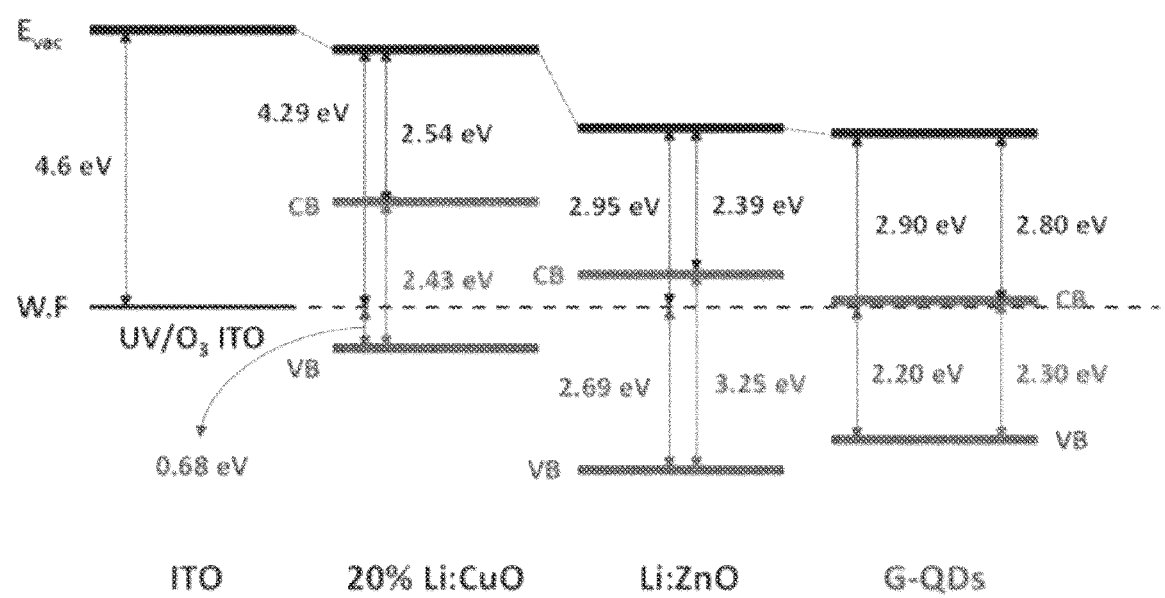
FIGS. 12A to 12F show the ultraviolet photoelectron spectroscopy spectra of a thin-film light-emitting device including a charge generating junction layer according to Example 1 of the present invention.
Figure 12B:
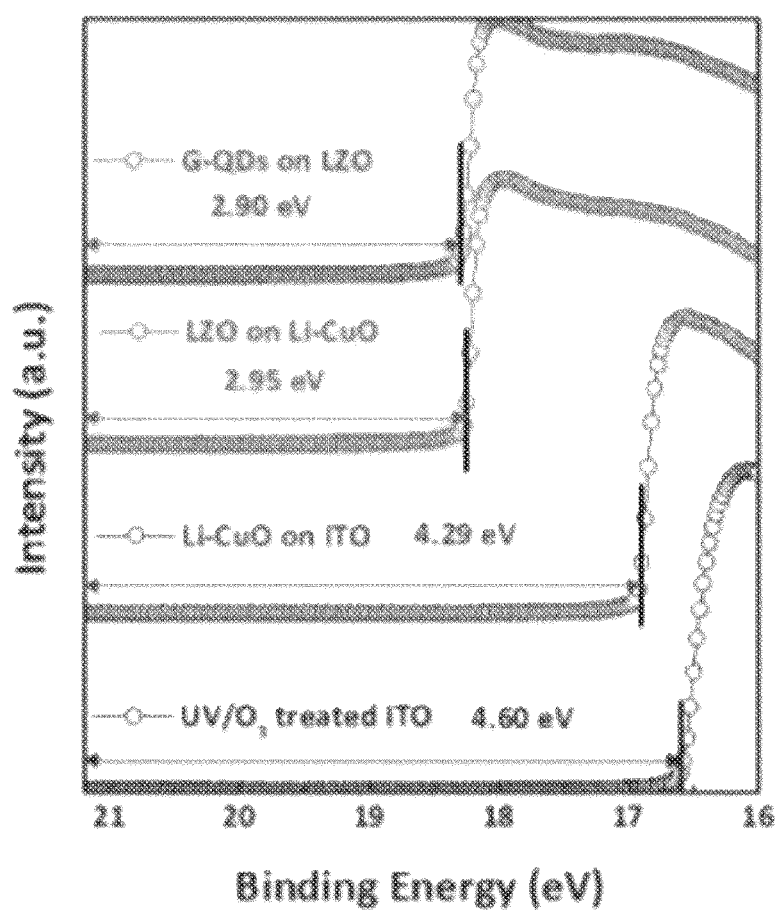
Figure 12C:
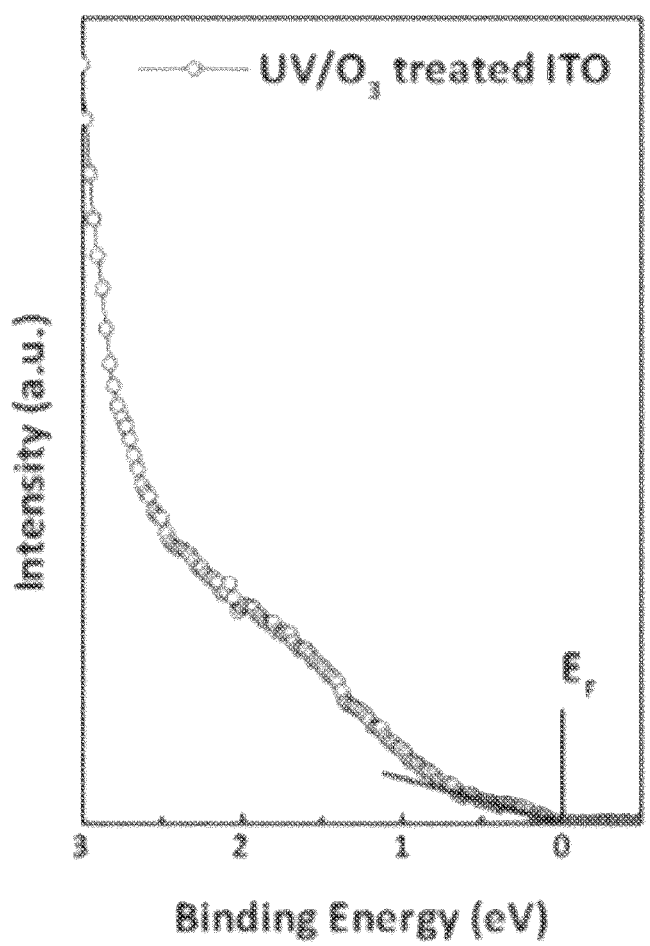
Figure 12D:
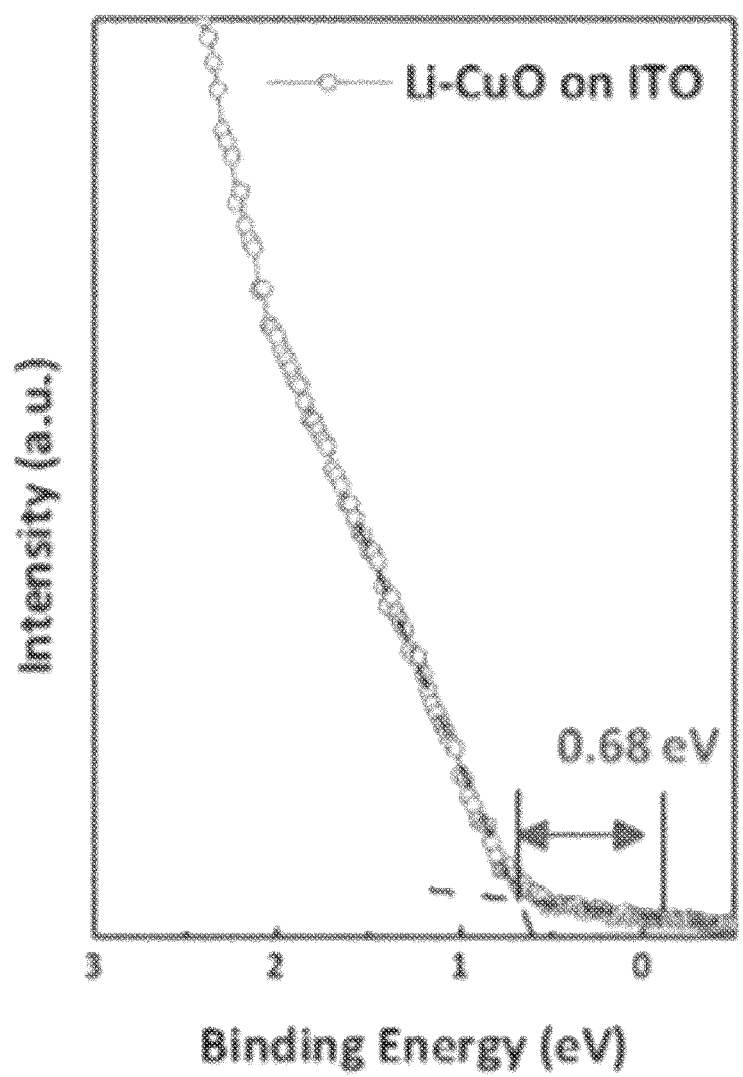
Figure 12E:
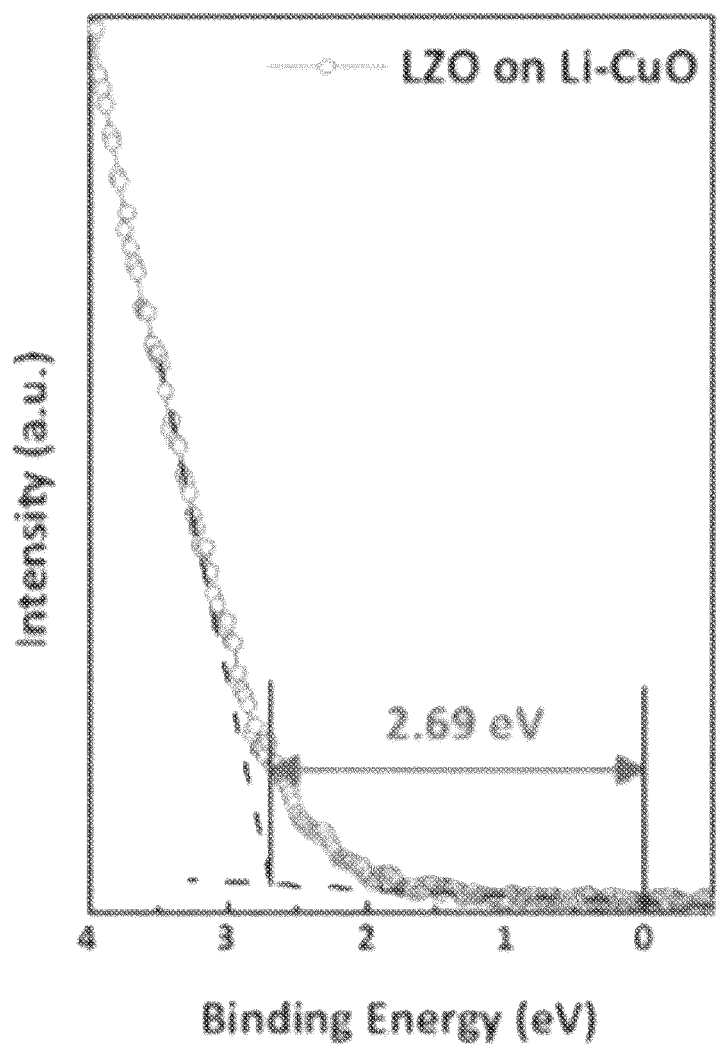
Figure 12F:
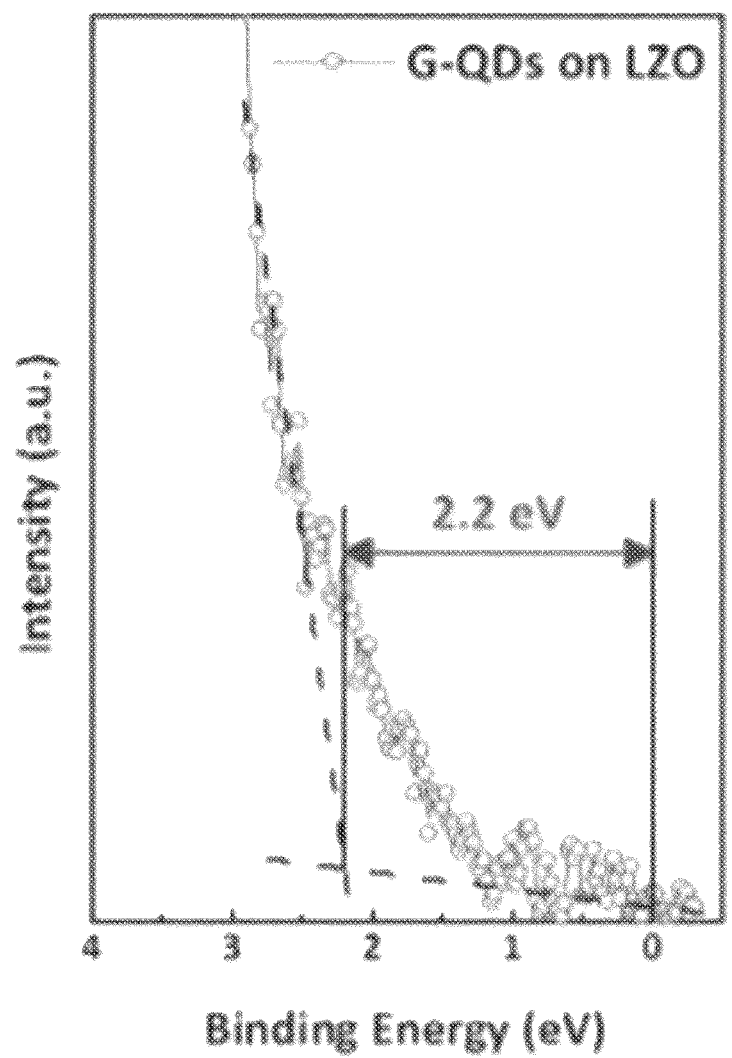

FIG. 12A shows the band diagram of the thin-film light-emitting device including a charge generating junction layer according to Example 1 of the present invention that includes a green quantum dot light-emitting layer, FIG. 12B shows secondary-electron cutoff regions, FIG. 12C shows the Fermi-edge regions of a UV/O$_3$-treated positive electrode, FIG. 12D shows the Fermi-edge regions of a UV/O$_3$-treated p-type semiconductor layer, FIG. 12E shows the Fermi-edge regions of a UV/O$_3$-treated n-type semiconductor layer, and FIG. 12F is the Fermi-edge regions of a UV/O$_3$-treated green quantum dot light-emitting layer.

In FIGS. 12A to 12F, the work functions of the positive electrode, the p-type semiconductor layer, the n-type semiconductor layer, and the green quantum dot light-emitting layer are calculated to be 4.60 eV, 4.29 eV, 2.95 eV, and 2.90 eV from secondary-electron cutoff regions, respectively.

Referring to FIGS. 12A to 12F, it can be seen that energy levels change as each layer is laminated.

FIGS. 13A to 13D show the characteristics of a thin-film light-emitting device including an NPD/HAT-CN junction as a charge generating junction layer and the characteristics of a thin-film light-emitting device including a charge generating junction layer (Li:CuO/LiZnO) according to Example 1 of the present invention.

Figure 13A:
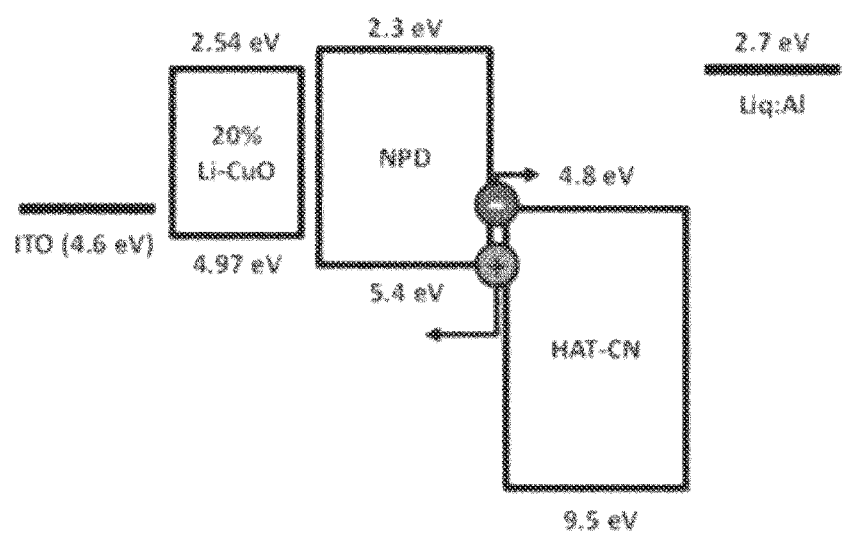
FIGS. 13A to 13D show the characteristics of a thin-film light-emitting device including an NPD/HAT-CN junction as a charge generating junction layer and the characteristics of a thin-film light-emitting device including a charge generating junction layer (Li:CuO/LiZnO) according to Example 1 of the present invention.
Figure 13B:
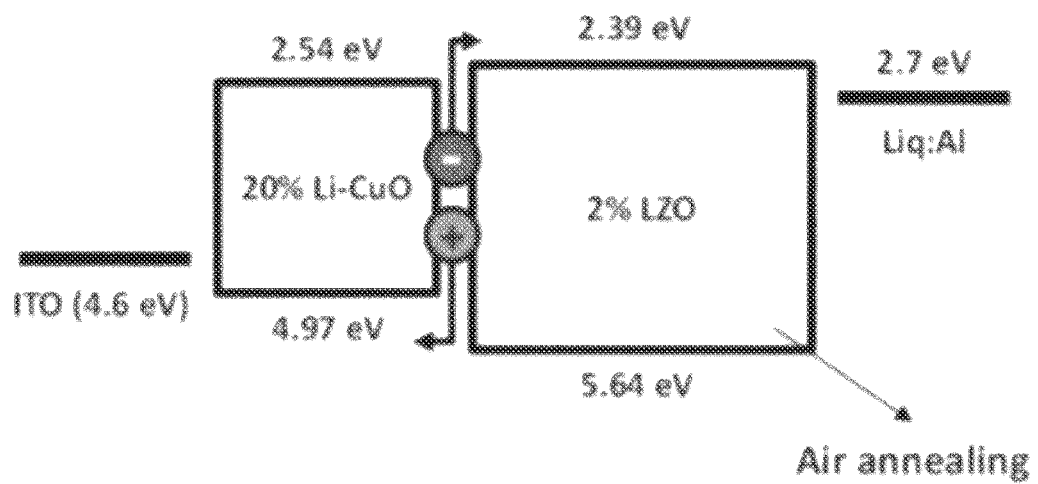
Figure 13C:
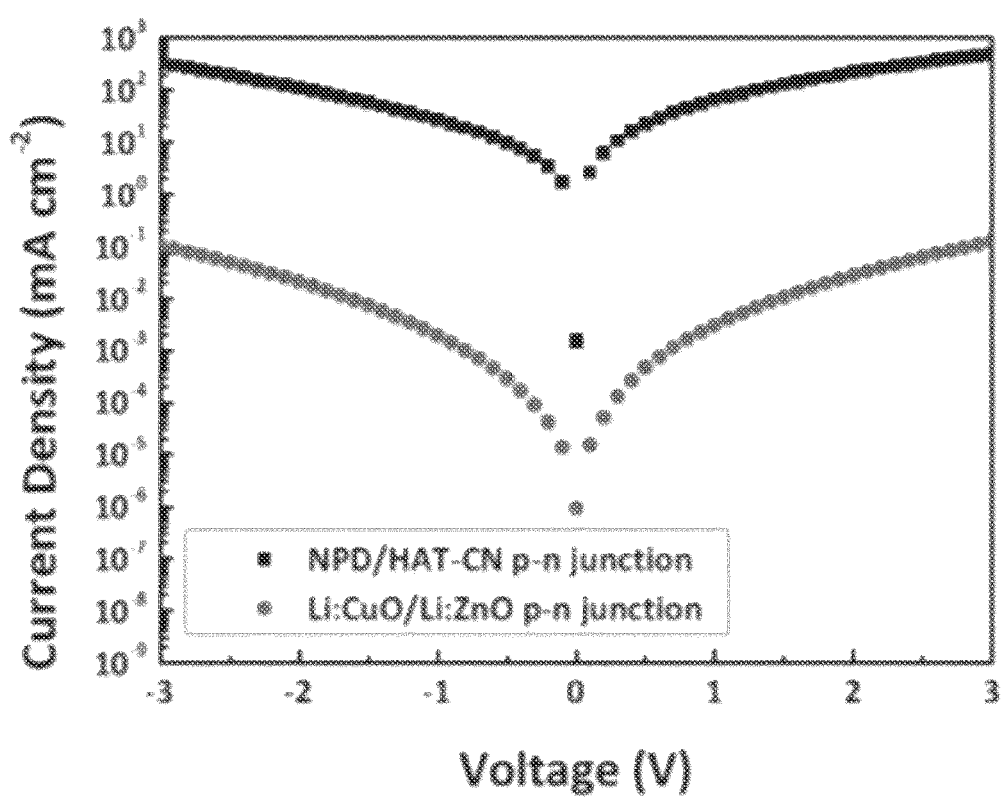
Figure 13D:
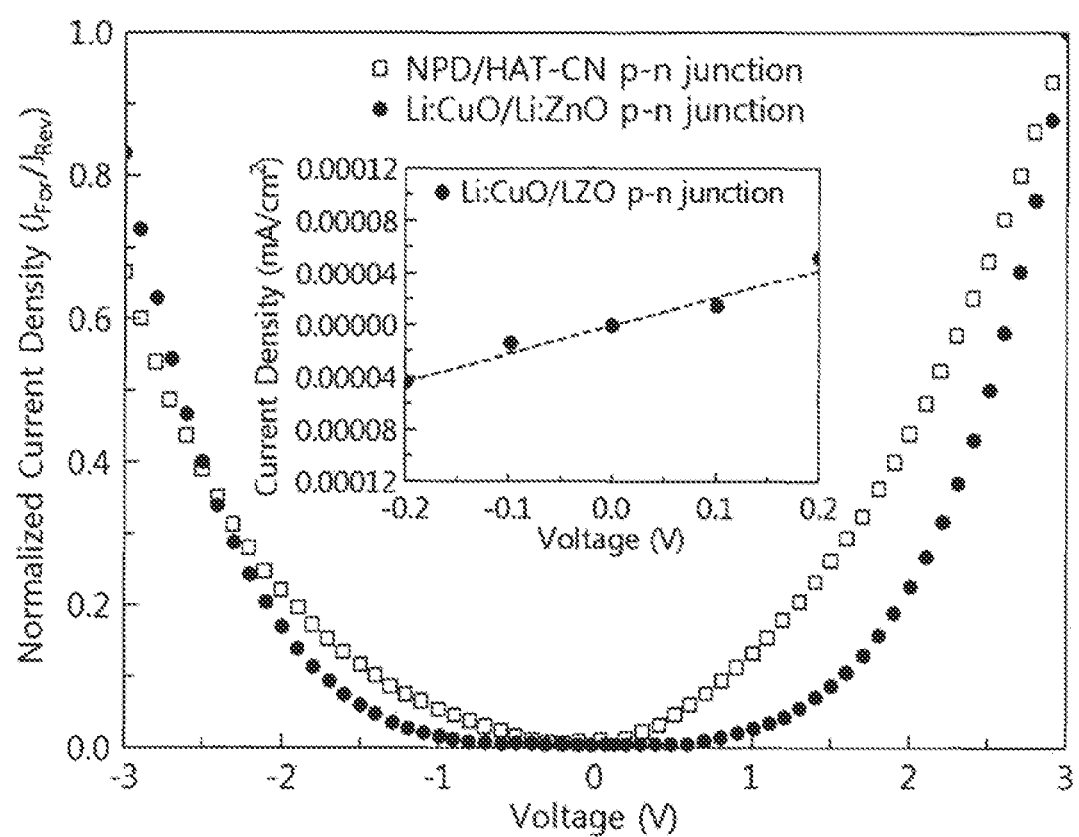

FIG. 13A shows the band diagram of the thin-film light-emitting device including an NPD/HAT-CN junction as a charge generating junction layer, FIG. 13B shows the band diagram of the thin-film light-emitting device including a charge generating junction layer according to Example 1 of the present invention, FIG. 13C shows current density-voltage characteristics, and FIG. 13D shows relative charge generation efficiency.

The relative charge generation efficiency may be calculated by Equation 1 below.

$$\text{Relative } CGE\ (\%) = \frac{\text{Abs(Reverse } J) \text{ at } V = -3\ V}{\text{Abs(Forward } J) \text{ at } V = +3\ V} \times 100(\%). \quad \text{[Equation 1]}$$

The relative charge generation efficiency of the thin-film light-emitting device including an NPD/HAT-CN junction as a charge generating junction layer is 67% at −3 V, and the relative charge generation efficiency of the thin-film light-emitting device including a charge generating junction layer according to Example 1 of the present invention is 83% at −3 V, indicating that relative charge generation efficiency is significantly improved.

In addition, referring to FIGS. 13A to 13D, in the case of the thin-film light-emitting device including a charge generating junction layer according to Example 1 of the present invention, air annealing of the n-type semiconductor layer reduces oxygen vacancies in a metal oxide, thereby improving the electrical and optical characteristics of a device.

FIGS. 14A to 14G show X-ray photoelectron spectroscopy (XPS) profiles depending on the depth of a charge generating junction layer.

Figure 14A:
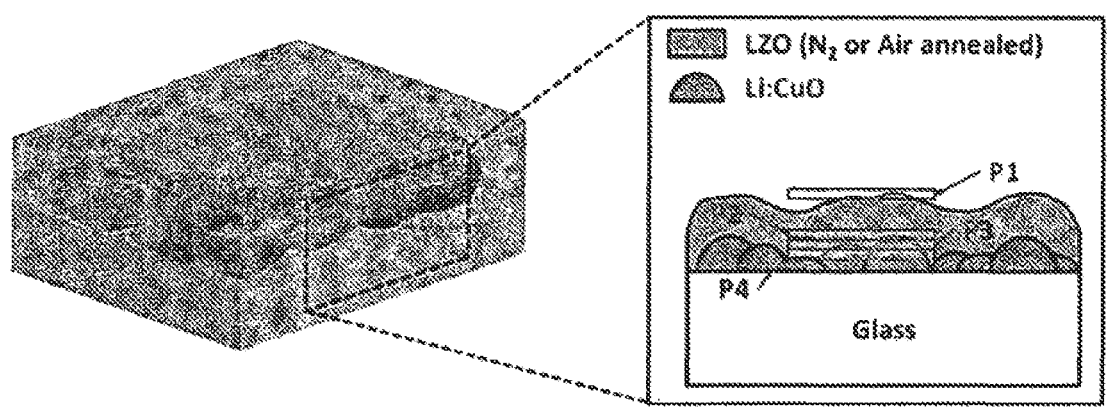
FIGS. 14A to 14G show X-ray photoelectron spectroscopy (XPS) profiles depending on the depth of a charge generating junction layer.
Figure 14B:
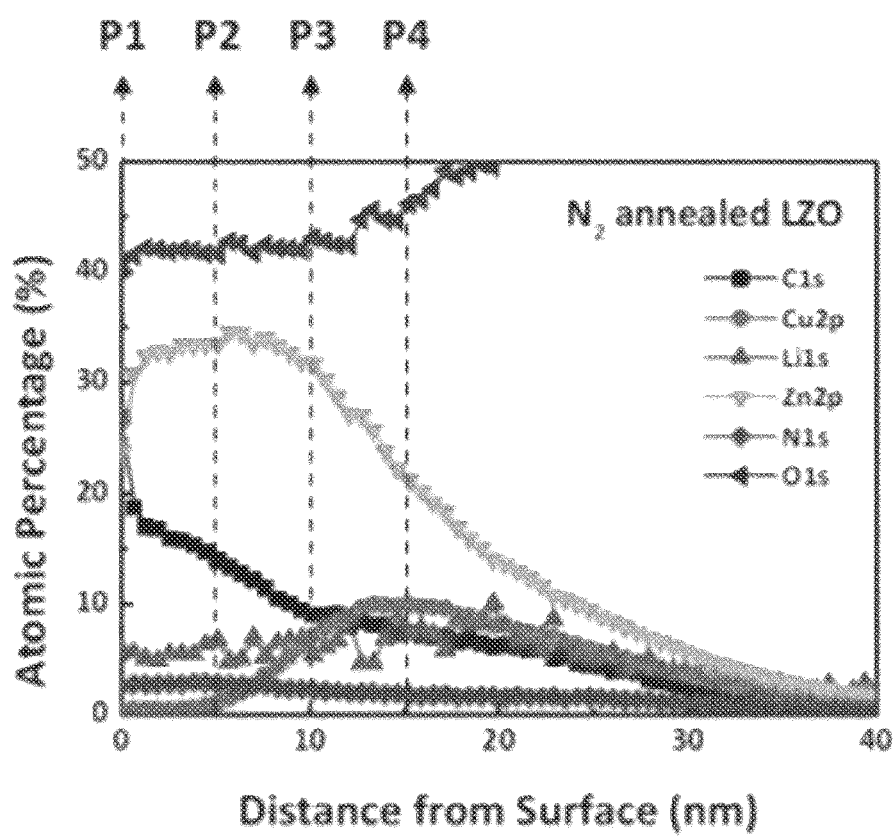
Figure 14C:
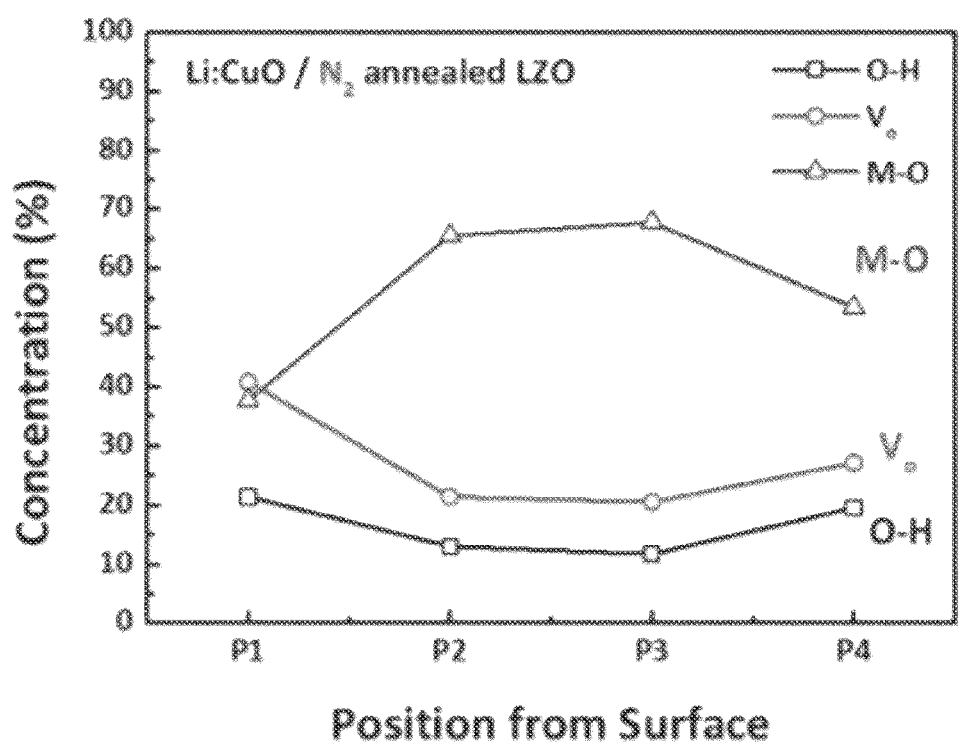
Figure 14D:
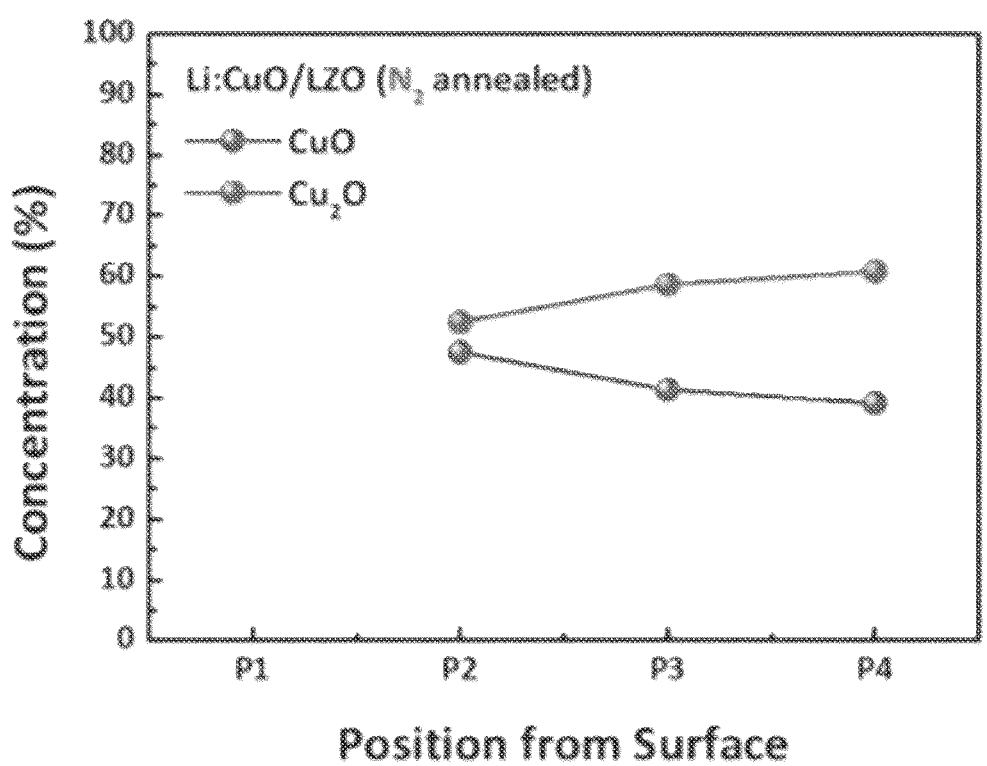
Figure 14E:
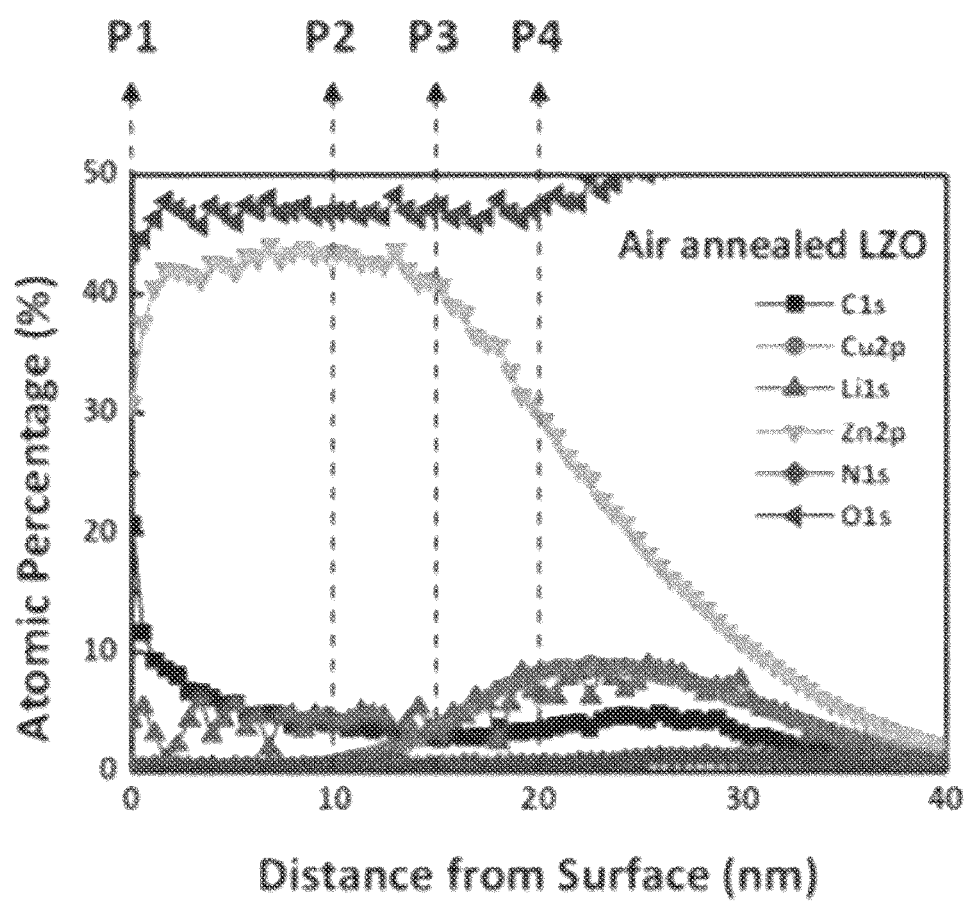
Figure 14F:
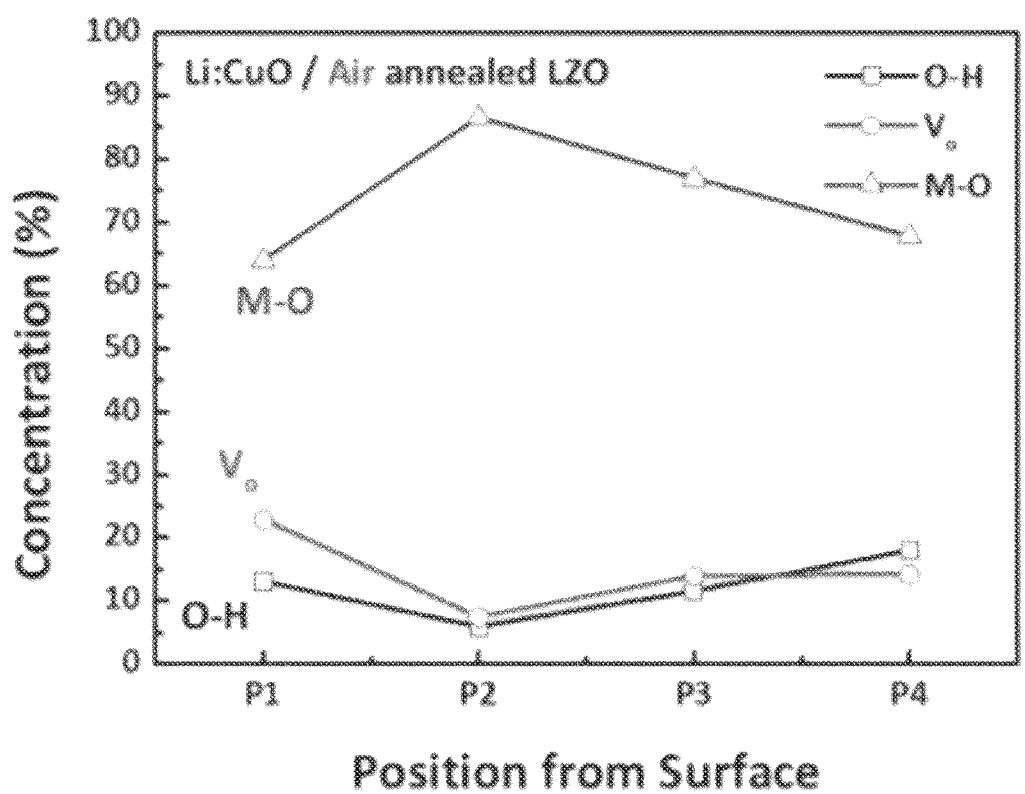
Figure 14G:
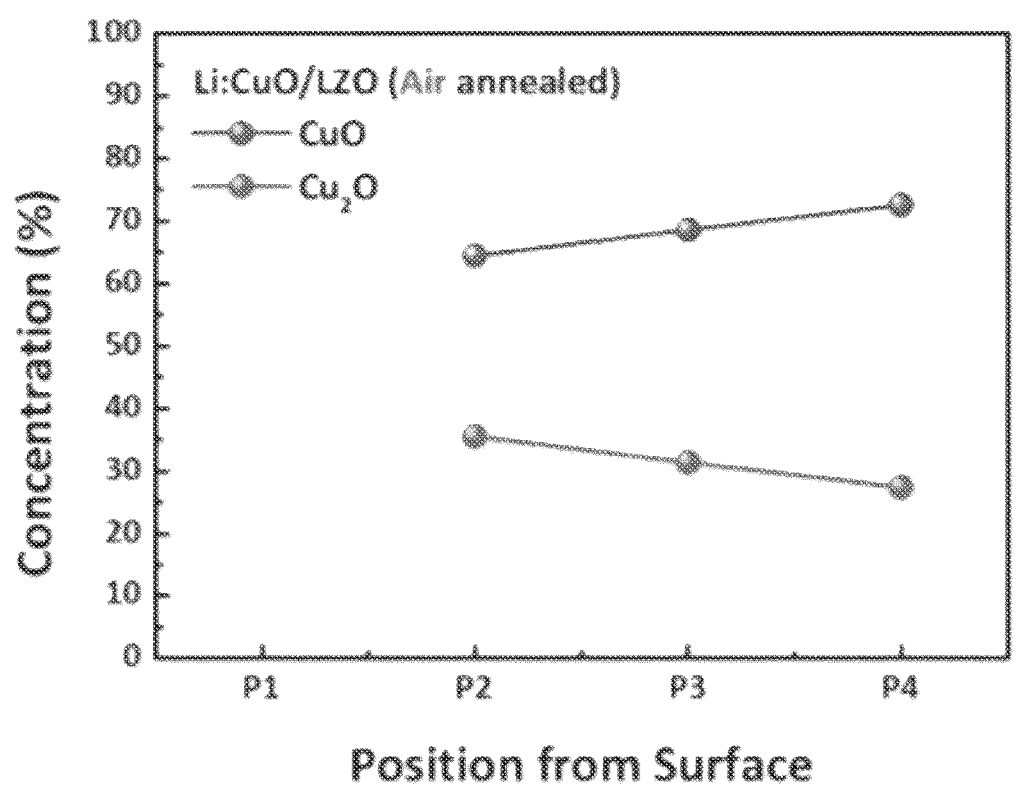

FIG. 14A shows the measurement points (P1, P2, P3, and P4) of the charge generating junction layer of the thin-film light-emitting device including a charge generating junction layer according to Example 1 of the present invention, FIGS. 14B to 14D show the depth profiles of elements constituting a charge generating junction layer when annealing is performed under a nitrogen (N$_2$) atmosphere, and FIGS. 14E to 14G show the depth profiles of elements constituting a charge generating junction layer when annealing is performed under an air atmosphere.

In X-ray photoelectron spectroscopy, when annealing is performed under an air or nitrogen atmosphere at the measurement points (P1, P2, P3, and P4) of the charge generating junction layer, the concentration of oxygen vacancies and the concentration of oxygen-hydrogen (O—H) may be confirmed.

Referring to FIGS. 14A to 14G, it can be seen that, when annealing is performed under an air or nitrogen atmosphere, oxygen vacancies induce charge trapping, and the concentrations of oxygen vacancies at P1 to P3 (the interface between n-type and p-type semiconductor layers) and the concentration of oxygen-hydrogen (O—H) gradually decrease, and the concentration of M-O increases.

Since the concentration of M-O contributes to charge generation, when annealing is performed under an air or nitrogen atmosphere, the efficiency of the charge generating junction layer may further improved.

In addition, it can be seen that, when annealing is performed under an air or nitrogen atmosphere, the surface roughness of the p-type semiconductor layer is reduced.

Figure 15:
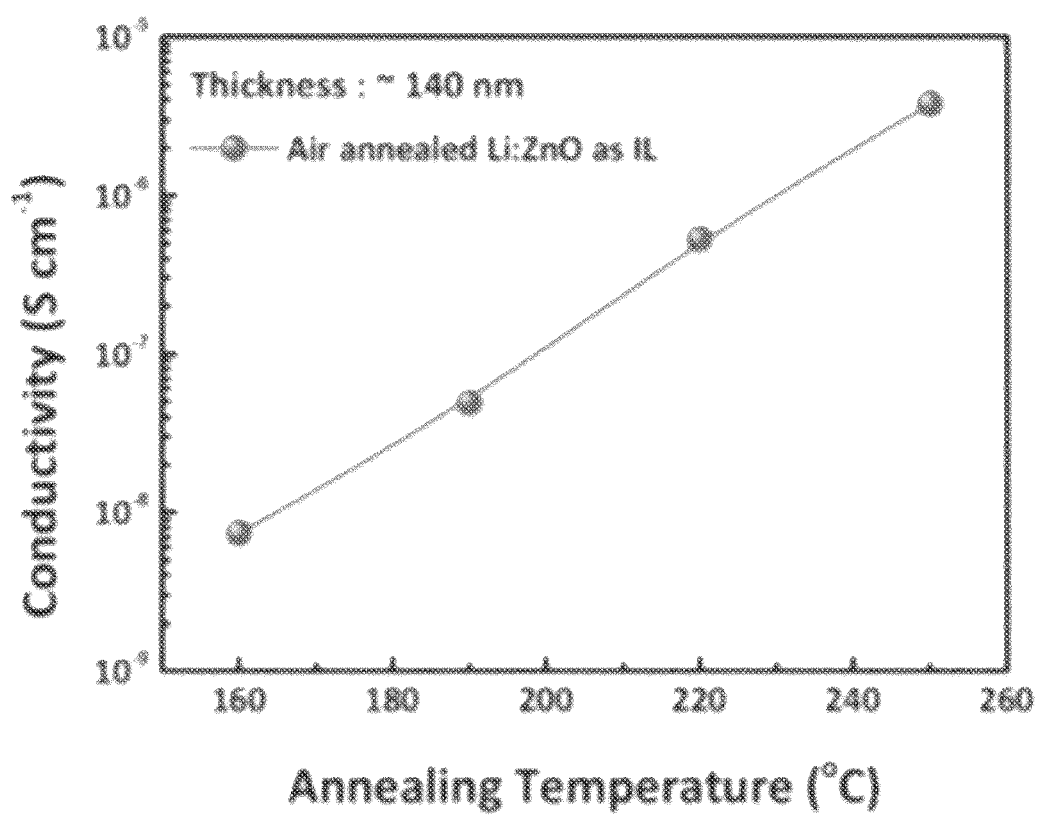
FIG. 15 is a graph showing the electric conductivity of an air-annealed n-type semiconductor layer.

FIG. 15 is a graph showing the electric conductivity of an air-annealed n-type semiconductor layer.

Measurement is performed on electron-only-devices (EODs) including a Li:ZnO layer having a thickness of 150 nm.

Referring to FIG. 15, it can be seen that Li:ZnO annealed at 250° C. exhibits 500 time higher electrical conductivity than Li:ZnO annealed at 160° C.

Figure 16:
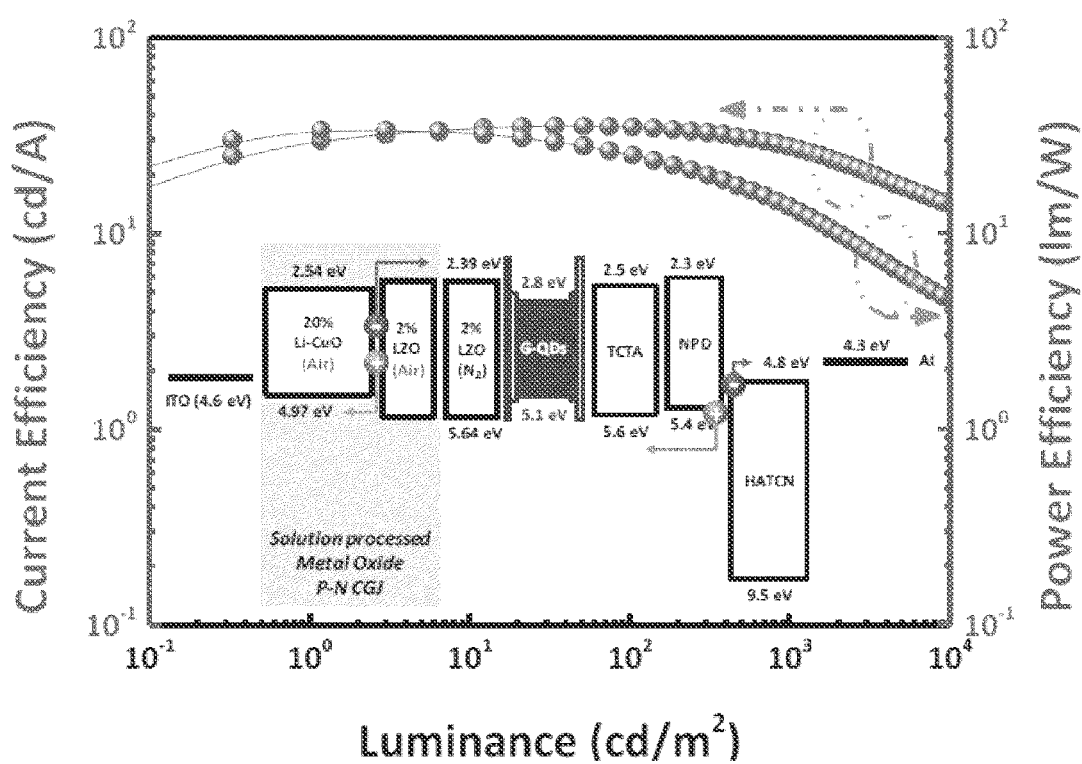
FIG. 16 shows the current efficiency-luminance characteristics and power efficiency-luminance characteristics of a thin-film light-emitting device including a charge generating junction layer according to Example 1 of the present invention.

FIG. 16 shows the current efficiency-luminance characteristics and power efficiency-luminance characteristics of a thin-film light-emitting device including a charge generating junction layer according to Example 1 of the present invention.

Referring to FIG. 16, it can be seen that, in terms of luminance, the current efficiency and power efficiency of the thin-film light-emitting device including a charge generating junction layer according to Example 1 of the present invention are improved.

Although the present invention has been described through limited examples and figures, the present invention is not intended to be limited to the examples. Those skilled in the art will appreciate that various modifications, additions, and substitutions are possible, without departing from the scope and spirit of the invention.

Therefore, the scope of the present invention should not be limited by the embodiments, but should be determined by the following claims and equivalents to the following claims.

What is claimed is:

1. A method of fabricating a thin-film light-emitting device, comprising:
   a step of forming a negative electrode on a substrate;
   a step of forming at least one light-emitting unit on the negative electrode; and
   a step of forming a positive electrode on the light-emitting unit,
   wherein the step of forming the light-emitting unit comprises a step of forming a charge generating junction layer on the negative electrode;
   a step of forming an electron injection/transport layer on the charge generating junction layer;
   a step of forming a thin-film light-emitting layer on the electron injection/transport layer; and
   a step of forming a hole injection/transport layer on the thin-film light-emitting layer,
   wherein the charge generating junction layer has a layer-by-layer structure in which a p-type semiconductor layer and an n-type semiconductor layer are formed, and a concentration of oxygen vacancies at an interface between the p-type and n-type semiconductor layers is adjusted by annealing the n-type semiconductor layer, wherein the annealing treatment increases a proportion of the p-type semiconductor layer at the interface between the p-type and n-type semiconductor layers.

2. The method according to claim 1, wherein the charge generating junction layer is formed using a solution process, wherein the annealing treatment is performed at a temperature of 160° C. to 250° C., and wherein the method further comprises, after the step of forming the light-emitting unit, a step of forming an auxiliary charge generating junction layer on the light-emitting unit.

* * * * *